(12) United States Patent
Schenk et al.

(10) Patent No.: US 10,457,544 B2
(45) Date of Patent: Oct. 29, 2019

(54) MEMS TRANSDUCER FOR INTERACTING WITH A VOLUME FLOW OF A FLUID AND METHOD FOR MANUFACTURING THE SAME

(71) Applicant: Fraunhofer-Gesellschaft zur Foerderung der angewandten Forschung e.V., Munich (DE)

(72) Inventors: Harald Schenk, Dresden (DE); Holger Conrad, Dresden (DE); Matthieu Gaudet, Cottbus (DE); Klaus Schimmanz, Cottbus (DE); Sergiu Langa, Dresden (DE); Bert Kaiser, Weinboehla (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/843,332

(22) Filed: Dec. 15, 2017

(65) Prior Publication Data

US 2018/0179048 A1    Jun. 28, 2018

Related U.S. Application Data

(63) Continuation of application No. PCT/EP2016/063611, filed on Jun. 14, 2016.

(30) Foreign Application Priority Data

Jun. 15, 2015 (DE) .................. 10 2015 210 919

(51) Int. Cl.
*H04R 19/00* (2006.01)
*B81B 3/00* (2006.01)
(Continued)

(52) U.S. Cl.
CPC .......... *B81B 3/0021* (2013.01); *B81C 1/0015* (2013.01); *B81C 1/00142* (2013.01);
(Continued)

(58) Field of Classification Search
CPC .............. B81C 1/00158; B81C 1/0015; B81C 1/00142; H04R 19/005; H04R 9/02;
(Continued)

(56) References Cited

U.S. PATENT DOCUMENTS 9,369,809 B2    6/2016 Zoellin et al.
2008/0101641 A1    5/2008 Miles
(Continued)

FOREIGN PATENT DOCUMENTS

DE    102010029936 A1    12/2011
DE    102012223605 A1    6/2014
(Continued)

OTHER PUBLICATIONS

Albach, Thorsten S., "Magnetostrictive micro-actuators and their application as micro-loudspeakers, dissertation", University of Erlangen-Nuremberg (2013), 2013.
(Continued)

*Primary Examiner* — Ahmed N Sefer
(74) *Attorney, Agent, or Firm* — Perkins Coie LLP; Michael A. Glenn

(57) ABSTRACT

A MEMS transducer for interacting with a volume flow of a fluid includes a substrate including a cavity, and an electromechanical transducer connected to the substrate in the cavity and including an element deformable along a lateral movement direction, wherein a deformation of the deformable element along the lateral movement direction and the volume flow of the fluid are causally related.

83 Claims, 28 Drawing Sheets

(51) Int. Cl.
*B81C 1/00* (2006.01)
*H04R 9/02* (2006.01)
*H04R 15/00* (2006.01)
*H04R 17/00* (2006.01)
*H04R 23/00* (2006.01)
*H04R 1/02* (2006.01)
*H04R 1/08* (2006.01)

(52) U.S. Cl.
CPC ........... *B81C 1/00158* (2013.01); *H04R 9/02* (2013.01); *H04R 15/00* (2013.01); *H04R 17/00* (2013.01); *H04R 19/005* (2013.01); *H04R 23/002* (2013.01); *B81B 2201/0257* (2013.01); *B81B 2201/036* (2013.01); *B81B 2203/0109* (2013.01); *B81B 2203/019* (2013.01); *B81B 2203/0118* (2013.01); *B81B 2203/0127* (2013.01); *B81B 2203/0136* (2013.01); *B81B 2203/051* (2013.01); *H04R 1/023* (2013.01); *H04R 1/08* (2013.01); *H04R 2201/003* (2013.01); *H04R 2499/11* (2013.01)

(58) Field of Classification Search
CPC ...... H04R 15/00; H04R 17/00; H04R 23/002; H04R 1/023; H04R 1/08; B81B 3/0021
See application file for complete search history.

(56) References Cited

U.S. PATENT DOCUMENTS

| | | | |
|---|---|---|---|
| 2012/0018244 A1 | 1/2012 | Robert | |
| 2012/0051058 A1* | 3/2012 | Sharma | F04B 43/046 362/294 |
| 2015/0034237 A1* | 2/2015 | Biggs | H01L 41/047 156/234 |
| 2016/0173001 A1* | 6/2016 | Langa | H02N 1/006 310/300 |
| 2017/0142525 A1* | 5/2017 | Glacer | H04R 31/00 |

FOREIGN PATENT DOCUMENTS

| | | |
|---|---|---|
| EP | 2410768 A1 | 1/2012 |
| JP | 2012029290 A | 2/2012 |
| KR | 20090071648 A | 7/2009 |
| WO | 03056691 A1 | 7/2003 |
| WO | 2013115270 A1 | 8/2013 |

OTHER PUBLICATIONS

Cheng, Ming-Cheng et al., "A Silicon Microspeaker for Hearing Instruments", "Institute of Physics Publishing, Journal of Micromechanics and Microengineering," vol. 14, published May 13, 2004, pp. 859-866., May 13, 2004, 859-866.

Kim, Hanseup et al., "Bi-Directional Electrostatic Microspeaker With Two Large-Deflection Flexible Membranes Actuated by Single/Dual Electrodes", "IEEE," Center for Wireless Integrated MicroSystems (WIMS), Ann Arbor, Michigan, 2005, pp. 89-92, Nov. 3, 2005, 89-92.

Kumar, Vijay et al., "Design and Validation of Silicon-on-Insulator Based U Shaped Thermal Microactuator", Int. J. Materials, Mechanics and Manufacturing, vol. 2, No. 1 (2014), Feb. 2014, pp. 86-91.

Neri, F. et al., "A Novel Micromachined Loudspeaker Topology", IEEE, 2011 Electronic Components and Technology Conference, Rome, Italy, May 31-Jun. 3, 2011, pp. 1221-1227., Jun. 20, 2011, 1221-1227.

Neumann, J.J. et al., "CMOS-MEMS Acoustic Devices", "Advanced Micro and Nanosystems," vol. 2 CMOS-MEMS, Carnegie Mellon University, Pittsburg, Pennsylvania, 2005, pp. 193-224, 2005, 193-224.

Render, Jorg et al., "Magnetic Flux Generator for Balanced Membrane Loudspeaker", "Sensors and Actuators," vol. A 97-98, Mikroelektronic Centret, Technical University of Denmark, Lyngby, Denmark, Oct. 18, 2001, pp. 61-67., Oct. 18, 2001, 61-67.

Roberts, Robert C. et al., "Electrostatically Driven Touch-Mode Poly-SiC Microspeaker, Sensors", IEEE 2007 (2007), 2007, pp. 284-287.

Rosa, Michel A. et al., "A Novel External Electrode Configuration for the Electrostatic Actuation of MEMS Based Devices", "Journal of Micromechanics and Microengineering," vol. 14:4, Institute of Physics Publishing, Bristol, United Kingdom, Jan. 9, 2004, pp. 446-451, Jan. 9, 2004, 446-451.

Schenk, Harald et al., "A Resonantly Excited 2D-Micro-Scanning-Mirror With Large Deflection", "Sensors and Actuators," vol. A:89, Fraunhofer Institute of Microelectronic Circuits and Systems, Dresden, Germany, Mar. 20, 2001, pp. 104-111, Mar. 20, 2001, 104-111.

* cited by examiner

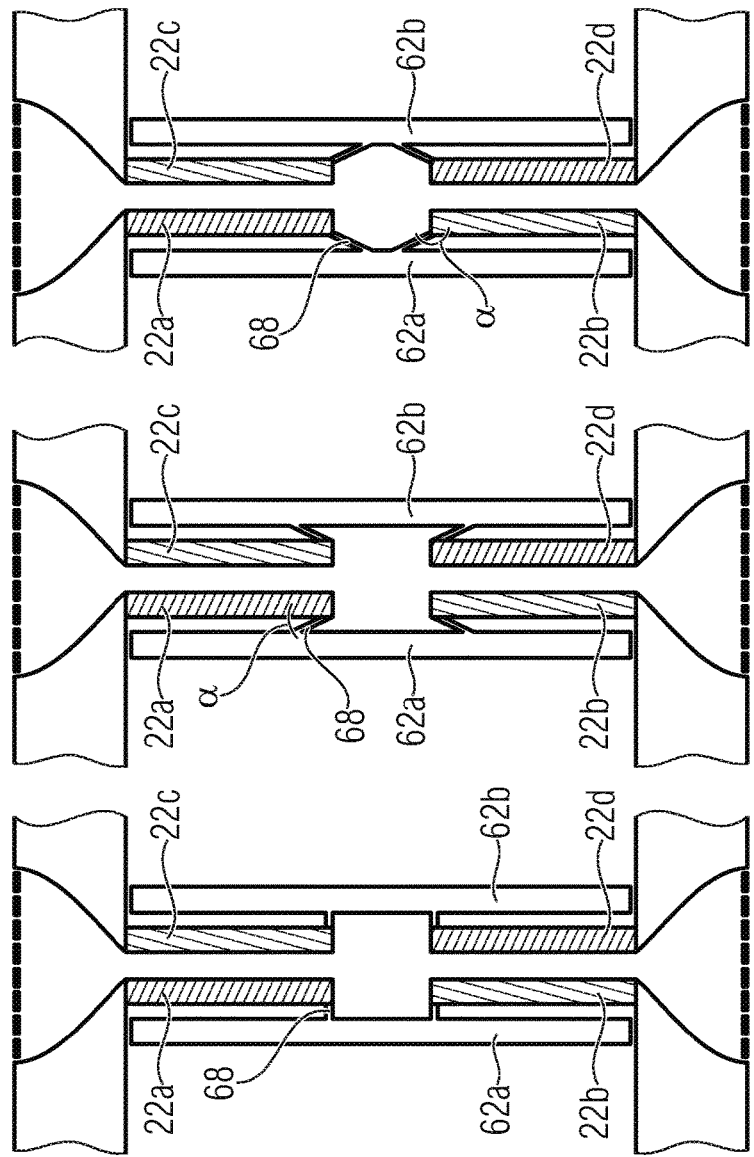

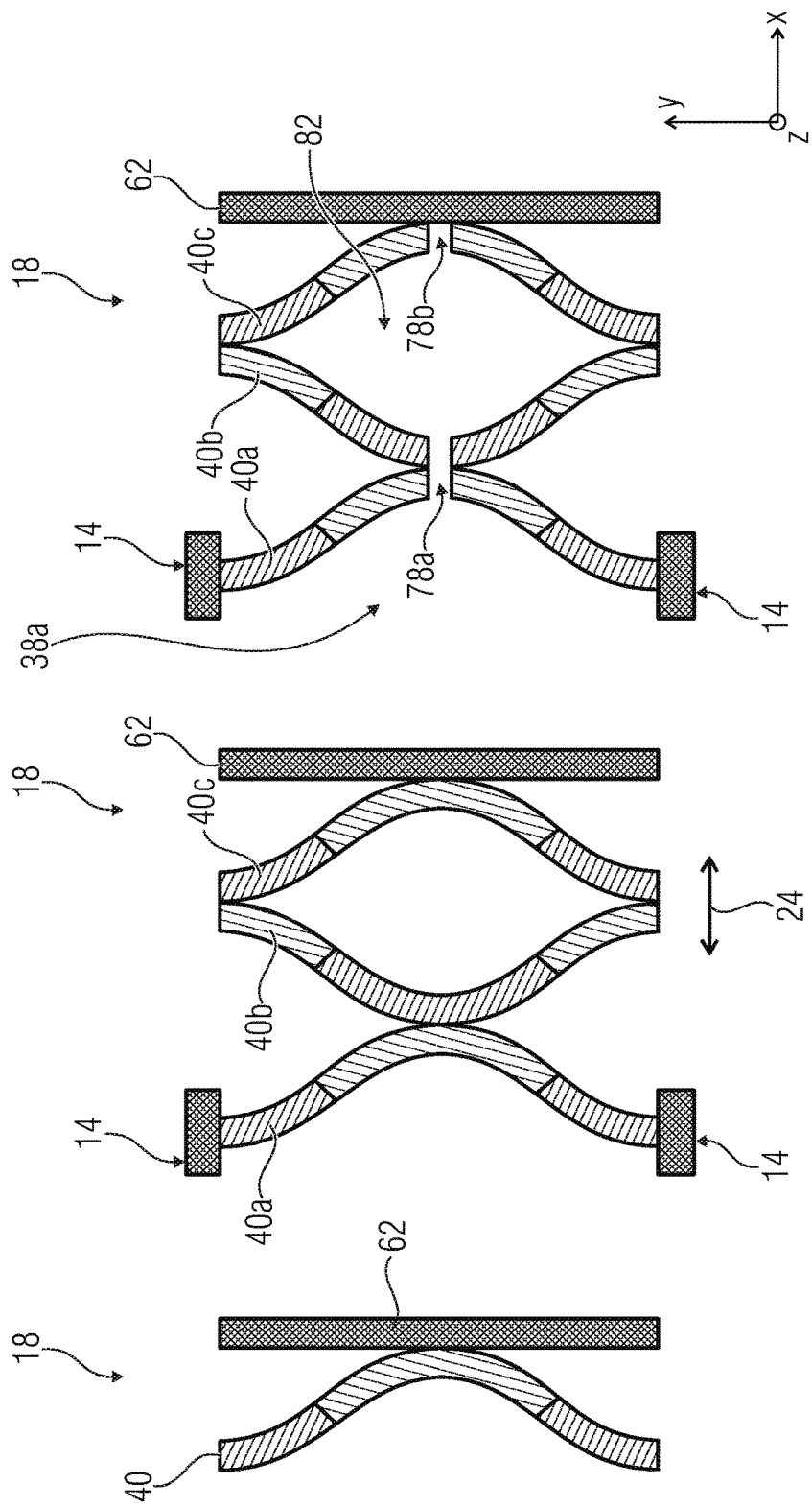

MEMS TRANSDUCER FOR INTERACTING WITH A VOLUME FLOW OF A FLUID AND METHOD FOR MANUFACTURING THE SAME

CROSS-REFERENCES TO RELATED APPLICATIONS

This application is a continuation of copending International Application No. PCT/EP2016/063611, filed Jun. 14, 2016, which is incorporated herein by reference in its entirety, and additionally claims priority from German Application No. DE 10 2015 210 919.4, filed Jun. 15, 2015, which is incorporated herein by reference in its entirety.

BACKGROUND OF THE INVENTION

The present invention relates to a MEMS transducer for interacting with a volume flow of a fluid, e.g., a MEMS loudspeaker, a MEMS microphone or a MEMS pump. Furthermore, the present invention relates to a method for manufacturing a MEMS transducer. Furthermore, the present invention relates to a MEMS-based electroacoustic transducer.

In addition to the miniaturization, one focus of the MEMS technology (MEMS—microelectromechanical system) particularly lies in the potential for a cost-effective manufacturability of the component in medium and high quantities. Electroacoustic MEMS loudspeakers are currently not significantly commercialized. With few exceptions, MEMS loudspeakers consist of a membrane which is deflected quasi-statically or resonantly by a selected physical operating principle. The deflection linearly or non-linearly depends on the applied electric signal (current or voltage). The signal comprises a temporal variation which is transmitted into a temporal variation of the membrane deflection. The reciprocating movement of the membrane is transmitted in the form of sound into the surrounding fluid which, for the sake of simplification but not for limitation, is assumed to be air.

In some cases, the actuation of the membrane occurs only in one direction. The restoring force is then provided by the mechanical spring action when the membrane is deflected. In other cases, the actuation occurs in both directions so that the membrane may comprise a very low rigidity.

For the actuation of the membrane, the use of electrostatic, piezoelectric, electromagnetic, electrodynamic and magnetostrictive operating principles is described. For example, an overview of MEMS sound transducers based on these principles may be found in [1].

Electrostatically operated transducers are based on the force which results between two flat electrodes engaged with different electric potentials. In the simplest case, the arrangement corresponds to a plate capacitor, wherein one of the plates is movably suspended. In practice, the moveable electrode is embodied as a membrane in order to avoid an acoustic short circuit. When applying a voltage, the membrane buckles in the direction of the counter electrode. In a specific embodiment, the membrane is operated in the so-called touch-mode. In this case, the membrane touches the lower electrode onto which a thin insulator layer is applied in order to avoid a short circuit, e.g., as described in [2]. In this case, the contact area is determined by the size of the electric voltage applied and, thus, varies temporally according to the temporal course of this voltage. The oscillation which may be generated in this way serves for generating sound. In the classical electrostatic structure, the membrane may in principle only be attracted in the direction of the electrode. The restoring force may be determined at least partially by the rigidity of the membrane and has to be sufficiently high in order to be able to also transmit the higher frequencies in the auditory sound range.

On the other hand, when an electric voltage is given, the deflection of the membrane may decrease with an increasing rigidity. In order to avoid this problem, an approach with a very soft membrane has been developed, which may be driven by an upper and a lower electrode and, thus, may be deflected in both directions, as described in [3]. In total, this loudspeaker uses two of such membranes suspended in the interior of a cavity comprising, same as in a micropump, an inlet and an outlet and otherwise being closed.

Piezoelectrically operated transducers use the inverse piezoelectric effect. An applied electric voltage leads to mechanical stress in a solid body. In the MEMS technology, materials such as PZT (lead zirconate titanate), AlN (aluminum nitride) or ZnO (zink oxide) are typically used. Usually, these materials are applied as a functional layer onto a membrane and are structured such that the membrane may be deflected, or excited to oscillate, depending on the electric voltage applied at the functional layer. A disadvantage of piezoelectric functional layers is the fact that the operation may not be performed without hysteresis. Furthermore, the integration of the ceramic functional layers is complex and, due to the lack of CMOS compatibility (CMOS=complementary metal oxide semiconductor), only possible under strict contamination control or in a separate clean room area when using PZT and ZnO.

Electromagnetically operated transducers are based on the force effect that a soft magnetic material is subjected to in a mobile magnetic field (gradient). Implementing the principle, besides the soft magnetic material, involves a permanent magnet and a coil by means of which the local gradient of the magnetic field may be temporally controlled via a current flow. For example, the soft magnetic material is integrated into the membrane. All other components are provided during the assembly, e.g., as described in [4]. The structure is voluminous, complex and does not seem to be scalable in a meaningful way with respect to large quantities.

Electrodynamically operated transducers use the Lorentz force. This method is very widespread in macroscopic loudspeakers and has also been used in some MEMS loudspeakers. The magnetic field is generated by a permanent magnet. A current-carrying coil is placed in the magnetic field. Usually, the coil is integrated into the membrane by depositing and structuring a metal layer, and a permanent magnet is added as an external component during assembly The complexity and the limitations with respect to the integration of all components using the MEMS technology are a similarly large disadvantage as in the electromagnetically operated transducers.

Magnetostrictively operated transducers are based on a contraction or expansion of a functional layer when a magnetic field is applied. For example, Vanadium Permendur is positively magnetostrictive, i.e., expands when a magnetic field is applied. In a suitable structure, this contraction may be used for generating a membrane oscillation. In [1], Vanadium Permendur ($Fe_{49}Co_{49}V_2$) deposited onto $SiO_2$ (silicon dioxide) via a chromium adhesive layer is used as magnetostrictive functional layer. The external magnetic field is provided by a micro-flat coil realized by galvanically deposited copper. With respect to complexity and limitations of the integration, similar disadvantages are to be noted as with both above-mentioned operating principles.

The above-described classical and most widely used variations, which have as a common feature the use of a membrane which may be excited to oscillate, are subsequently supplemented by certain modifications which were investigated due to special disadvantages of the classical membrane principle.

Flexible membranes may also comprise higher modes in the auditory sound range and, thus, may lead to parasitic oscillations decreasing the acoustic quality (distortion factor), cf., [1]. Thus, in order to avoid or reduce this effect, plates comprising a significantly higher rigidity are used. Such a plate is connected to the chip via a very soft suspension which is to also avoid the acoustic short circuit, cf., [5].

Another modification provides a segmented membrane used with the above-described magnetostrictive transducers. This corresponds to a special topographical solution to the problem that the functional layer contracts or expands in two directions. Specifically, the structure consists of several deflectable bending bars. According to [1], the arrangement may be considered to be acoustically closed for distances of the bars smaller than or equal to 3 µm. By accordingly dimensioning the individual bars with respect to a resonance frequency and the distances between the bars, a comparatively high acoustic bandwidth may be achieved and the course of the sound level may be adapted or optimized as a function of the oscillation frequency.

In [6], Neumann et al. pursue the approach of using a multitude of small submembranes instead of a single large membrane. Each submembrane comprises a resonance frequency high enough so that a quasi-static deflection may occur in the auditory sound range. In particular, this enables a digital operation of the loudspeaker.

In summary, it may be concluded that, with respect to the integration, known electrostatically operated membrane loudspeakers comprise relatively small deflections when assuming moderate drive voltages. For example, the electrostatic membrane loudspeaker of Kim et al. according to [3] may serve as a reference. Each of the two membranes comprises an area of $2\times2$ mm$^2$. The upper and lower electrodes are respectively attached at a distance of 7.5 µm. Depending on the geometry of the membrane and the increase in membrane rigidity with increasing deflection, the deflection is typically limited to ⅓ to ½ of the electrode distance due to the so-called pull-in effect. Assuming the higher value of ½, the deflection results in 7.5 µm/2, in one direction and in the other direction, respectively. The displaced volume may be estimated by assuming that it corresponds to the volume of a deflected rigid plate having the deflection of half of the maximum deflection of the membrane. For example, this results in:

$$\Delta V \approx (2\times2 \text{ mm}^2)\times 50\%*(2\times 7.5 \text{ µm})/2 = 15\times 10^{-3} \text{ mm}^3 \quad \text{(Eq. 1)}$$

or $$\Delta V/\text{active area} = \Delta V/A = \Delta V/4 \text{ mm}^2 = 3.75\times 10^{-3} \text{ mm} \quad \text{(Eq. 2)}$$

When manufacturing miniaturized membrane loudspeakers, it is a general problem to achieve a flat course of the sound pressure as a function of the frequency. The achievable sound pressure is proportional to the radiation impedance and the speed of the membrane. With respect to the macroscopic scale, the membrane diameter is comparable to the acoustic wavelength. What applies in this regard is that the radiation impedance is proportional to the frequency, cf., [6]. Often, high-quality loudspeakers are designed so that the resonance $f_0$ is below the auditory sound range (for multi-way loudspeakers, the respective resonance frequency is below the lower edge frequency of the corresponding electric filter). Thus, for $f \gg f_0$, the speed of the membrane is proportional to $1/f$. Overall, the expression $p \propto 1$ results for the frequency dependency of the sound pressure p. Thus, a completely flat course of the sound pressure curve results in this (simplified) consideration.

Once the diameter of the sound source/of the membrane is much smaller than the sound wavelength to be generated, a quadratic dependency from the frequency may be assumed for the radiation impedance, as described in [7]. This is given for MEMS loudspeakers having membranes in the magnitude of millimeters. Assuming $f \gg f_0$, as above, the dependency $p \propto f$ results for the course of the sound pressure curve. Low frequencies are reproduced with too low of a sound pressure in relation to the high frequencies. In the quasi-static operation, the membrane speed is proportional to f. Thus, for the sound pressure course, the dependency $p \propto f^3$ results, which is even more unfavorable for low frequencies.

Thus, a concept for improved MEMS transducers comprising a high degree of efficiency would be desirable.

SUMMARY

According to an embodiment, a MEMS transducer for interacting with a volume flow of a fluid may have: a substrate having a cavity; an electromechanical transducer connected to the substrate in the cavity and having an element deformable along a lateral movement direction, wherein a deformation of the deformable element along the lateral movement direction and the volume flow of the fluid are causally related; wherein the deformation of the deformable element is a curvature of the deformable element in-plane with respect to the substrate.

According to another embodiment, a MEMS transducer for interacting with a volume flow of a fluid may have: a substrate having a cavity; an electromechanical transducer connected to the substrate in the cavity and having an element deformable along a lateral movement direction, wherein a deformation of the deformable element along the lateral movement direction and the volume flow of the fluid are causally related; wherein the lateral movement direction extends in-plane with respect to the substrate; a first and a second electromechanical transducer connected to the substrate and each having an element deformable along the lateral movement direction, configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable during the first and second time intervals; wherein a first deformable element of the first electromechanical transducer and a second deformable element of the second electromechanical transducer include a bar structure configured to be curved along an axial direction of the bar structure; wherein the first deformable element is formed to be active and is configured to interact with the volume flow, or a plate element connected to the first deformable element is configured to be rigid is configured to interact with the volume flow.

Another embodiment may have a MEMS loudspeaker having one of the above inventive MEMS transducers, wherein the volume flow is an acoustic soundwave or an ultrasonic wave.

Another embodiment may have a MEMS pump having one of the above inventive MEMS transducer, wherein the cavity has a first opening and a second opening in the substrate, wherein the electromechanical transducer is configured to provide the volume flow based on the fluid and to transport the fluid through the first opening in a direction of the cavity based on an actuation of the electromechanical transducer or to transport the fluid through the second opening in a direction away from the cavity based on the actuation.

Another embodiment may have a MEMS microphone having one of the above inventive MEMS transducers, wherein an electrical signal may be obtained at a terminal of the electromechanical transducer based on the deformation of the deformable element, wherein the deformation may be caused based on the volume flow.

According to another embodiment, a MEMS system may have one of the above inventive MEMS transducers; and a control device configured to drive the deformation of the deformable element or to detect the deformation of the deformable element.

According to another embodiment, a method for manufacturing a MEMS transducer may have the steps of: providing a substrate having a cavity; manufacturing, at the substrate in the cavity, an electromechanical transducer having an element deformable along a lateral movement direction, so that a deformation of the deformable element is a curvature of the deformable element in-plane with respect to the substrate, so that the deformation of the deformable element along the lateral movement direction and a volume flow of a fluid are causally related.

The core idea of the present invention is to have recognized that the above-mentioned object may be solved by the fact that a volume flow of a fluid may be affected in an especially efficient manner by means of an element which is deformable along a lateral movement direction, or by the fact that the volume flow may deflect such an element in an especially efficient manner. The lateral movement direction, possibly perpendicular to a direction of the fluid flow, enables large areas of the deformable element which may interact with the volume flow, with simultaneously having small dimensions of a chip surface so that, overall, an efficient MEMS transducer device with a high efficiency is obtained.

According to an embodiment, a MEMS transducer for interacting with a volume flow of a fluid includes a substrate comprising a cavity, and an electromechanical transducer connected to the substrate and comprising an element deformable along a lateral movement direction, wherein a deformation of the deformable element along the lateral movement direction and the volume flow of the fluid are causally related. An advantage of this embodiment is that a volume affected by the deformable element or affecting the deformable element may be formed in a large manner in a direction perpendicular to the lateral movement direction and/or perpendicular to a chip surface, while small chip surfaces may be simultaneously obtained.

According to a further embodiment, a MEMS loudspeaker comprises such a MEMS transducer and is configured to emit an acoustic soundwave or an ultrasonic wave. According to a further embodiment, a MEMS pump includes a MEMS transducer so that the fluid may be transported based on the volume flow. According to a further embodiment, a MEMS microphone includes a MEMS transducer having a deformable element which is deformable along the lateral movement direction. It is an advantage of these embodiments that a high efficiency may be obtained utilizing a small chip surface.

According to a further embodiment, a method for manufacturing a MEMS transducer includes providing a substrate comprising a cavity, connecting to the substrate an electromechanical transducer comprising an element deformable along a lateral movement direction. A deformation of the deformable element along the lateral movement direction and the volume flow of the fluid are casually related.

BRIEF DESCRIPTION OF THE DRAWINGS

Embodiments of the present invention will be detailed subsequently referring to the appended drawings, in which:

FIG. 6a shows a schematic top view of an electromechanical transducers, in which spring elements configured to be straight are arranged between plate elements and deformable elements, according to embodiments;

FIG. 6b shows a schematic top view of an electromechanical transducer, in which spring elements are arranged from deflectable ends of the deformable elements with an angle of less than 90°, according to an embodiment;

FIG. 6c shows a schematic top view of an electromechanical transducer, in which the spring elements are arranged with an angle of more than 90°, according to an embodiment;

FIG. 7a shows a schematic top view of a deformable element connected to the plate element according to an embodiment;

FIG. 7b shows a schematic top view of a configuration, in which the deformable element is fixedly clamped between the substrate, according to an embodiment;

FIG. 7c shows a schematic top view of a configuration of the electromechanical transducer, in which the deformable elements comprise recesses in a center region, according to an embodiment;

DETAILED DESCRIPTION OF THE INVENTION

Figure 1:
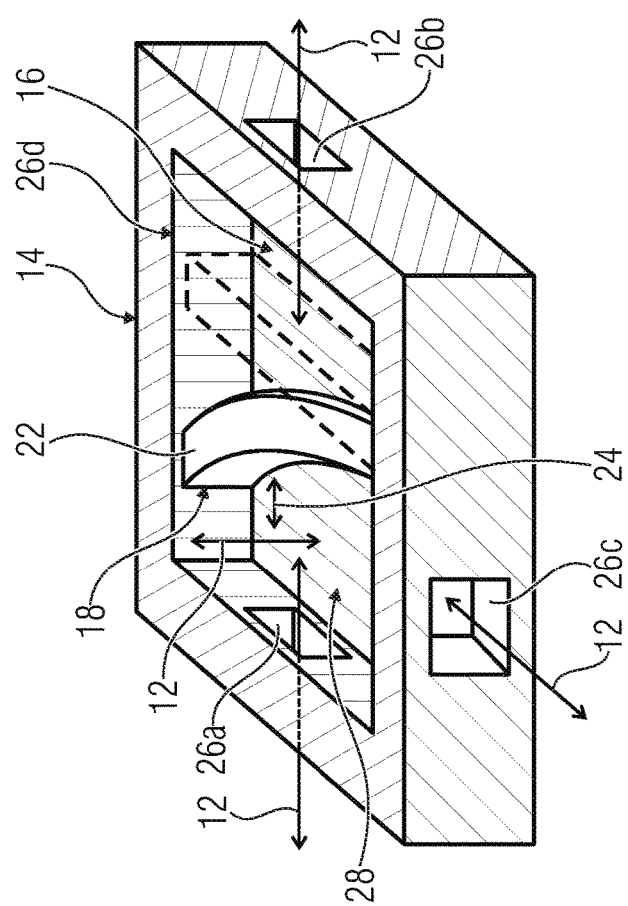
FIG. 1 shows a schematic perspective view of a MEMS transducer according to an embodiment.

Before embodiments of the present invention are subsequently explained detail with reference to the drawings, it is pointed out that identical, functionally identical and operatively identical elements, objects and/or structures are provided in the different figures with identical reference numerals so that the description of these elements in different embodiments is interchangeable and/or mutually applicable.

Subsequently, reference is made to MEMS transducers (MEMS=microelectromechanical system). A MEMS transducer may comprise one or several electroactive components causing a change of a mechanical component based on an applied electric quantity (current, voltage, charge or the like). For example, this change may relate to deformation, heating or tension of the mechanical component. Alternatively or additionally, a mechanical influence on the component, e.g., deformation, heating or tension may lead to an electric signal or to an electric information (voltage, current, charge or the like) which may be sensed at electric terminals of the component. Some materials or components comprise a reciprocity, which means that effects are reciprocally exchangeable. For example, piezo materials may comprise the inverse piezoelectric effect (deformation based on an applied electric signal) and the piezoelectric effect (providing an electric charge based on a deformation).

Some of the subsequently described embodiments relate to the fact that a deformable element of an electromechanical transducer is configured to interact with a volume flow of a fluid. For example, an interaction may include a deformation of the deformable element caused by an electric drive signal, which leads to a movement, displacement, compression or decompression of the fluid. Alternatively or additionally, the volume flow of the fluid may deform the deformable element so that an occurrence, a characteristic (pressure, flow speed or the like) or any other information with respect to the fluid (e.g., a temperature) may be obtained based on the interaction between the volume flow and the deformable element. This means that a deformation of the deformable element along the lateral movement direction and the volume flow of the fluid are causally related. For example, MEMS may be manufactured using silicon technology. The electromechanical transducer may include the deformable element and further elements such as electrodes and/or electric terminals. The deformable element may be configured to be deformed (microscopically) along a lateral movement direction, i.e., an element or a region may be moveable along the lateral movement direction. For example, the element or the region may be a bar end or a center region of a bar structure. Viewed microscopically, upon a deformation of a deformable element along a lateral movement direction, a deformation of the deformable element may occur perpendicularly to the lateral movement direction. Subsequently described embodiments relate to the microscopic consideration.

Embodiments may provide miniaturized loudspeakers, microphones and/or pumps made of silicon, which may generate, with respect to their respective size, as high a sound level, as high a sensitivity and/or as high a flow rate of the fluid as possible.

Embodiments of the present invention may be used to generate airborne sound, in particular in the auditory sound range. Thus, embodiments relate to loudspeakers, in particular miniaturized loudspeakers, e.g., for hearing aids, headphones, headsets, mobile telephones or the like. The reciprocally causal relation between the volume flow and the deformation of the deformable element also allows an application in loudspeakers. Thus, embodiments relate to electroacoustic transducers.

FIG. 1 shows a schematic perspective view of a MEMS transducer 10. The MEMS transducer 10 is configured to interact with a volume flow 12 of a fluid. The fluid may be a gas (such as air) and/or a liquid. For example, the fluid may be a medical solution, a drug, a chemical for a technical process or the like.

The MEMS transducer 10 comprises a substrate 14. The substrate 14 may comprise any material. For example, the substrate 14 may include a wood material, a metal material and/or a semiconductor material such as a silicon material. The substrate 14 includes a cavity 16. For example, the cavity 16 may be understood to be a recess or a at least partially enclosed volume of the substrate 14. The fluid of the volume flow 12 may be arranged in the cavity 16 at least in regions.

The MEMS transducer 10 includes an electromechanical transducer 18. The electromechanical transducer 18 is connected to the substrate 14. The electromechanical transducer 18 includes a deformable element 22 which is deformable along a lateral movement direction 24. For example, applying an electric signal at the electromechanical transducer 18 may lead to the deformation of the deformable element 22 along the lateral movement direction 24. Alternatively or additionally, when hitting the deformable element 22, the volume flow 12 may lead to the deformable element 22 carrying out the deformation such that an electric signal based on the volume flow 12 may be obtained from the electromechanical transducer 18. I.e., the deformation of the deformable element 22 and the volume flow 12 are causally related. For example, the electromechanical transducer 18 may include at least one, such as two, piezoelectric layers or may consist of the same. Both layers may be deformed by electric voltage. The electromechanical transducer may include further elements such as electrodes.

The substrate 14 may include one or several openings 26a-d, through which the volume flow 12 may reach from a surrounding area of the MEMS transducer 10 into the cavity 16 and/or out of the cavity 16 into a surrounding area of the MEMS transducer 10. A movement which the deformable element 22 carries out upon the deformation may be understood to be in-plane with respect to the substrate 14. The volume flow 12 may exit from or enter into the cavity 16 at least partially perpendicular to the movement direction 24, e.g., as indicated by the openings 26c and 26d for the volume flow 12. Simply put, a movement of the deformable element 22 in-plane may lead to a volume flow 12 out-of-plane and vice versa. This means that the lateral movement direction and/or the curvature of the deformable element may occur in-plane with respect to the substrate.

The openings 26c and 26d are arranged perpendicular to the lateral movement direction 24 in the substrate 14. The deformation of the deformable element 22 along the lateral movement direction 24 may lead to a movement of at least one region of the deformable element 22 towards the opening 26a so that a subcavity 28 is decreased in size based on the deformation. Based on this, a pressure of the fluid located in the subcavity 28 may be increased. Simply put, the fluid may be compressed. This may allow the fluid to flow out of the subcavity 28 and/or the cavity 16. Through the openings 26d and 26c, the volume flow 12 may be obtained perpendicular to the lateral movement direction 24.

For example, a base area of the MEMS transducer 10 may be arranged in an x/y plane. A large dimension of the MEMS transducer 10 along a z direction arranged perpendicular to the x direction and/or to the y direction in the space and/or a high dimension of the deformable element 22 along the z direction may lead to an increase of the volume flow 12, while the base area of the MEMS transducer 10 remains unchanged. An increase in size of the subcavity 28 may lead to a negative pressure of the fluid in the subcavity 28 so that the volume flow flows into the cavity 28 and/or 16 based on the deformation of the deformable element 22 perpendicular to the lateral movement direction 24.

The deformable element may comprise an axial extension, e.g., along the y direction, having a value in a range of at least 1 µm and at most 100 mm, advantageously of at least 100 µm and at most 10 mm and particularly advantageously in a range of at least 500 µm and at most 5 mm. The deformable element 22 may comprise an extension along the lateral movement direction 24 having a value in a range of at least 0.1 µm and at most 1000 µm, advantageously of at least 1 µm and at most 100 µm and particularly advantageously in a range of at least 5 µm and at most 30 µm. The deformable element may comprise an extension along a lateral direction arranged perpendicular to the lateral movement, e.g., along the z direction, having a value in a range of at least 0.1 µm and at most 1000 µm, advantageously of at least 1 µm and at most 300 µm and particularly advantageously in a range of at least 10 µm and at most 100 µm.

Figure 2A:
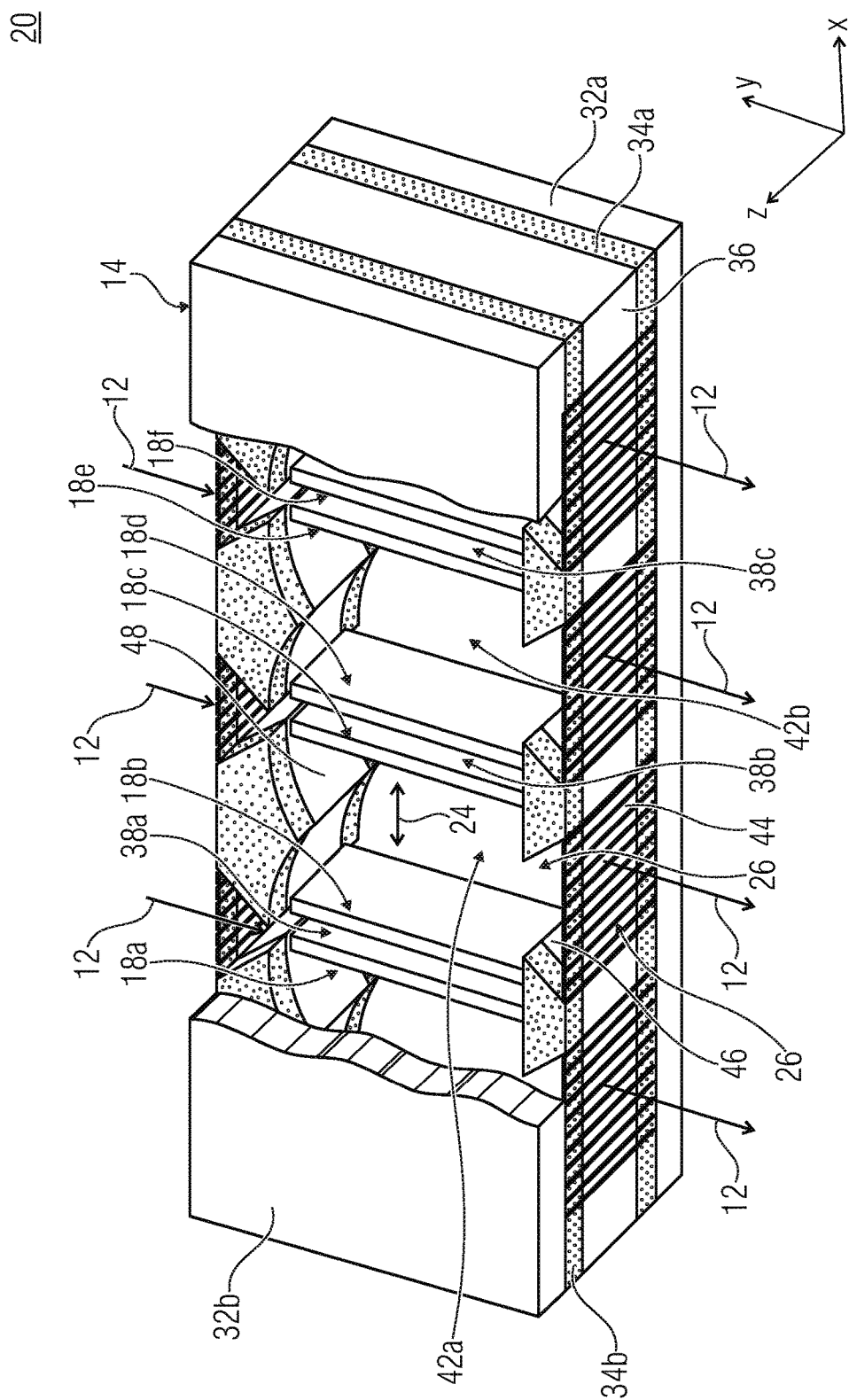
FIG. 2a shows a schematic perspective view of a MEMS transducer including a multitude of electromechanical transducers according to an embodiment.

FIG. 2a shows a schematic perspective view of a MEMS transducer 20 including a multitude of electromechanical transducers 18a-f. The electromechanical transducers 18a-f are connected to the substrate 14 and may each comprise an element deformable along the lateral movement direction 24, as described in connection with FIG. 1.

For example, the substrate 14 includes a first layer 32a, a first spacer layer 34a, an intermediate layer 36, a second spacer layer 34b and a second layer 32b arranged on top of each in said order. According to further embodiments, one or several further layers may be arranged between two of the successively arranged layers. According to further embodiments, at least one of the layers 32a, 32b, 34a, 34b and/or 36 is structured in a multi-layer manner.

The electromechanical transducers 18a-f are configured and/or may be driven such that the same partially move towards each other and partially move away from each other based on the volume flow 12 and/or based on a drive.

For example, the electromechanical transducers 18a and 18b are configured to move away from each other, while the electromechanical transducers 18b and 18c move towards each other. Subcavities 38a-c are arranged between the electromechanical transducers 18a and 18b, 18c and 18d, and 18e and 18f, wherein the subcavities 38a-c may increase in size based on the deflection of the electromechanical transducers 18a-f. Subcavities 42a and 42b are arranged between the electromechanical transducers 18b and 18c, and 18d and 18e, respectively, which may be simultaneously decreased in size based on the movement or deformation. In a subsequent time interval, the deformation or movement of the electromechanical transducers and/or the deflectable elements may be reversible so that the volumes of the subcavities 38a, 38b and 38c decrease in size, while the volumes of the subcavities 42a and 42b increase in size.

In other words, a structured layer, the spacer layer 34a, which may be used, e.g., as a spacer between the lower cap and the intermediate layer 36 arranged on the structured layer 34a, may be arranged on the lower cap (first layer 32a) which encloses the chip on one side (e.g., however not limited to, on a lower side) at least partially or entirely. A structured spacer layer 34b corresponding in its function as a spacer entirely or partially to the spacer layer 34a and which may comprise an identical or similar shape may be arranged on the structured layer 36. The MEMS transducer 20, or its cavity, may be enclosed by the upper cap, the second layer 32b, along the z direction partially or entirely. FIG. 2a shows the layer 32b as a partially split illustration in order to be able to illustrate elements arranged in the region of the cavity. Electromechanical transducers 18b and 18c, and 18d and 18e, respectively, may be arranged in pairs in an x/y plane of the intermediate layer 36, wherein such an arrangement may repeat itself several times along a space direction, e.g., along the x direction.

The substrate may comprise a multitude of openings 26 connected to a multitude of subcavities 38a-c and 42a-b, respectively, wherein, e.g., one opening 26 each may be connected to one subcavity 38a-c or 42a-b. A volume of each subcavity 38a-c or 42a-b may be affected by a deflection state of at least one element 22 deformable along the lateral movement direction 24. During a first or a second time interval, neighboring subvolumes may complimentary increase and decrease in size, respectively. Simply put, a subvolume of a subcavity 38a-c or 42a-b may decrease in size, while a neighboring subvolume of a subcavity 42a-b and 38a-c, respectively, increases in size.

Bar structures 44 may be arranged in a region of one or several openings 26. The bar structures 44 may be arranged such that a passage of the volume flow 12 is possible in one or two directions, while an entry or an exit of particles into the cavity or out of the cavity is reduced or avoided. For example, a shape of the layer 32a, 32b, 34a, 34b and/or 36 may be affected during a manufacturing process by selectively removing and/or selectively arranging or growing layers. For example, the bar structures 44 may be formed from the layers 34a, 36 and/or 34b based on a selective etching process. Furthermore, a shape of the cavities 38a-c and 42a-b may be affected during the manufacturing process. For example, walls of one or several layers 32a, 32b, 34a, 34b and/or 36 may be adapted to a movement of the deformable elements of the electromechanical transducers 18a-f, e.g., in order to enable an at least approximately constant and/or a low distance between the deformable elements and the substrate 14.

A cover 43 may be arranged adjacent to or at the bar structures or bar elements. The cover 43 may be arranged adjacent to the cavity 16 and/or separated therefrom by means of the bar elements 44. For example, the cover may include a mesh material, a foam material and/or a paper material. The cover may enable an entry of particles into the cavity 16 or an exit out of the cavity 16 with a lower diameter than a distance between bar structures. Alternatively, the cover 43 may also be arranged adjacent to or at an opening 26 not comprising the bar elements 44.

If a free end of the moveable elements moves, e.g., in a curved path and/or in a circular path, the substrate 14 may comprise a parallel or similar shape in a region in which the moveable end moves.

Figure 2B:
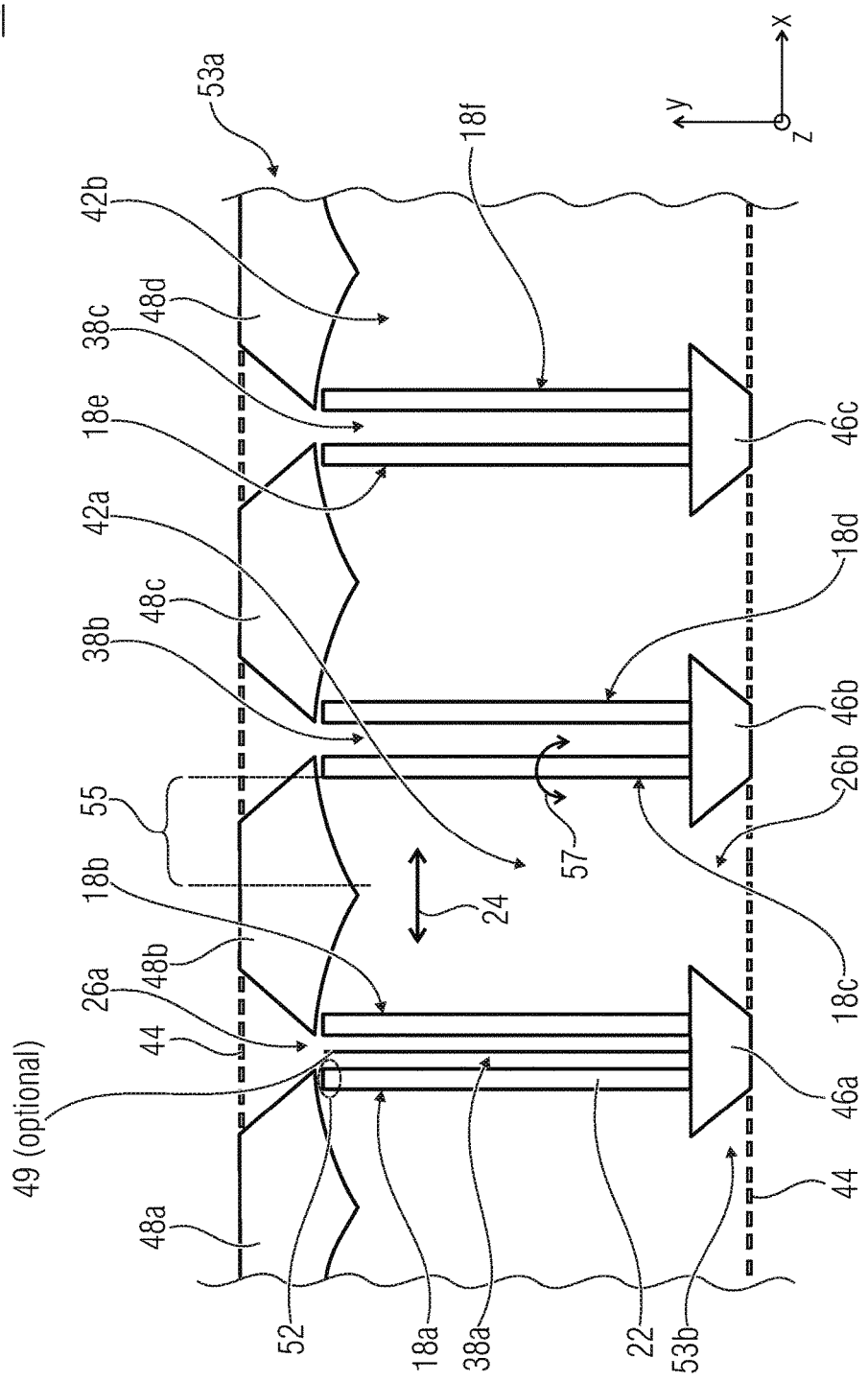
FIG. 2b shows a schematic top view of the MEMS transducer of FIG. 2a according to an embodiment.

FIG. 2b shows a schematic top view of the MEMS transducer 20 of FIG. 2a. The electromechanical transducers 18a-f may, e.g., be connected to the substrate 14 at elements 46a-c in a force-fitted or form-fitted manner. For example, one or several deformable elements of the electromechanical transducers 18a-f may be formed integrally with the elements 46a-c. The elements 46a-c may be arranged in a plane of the layer 36 or may be part of the layer 36. An extension of the deformable elements 22 of the electromechanical transducers 18a-f may, e.g., be smaller than or equal to an extension of the layers 34a, 36 and 34b along the z direction. This means that the deformable elements 22 of the electromechanical transducers 18a-f may be arranged contactless to the layer 32a and/or 32b and may be moveable. Alternatively, at least one deformable element may be deformed in a contact-based manner. For example, a low-friction layer, i.e., having a low coefficient of friction, may be arranged between the at least one deformable element and a neighboring layer such as the layer 32a and/or 32b. The low-friction layer may enable a fluidic separation between subcavities such as described with respect to the wall structure 49. For example, a coefficient of friction may be lower by 10%, 20% or 50% than a coefficient of friction of the layer 32a and/or 32b or of the layer 34a and/or 34b. A frictional force between the deformable element 22 and adjacent layers may be lower than a force for the deformation of the deformable element 22. For example, a force to be provided by an actuator may be lower based on a reduced frictional force so that the actuator may be embodied in a less powerful manner. Alternatively or additionally, a sensitivity of the deformable element 22 towards the volume flow 12 may be increased.

The electromechanical transducers 18b and 18c form, e.g., side walls of the subcavity 42a (chamber). The moveable elements 22 of the electromechanical transducers 18a-f may be fixed to the elements 46a-c in a form-fitted manner. A distance to the substrate 14, or to elements 48a-d of the substrate 14, may be arranged between a deflectable and moveable end 52 of the deformable elements 22. Thus, the end 52 of the deformable element 22 may be arranged to be freely moveable. Due to dimension proportions such as an extension along the x direction in proportion to an extension along the y direction, simply put, a proportion of bar width to bar height, one or several deformable elements 22 may be deflectable particularly far along the lateral direction 24. For example, if the electromechanical transducers 18a-f are configured as actuators, these actuators may be deflectable when a corresponding signal is applied, i.e., be curved so that, e.g., the end 52 of the deformable element 22 moves on a bend path. According to the course of this path, at least one of the elements 48a-d may be configured such that a distance between and the end 52 may remain approximately constant and/or small even when the deformable element 22 is deflected.

The MEMS transducer 20 may comprise at least one wall structure 49. For example, with respect to a chamber 42a-b, a movement of the actuators, electromechanical transducers 18a-e or deformable elements may lead to the fact that a fluid-mechanical coupling to the neighboring chambers may occur due to fluid flows for filling the chamber 38a-c triggered by the movement. Based on the fluid-mechanical coupling, a fluid flow 57 may occur between the subcavities 42a and 38b. In order to reduce or avoid this direct coupling, or the fluid flow 57, one or several separating walls (wall structures 49), which are possibly embodied to be immovable, may be arranged for separating the neighboring chamber pairs 38a and 42. The wall structures may be realized in a simple manner, e.g., as an element at the corresponding locations which is continuously formed of the layer 34a, 36 and 34b. For example, such structures may remain arranged during a selective etching process. Furthermore, the wall structure 49 may increase the mechanical stability of the MEMS transducer 20 and may simplify a bonding process between the individual layers. The at least one wall structure 49 may comprise openings or may be designed in an entirely continuous manner, which enables to selectively modify the attenuation resulting from the fluid entering into/exiting from the chambers 38a-c and 42a-b, in particular for setting the width of the resonance curve, or generally, for setting dynamic characteristics of the actuator-chamber systems.

If FIG. 2b is viewed together with FIG. 1, a volume of the cavity 16 and/or of the multitude of subcavities 38a-c and 42a-b may be affected or determined by the layers 32a and 32b and side regions 53a and 53b of the substrate 14. The side regions 53a and 53b may be arranged between the layers 32a and 32b. The deformable elements of the electromechanical transducers 18a-c may be configured to carry out a movement in parallel to the first layer 32a and/or 32b at least in a portion 55 of the lateral movement direction 24. This means that the deformable element may be deformed or may move between the layers 32a and 32b.

A resonance frequency of a cavity or subcavity may be affected by a geometry of the volume, by a frequency of a drive of the electromechanical transducers and/or by a mechanical resonance frequency of the one of the several deformable elements. (Sub)cavities at least partially fluidically separated, e.g., by means of a wall structure 49, an arrangement of a low-friction layer, or based on an arrangement in several MEMS transducers, may comprise different resonance frequencies and/or may be driven with different frequencies, e.g., by means of a control device. A multi-way loudspeaker may be obtained based on different driving frequencies and/or different resonance frequencies. For example, resonance frequencies of cavities are used in the field of cavity resonators or Helmholtz resonators.

Figure 2C:
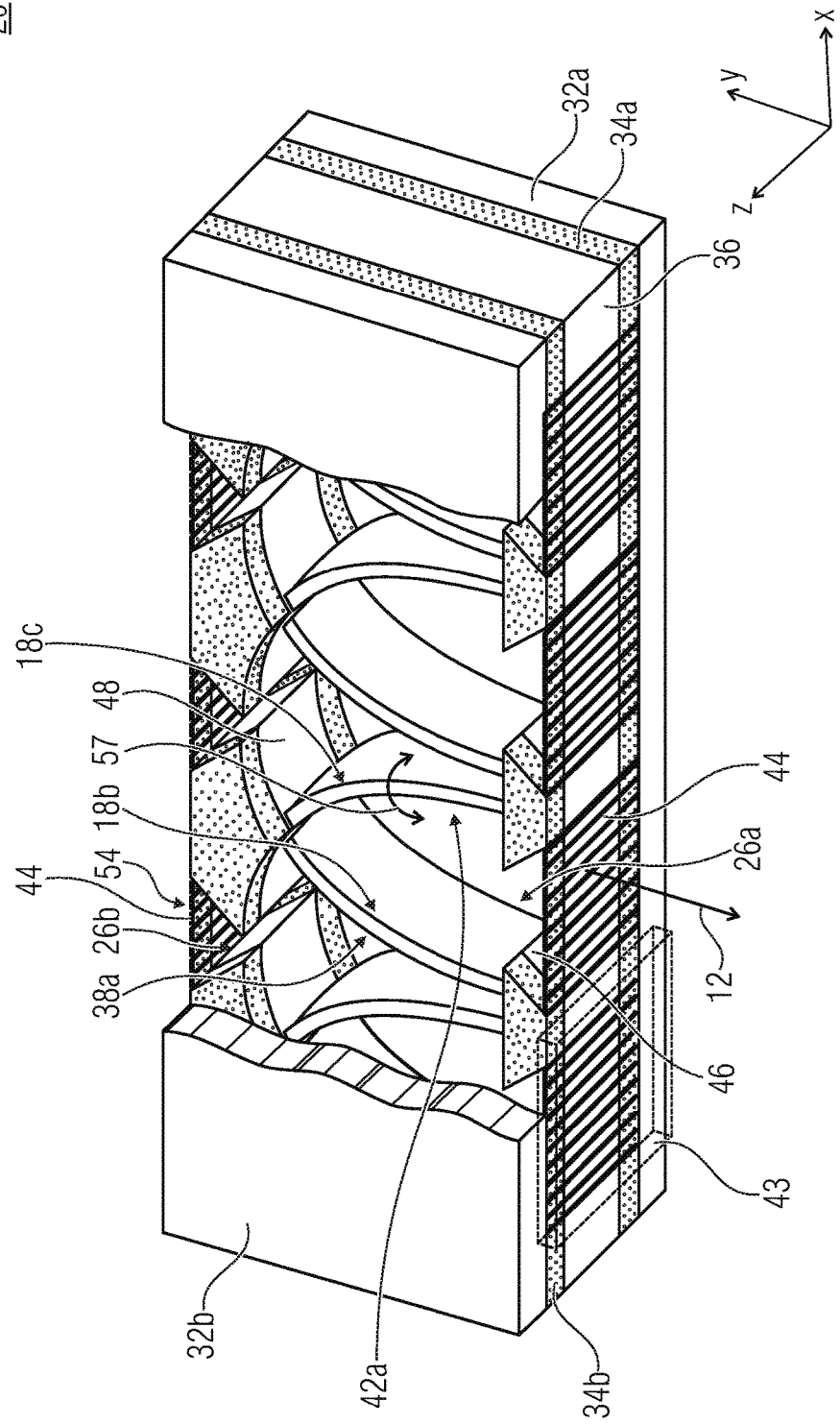
FIG. 2c shows a schematic perspective view of the MEMS transducer of FIG. 2a, in which the electromechanical transducers comprise a deformed state of a deformable element, according to an embodiment.

FIG. 2c shows a schematic perspective view of the MEMS transducer 20, in which the electromechanical transducers 18a-f comprise a deformed state of the deformable element. For example, the deformable elements are deflected up to a maximum deflection. Compared to the illustration of FIG. 2a, a volume of the subcavity 42a is decreased based on the deformation (bending) of the deformable elements (bars). For example, if a thickness (dimension along the z direction or thickness direction) of the layers 34a and 34b (spacers) is low, a circumflow around the electromechanical transducers 18a-f, or the deformable elements, upon a movement of the electromechanical transducers 18a-f may be negligible. This may also apply for a distance between the electromechanical transducer 18a-f and the substrate, e.g., the element 48. Based on the deformation of the deformable element, a volume of the fluid, e.g., an air volume, which may correspond to the volume difference of the subcavities 42a in the FIGS. 2a and 2c, may be released to a surrounding area of the MEMs transducer 20, e.g., in the form of the fluid flow (volume flow) 12, A dimension of the spacer layer 34a or 34b along the z direction, along which the first and second spacer layers 34a and 34b are arranged at the intermediate layer 36, may comprise a value in a range of at least 1 nm and at most 1 mm, advantageously in a range of at least 20 nm and at most 100 µm and particularly advantageously in a range of at least 50 nm and at most 1 µm. For example, if the dimension of the spacer layers 34a and 34b is small compared to a dimension of the electromechanical transducers 18a-f along the z direction, an extent of the fluid flow 57, which circumflows the electromechanical transducers 18a-f from a first side to a second side (e.g., from a positive x direction to a negative x direction or vice versa), while the deformable element is being deformed, may be smaller than an extent of the volume flow 12 in the cavity.

For example, the circumflow, or the fluid flow 57, may result based on an at least partial removal of the spacer layers 34a and/or 34b in a region in which the electromechanical transducers 18a-f move. Simply put, a fluid flow around moveable elements may result based on the distance between the electromechanical transducer and neighboring layers (fluidic losses). Compared to the fluid flow 12, these may be low. For example, they may be smaller than an extent of the volume flow divided by the value 10, divided by the value 15 or divided by the value 20.

The electromechanical transducers may move in pairs towards each other or away from each other. Thus, compared to the state in FIG. 2b, the electromechanical transducers 18a and 18b may, e.g., move in pairs away from each other and, in a subsequent time interval, may move in pairs towards each other. At the same time, e.g., the electromechanical transducers 18b and 18c may move in pairs towards each other or away from each other. Such a complementary movement of electromechanical transducers in pairs, which is also possible when the transducers are not arranged adjacently to each other, may lead to an at least partial but also complete compensation of inertial forces so that a low measure of oscillations or no oscillations is/are obtained in the MEMS transducer and/or be transmitted from the MEMS transducer to the surrounding area.

In other words, it may be a particular feature of the chamber approach described so far that the actuators continuously move in a contrary manner towards each other and/or or away from each other in pairs. This means (when carefully realizing the two active bending actuators limiting each chamber wall) that there are no oscillations which, e.g., would be disruptive when used as hearing aid or in-ear headphone.

The fluid flow 12 may pass through, e.g., the opening 26a and/or 26b. The openings 26a and 26b may be configured in the same way or may be adapted to a geometry of the neighboring subcavity 38a and 42a, respectively. For example, the opening 26a may comprise a variable cross-section along an axial direction (such as the y direction), e.g., a dimension along the x direction. The dimension of the opening 26b along the x direction may decrease in a direction towards an interior of the MEMS transducer 20, i.e., towards the cavity or the subcavity 42a. Alternatively or additionally, the opening 26 may comprise a variable dimension or a variable cross-section along a further direction such as a z direction (thickness direction) perpendicular to the axial direction y. The variable cross-section may decrease from an outside of the MEMS transducer 20 in a direction towards the cavity 16. A tapering cross-section or a decreasing dimension of the opening 26 from the outside of the MEMS transducer 20 in a direction towards the cavity 16 along one or several directions x and/or z may be referred to as a funnel-shaped opening.

The possibly funnel-shaped opening 26 may be useable as a device for matching an impedance. For example, impedance matching may be advantageous when using the MEMS transducer 20 as a loudspeaker. A design or geometry of the opening 26b may be embodied analogously to macroscopic loudspeakers with dimensions of several centimeters. A shape of the opening 26b may enable defining the actual sound radiation by the outer surface of the funnel. For example, the opening 26b may be formed continuously in the structured layers 34a, 36 and 34b. A bar grid 54 including at least one bar element 44 may comprise openings, or gaps, between the bar elements 44 and/or between the bar elements 44 and the neighboring substrate. The gaps may be formed such that the fluid may flow through the same.

The bar grid 54 may provide a protection against particles entering into the cavity of the MEMS transducer 20. A width of the openings of the bar grid 54, i.e., a distance between the bar elements 44, may be embodied such that the fluid flow 12 is affected or not affected with respect to the flow to the desired degree. Exemplarily or ideally, the distance between the bar elements 44 may be smaller than the smallest slit distances in the MEMS transducer 20 so that the bar grid may filter a high number of, or even all, relevant particles. For example, a slit distance may describe a distance of a deformable element 18a-c to a layer 32a or 32b. For example, the distance between the bar elements 44 may be lower than 5 µm, 1 µm, 0.1 µm or 0.05 µm.

Dimensions of the bar elements 44 along the space directions may be implemented such that the bar elements 44 do not comprise any resonances in the auditory sound range, i.e., in a frequency range of at least 16 Hz and at most 22 KHz. Although the bar elements 44 are illustrated such they are arranged at an outside of the MEMS transducer 20, e.g., in a region in which the opening 26a or 26b comprises a maximum dimension along the x direction, one or several bar elements may also be arranged at a different location of the opening 26a or 26b, e.g., in a tapering region of the opening 26a and/or 26b.

The volume of a subcavity 42a may be decreased by the deformation of the deformable elements. During a same time interval, a volume of the chamber (subcavity) 38a may increase. The subcavity 38a may be connected to the surrounding area of the MEMS transducer 20 in a same or a similar way as the subcavity 42 via a funnel-shaped opening 26b and/or a bar grid 54 including one or several bar elements 44. The electromechanical transducers 18a-f may be configured to be driven with a frequency different from each other or may comprise a resonance frequency different from each other. A volume of each subcavity may change with a frequency different from each other or with an at least partially same frequency.

The opening 26a and the opening 26b may be arranged at or in walls of the MEMS transducer 20 oppositely arranged in the space. For example, the fluid flow 12 may be ejected or sucked in on a respective side comprising the opening 26a or 26b by means of the subcavities 42a and 38a, respectively, or a multitude of such subcavities. This means that the fluid flow 12 may be generated in opposing directions. For example, in a first time interval, the volume flow 12 may be ejected in a negative y direction from the opening 26a and may be sucked into the subcavity 38a. In a second time interval, these directions may be reversed. In this way, a flow short-circuit along the MEMS transducer 20 may be prevented or eliminated.

The deformable elements (bars) of the electromechanical transducers 18a-f may be configured in order to be curved according to a signal fed from the outside.

A frequency with which the curving occurs may be a frequency with which the volume flow 12 is generated and/or oscillates and which may therefore affect or determine a sound frequency. An amplitude of the osculation determined by the signal fed may (at one or several (resonance) frequencies affect or determine an amplitude of the volume flow 12 and may therefore have effects on the sound level.

Also, at least one chamber (cavity or subcavity) may function as a sensory element and another chamber may function as an actuating element. This means that the MEMS transducer may include at least one element deformable in a sensory manner and one element deformable in an actuating manner. The movement of the bars is detected and evaluated. In this way, e.g., the electromechanical transducers 18a and 18b may be driven as actuators, while the electromechanical transducers 18c and/or 18d may be used as sensors for detection in the fluid. Electrostatic (capacitive), piezoelectric or piezoresistive sensor elements may be integrated for detection. Such an element may be employed as a microphone and/or pressure sensor. Such an integrated microphone and/or such a pressure sensor may also be employed for regulating and controlling the characteristics of the loudspeaker chambers (actuators), or the ultrasonic emitter chamber, or the pump chamber. For this, a corresponding electronic system has to be employed as drive circuit/control circuit.

Subsequently, further embodiments will be explained for the electromechanical transducers and/or actuators. Although the MEMS transducer 20 has been described in such a way that an undeflected, or non-actuated, state comprises undeflected deformable elements, the states may also be reciprocally exchangeable. This means that, in a first non-actuated state, the deformable elements may be deformed or curved and, based on a drive signal, may be deformed to a state which is less strongly curved, more strongly curved or straight.

Although the above-mentioned discussions explain that an electric signal is applied at the MEMS transducer 20, e.g., by a control device, the volume flow 12 may also lead to a deformation of the deformable elements, wherein the deformation may be obtained by means of an electric signal at the MEMS transducer 20, i.e., the MEMS transducer 20 may also be configured as a sensor.

Subsequently, reference is made to advantageous modifications of the deformable element. One or several electromechanical transducers may comprise deformable elements according to the subsequently described modifications.

Figure 3:
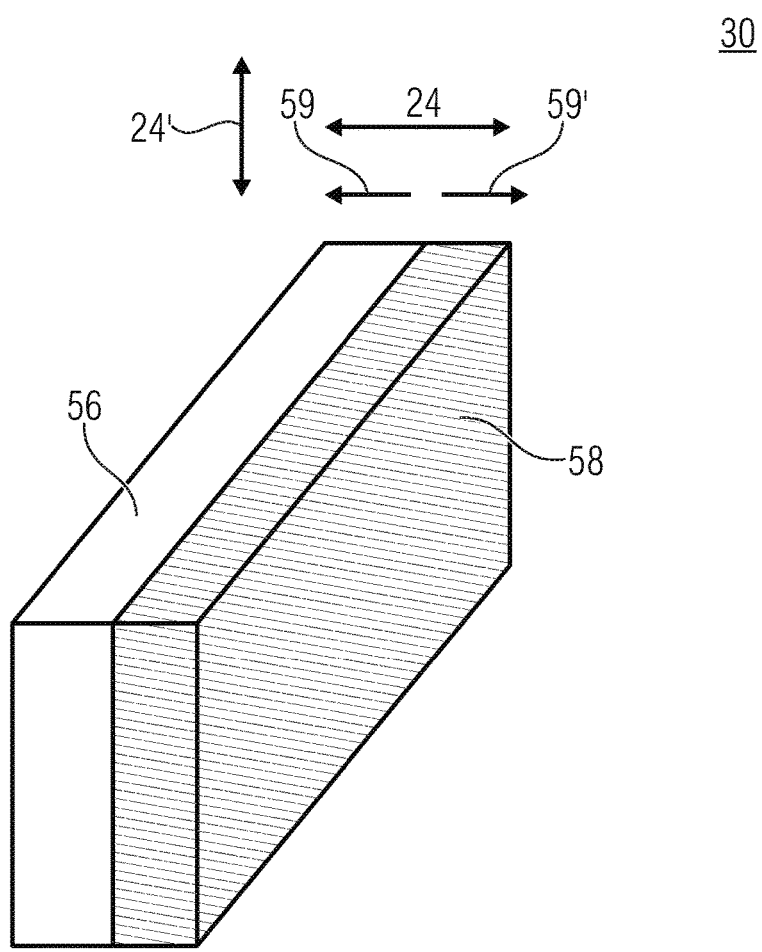
FIG. 3 shows a schematic perspective view of a deformable element embodied as a bimorph according to an embodiment.

FIG. 3 shows a schematic perspective view of a deformable element 30 embodied as a bimorph. The deformable element 30 comprises a first layer 56 and a second layer 58 which are at least in positions, advantageously over the entire surface, fixedly connected to each other. The first layer 56 and the second layer 58 are configured to be deformed, e.g., to expand or to contract, to varying degrees based on a mechanical, physical or chemical influence. For example, the layers 56 and 58 may comprise thermal expansion coefficients different from each other. Alternatively or additionally, the layer 56 or layer 58 may be configured to expand or to contract based on an electric signal fed to the corresponding layer. For example, this layer may comprise piezo materials.

Mutually different contractions or expansions of the layers 56 and 58 may lead to a deformation of the deformable element 30 along an actuation direction 59 or 59'. The actuation direction may be arranged in parallel to the lateral movement direction 24. The actuation direction may be a direction along which the deformable element 30 is deflectable by applying a positive electric voltage.

Alternatively or additionally, a deformation may be used along a further lateral movement direction 24', e.g., which is based on a cross-contraction or cross-expansion of the deformable element 30 and/or the contraction or the expansion of one of the layers. This means that the deformable element 30 may be configured to be curved with its bar structure along an axial direction (e.g., the y direction, or in-plane) of the bar structure. This may occur based on a reciprocating movement, i.e., along the lateral movement direction 24 and along an opposite direction.

In other words, the bimorph may correspond to a bar consisting of two layers. For example, the layers are arranged in a direction (e.g., vertically) towards each other. A passive layer (e.g., the layer 56) may be fixedly connected to an active layer (e.g., the layer 58). By applying a suitable signal, a mechanical tension may be generated in the active layer 58, leading to the contraction or expansion of the layer 58. A direction of the change in length of the layer 58 may be chosen such that the bimorph is laterally bent into one (contraction) or the other (expansion) direction.

Figure 4B:
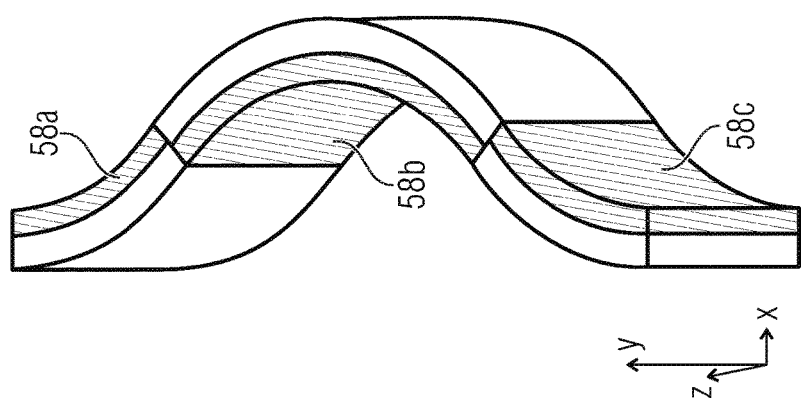
FIG. 4b shows a schematic perspective view of the deformable element according to FIG. 4a in a deflected state according to an embodiment.
Figure 4A:
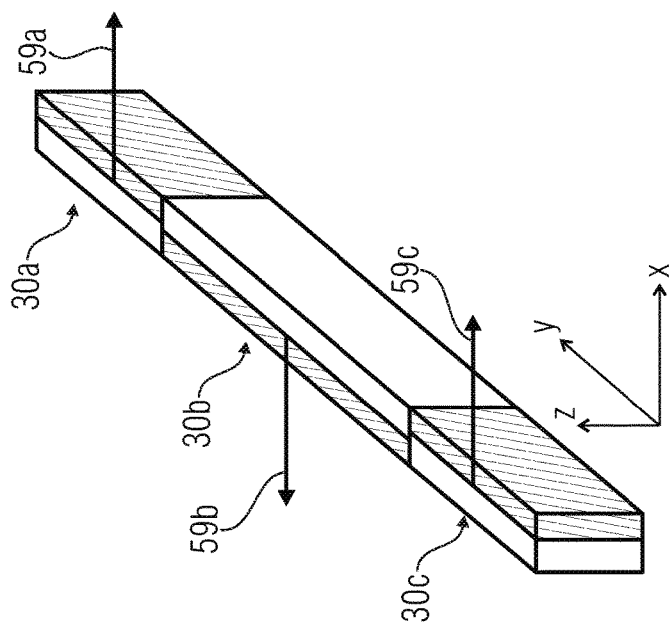
FIG. 4a shows a schematic perspective view of a deformable element comprising three bimorph structures according to an embodiment.

FIG. 4a shows a schematic perspective view of a deformable element 40 comprising three bimorph structures 30a-c, as described in connection with FIG. 3. A schematic arrangement of the deformable element 40 in the space along the x, y and z directions is illustrated exemplarily (but not in a limiting manner) in such a way as the deformable element 40 may, e.g., be arranged in the MEMS transducer 10 or 20. The deformable (sub)elements 30a-c may comprise dimensions different from each other, e.g., along the x, y or z directions. For example, the deformable elements 30a and 30c may comprise a same extension along the y direction. For example, the actuation directions 59a-c of the deformable elements 30a-c may be arranged in alternating manner or comprising a reciprocal alignment, e.g., in a positive/negative/positive x direction. Simply put, this may be understood such that the deformable elements 30a and 30c comprise a same length. The deformable element 30b may comprise a length different to this. For example, a length of the deformable element 30b may be twice as long as the comparable length of the elements 30a or 30c. According to further embodiments, further elements, e.g., spring elements, may also be arranged between the deformable elements 30a-c.

A direction along which the deformable elements 30a-c are deflected when a same or comparable quantity is applied (such as a sign of an electric voltage) may be alternating along the length of the deformable element 40. This enables an alternating curving course. Although the deformable element 40 is illustrated such that the same includes three deformable elements 30a-c, two deformable elements or more than three deformable elements 30 may be arranged.

FIG. 4b shows a schematic perspective view of the deformable element 40 in a deflected state. For example, the layers 58a-c are contracted such that this results in a multi-curvature along an axial progression (y direction).

In other words, three bars illustrated in FIG. 3 may be arranged adjacent to each other in the direction of their extension. This may occur in such a way that a first bar and a third bar (30a and 30c), upon a corresponding signal, comprise a curvature in a first direction, and the second bar (30b) comprises a curvature in the other direction. In this way, an actuator may be obtained which, based on its stretched form without a signal, as illustrated in FIG. 4a, is deformed with a corresponding signal in an S-shaped manner, as illustrated in FIG. 4b. The configuration with signal or without signal is reciprocally exchangeable. Thus, the deformable elements 30 may, e.g., comprise a pre-deflection or bias leading to a reduced curvature or a straight extension of the deformable element 30 and/or 40 based on the signal applied. For example, it can be assumed that curvatures of the individual bars 30a-c are identical apart from the sign, and a respective length of the first and the third bar 30a and 30c corresponds approximately to a quarter of a total length of the deformable element, and wherein a length of the center bar 30b corresponds approximately to half of the length of the deformable element 40.

Figure 4C:
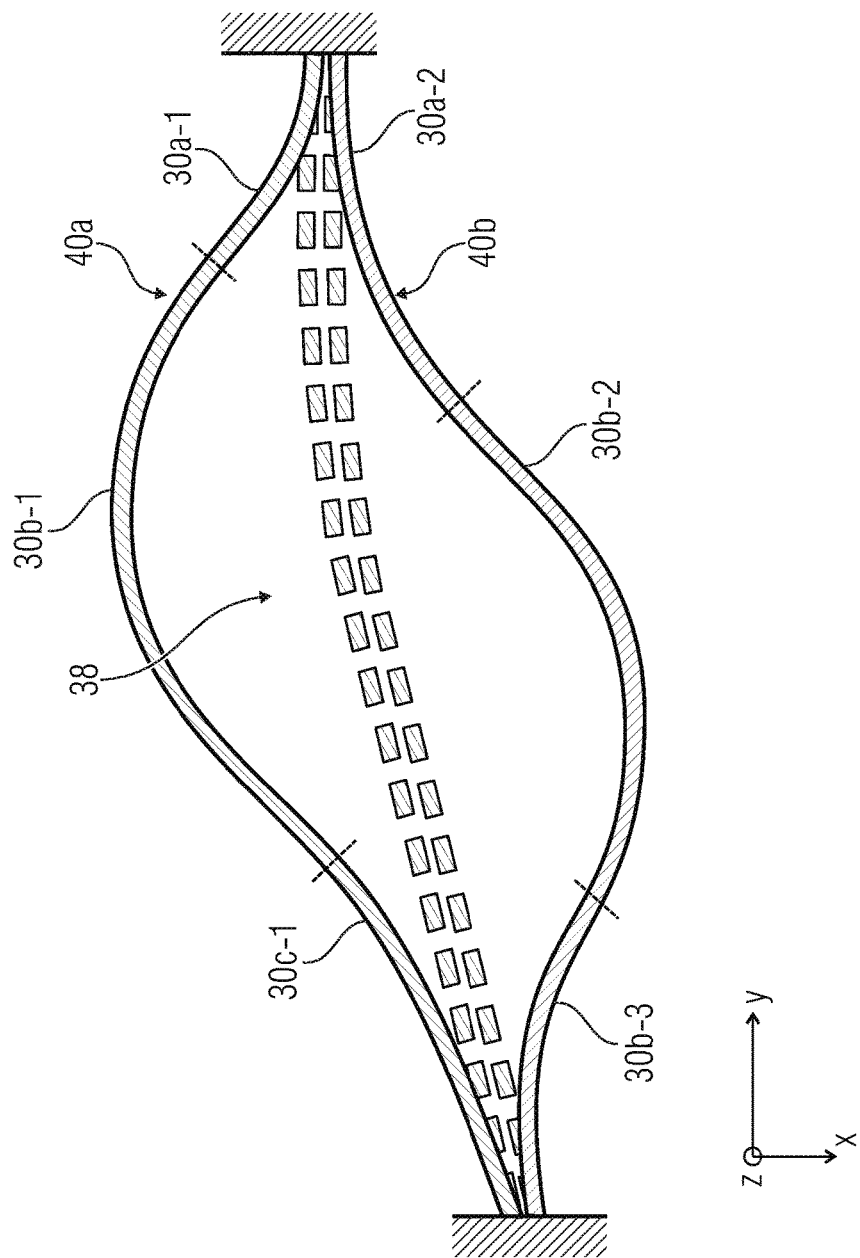
FIG. 4c shows a schematic top view of an arrangement of two deformable elements arranged adjacent to each other according to an embodiment.

FIG. 4c shows a schematic top view of an arrangement of two deformable elements 40a and 40b clamped on two sides, which are arranged adjacent to each other so that the subcavity 38 is arranged between the deformable elements. For example, the solid lines show an actuated state of the deformable elements 40a and 40b, while the dotted lines show a non-actuated state, wherein this description of the deformable elements is reciprocally exchangeable since the non-actuated state may take any shape due to manufacturing.

The deformable elements 40a and 40b may be formed such that they comprise a curvature in the non-actuated state. Furthermore, the deformable elements 40a and 40b may be formed from three segments 30a-1 to 30c-1, and 30a-2 to 30c-2, respectively, which carry out a reciprocal curvature during the actuation. Each segment, e.g., the center segment 30b-a or 30b-2, may also be formed from two or more segments. Compared to the illustrations of FIGS. 4a and 4b, the segments 30a-1, 30b-1 and 30c-1 may comprise a different length with respect to each other and to every other segment. The length may be adaptable to a desired shape to be obtained upon actuation. The S-shaped actuators have the large advantage that they do not only allow to achieve a large planar filling factor, but they may also be clamped on two sides. Clamping on two sides significantly reduces a pre-deflection of the bars due to layer tension gradients, which is never entirely avoidable. With this, the distances to the lower and upper caps of the substrate may be kept very small, disproportionately reducing the flow/pressure losses and, thus, not only significantly increasing the efficiency of loudspeakers, ultrasonic transducers, microphones and pumps, but possibly enabling their correct operation in the first place. According to further embodiments, merely one of the deformable elements 40 may be arranged, e.g., in the MEMS transducer 10.

Figure 5:
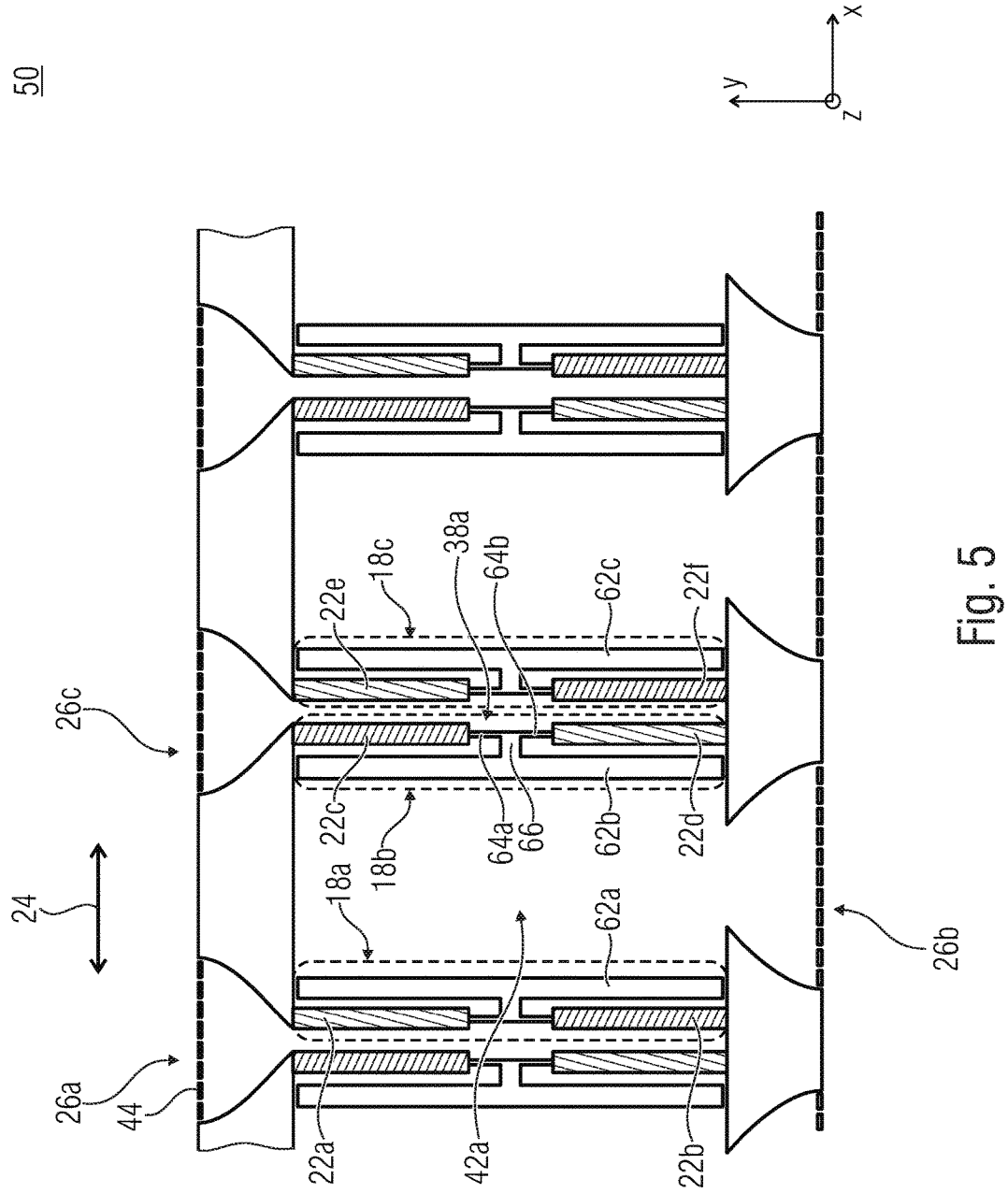
FIG. 5 shows a schematic top view of a MEMS transducer, in which the electromechanical transducers comprise a different configuration compared to the MEMS transducer of FIG. 2, according to an embodiment.

FIG. 5 shows a schematic top view of a MEMS transducer 50, in which the electromechanical transducers 18a-c comprise a changed configuration compared to the MEMS transducer 20. The electromechanical transducers 18a-c each include a first and a second deformable element 22a and 22b, 22c and 22d, and 22e and 22f, respectively. The deformable elements are arranged opposite to each other. Deflectable ends of the bar elements are arranged facing each other. Regions at which the deformable elements 22a-f are connected to the substrate are arranged facing away from each other.

The electromechanical transducers 18a-c each comprise a plate element 62a-c connected to the deformable elements 22a and 22b, 22c and 22d, and 22e and 22f, respectively. The respective plate elements 62a-c may be connected to the deflectable ends of the respective deformable elements 22a-f.

The deformable elements 22a-f may be embodied entirely or partially as a deformable element 30 or 40 or may comprise a different configuration. Different hatchings of the deformable elements 22a and 22b, 22c and 22d, and 22e and 22f, respectively, indicate that the deformation of the respective deformable elements is different from each other. The deformable elements of an electromechanical transducer 18a-c may be arranged such that the same carry out a deflection of the deflectable ends along a same space direction independently from a respective design of the deformable element 22a-f.

For example, from the un-deflected state illustrated in FIG. 5, a drive may cause that a deflection of the deflectable ends of the deformable elements 22a and 22b is carried out along a positive x direction. Furthermore, a drive of the deformable elements 22c and 22d may cause that a deflection of the respective deflectable ends is carried out along a negative x direction. This enables the plate elements 62a and 62b to move towards each other during the drive so that the subcavity 42a is decreased in size based on the movement of the plate elements. Alternatively or additionally, a negative pressure in the cavity 42a may lead to the plate elements 62a and 62b moving towards each other so that a deformation of the deformable elements 22a-d is obtained. Alternatively or additionally, it is also conceivable that one or several deformable elements 22a-d are embodied to be electrically passive. For example, an electric potential may be applied at one or several plate elements 62a-c so that, based on an electric potential of the plate elements 62a and 62b, an attractive or repulsive force is obtained between the plate elements 62a and 62b, causing a movement of the plate elements 62a and 62b and therefore also a deformation of the deformable elements 22a-d. Alternatively or additionally, the deformable elements 22c-f and/or the plate elements 62b and 62c may be driven at the same time or offset in time in order to obtain a deformation of the deformable elements 22c-f and a change of the volume of the subcavity 38a.

In other words, FIG. 5 shows a variation of the configuration shown in FIGS. 2a-c, in which four bending bars 22a-d and 22c-f, respectively, are used for narrowing and/or extending of each chamber (cavities 42a and 38a). This is described in connection with the FIGS. 2a-c based on two bending bars (deformable elements), respectively. FIG. 5 shows a non-actuated state. In this case, the actuated and non-actuated states are reciprocally exchangeable. Thus, each drivable deformable element may generally be deformed when no signal is applied, and may change its deformation depending on the signal, part of which is achieving a stretched (non-deflected) state as a special case.

Vertically (e.g., along the y direction) opposite bending bars such as the deformable elements 22a and 22b, and 22c and 22d, respectively, may each be connected to each other via a bendable ridge including the elements 64a and 64b. In a center region of the ridge obtained in such a way, a relatively rigid extension, the element 66, may be arranged. In turn, the plate element 62b, which is embodied to be rigid or as rigid as possible, may be arranged at the same. Upon applying a corresponding signal, the plate elements 62a-c may move towards each other or away from each other in parallel in order to reduce and/or increase volumes of subcavities. The parallel movement of the plate elements may enable that the volume of the subcavity 42a may be zero in the limiting case, which means that the plate elements 62a and 62b contact each other. Compared to a configuration as described in combination with FIGS. 2a-c, such an arrangement may provide a volume flow of the fluid which is significantly larger than the volume flow of the MEMS transducer 20. Upon reducing the volume of the subcavity 42a, the volume of the subcavity 38b may be increased accordingly or at least based on this. The fluid may be supplied, as described in connection with the MEMS transducer 20, through an opening 26a, 26b and/or 26c. The elements 64a and 64b may also be referred to as spring elements.

The deformable elements (bending bars) 22a and 22b may be designed such that they curve towards the right (positive x direction) when a signal is applied. The deformable elements 22c and 22d may be designed such that they curve towards the left (negative x direction) when a signal is applied. Both types of bars (hatchings of the deformable elements) may be configured such that they are curved upon a first signal, as in connection with FIG. 3 or 4, and that they are curved in the opposite direction upon a second signal. In this case, both narrowing and extending the chamber (subcavity) to the original size may be obtained independently from the mechanical restoring force due to the bending of the bars. For example, the first and second signals may be a positive and a negative electric voltage. For example, when considering FIG. 3, the layers 56 and 58 may also each be active layers, or a further active layer may be arranged at the layer 56 at a side facing away from the layer 58, wherein the two active layers may be addressed separately from each other in order to obtain a deflection in one or the other direction.

A volume between two opposite deformable elements, e.g., the deformable elements 22c and 22d, and the plate element 62b connected to the same may change upon a movement or deformation of the bending bars. For example, the plate element 62 may be embodied to be rigid. In order to enable an improved pressure compensation, the deformable elements 22c and/or 22d and/or the connecting elements 64 and 66, respectively, connecting the plate element 62b to the deformable elements 22c and 22d, may be locally thinned out or decreased in thinness in order to provide a local flow channel. For example, this may occur by an additional structuring or etching. The connecting elements 64a, 64b and 66 may be arranged in a T-arrangement. The connecting element 66 may comprise a high rigidity compared to the elements 64a and 64b. During a deformation of the deformable elements 22c and 22d, the elements 64a and 64b may advantageously be deformed in order to enable a straight movement of the respective plate element.

Subsequently, advantageous embodiments are described based on FIGS. 6a-e, in which the plate elements 62a and 62b are connected to opposite deformable elements 22a and 22b, and 22c and 22d, respectively.

Although the following explanations refer to a connection of the plate elements with the deformable elements, which are in each case designed in the same way, different electromechanical transducers and/or connections of individual deformable elements to a plate element may be embodied differently from each other. The details described below describe non-completely advantageous further modifications and may be implemented on their own or in combination with one another or in other advantageous embodiments.

FIG. 6a shows a schematic top view of a configuration, in which spring elements 68 configured in a straight manner are arranged between the plate elements 62a and 62b and the deformable elements 22a and 22b, and 22c and 22d, respectively. The spring elements 68 may be formed from a material of the deformable elements 22a-d or a material of the plate elements 62a or 62b and/or integrally with one or several of these elements. For example, the spring elements 68 may comprise a right angle to the plate element 62a or 62b.

FIG. 6b shows an alternative configuration, in which the spring elements 68' are arranged from flexible ends of the deformable elements with an angle α of less than 90°, e.g., 30° or 40°. This enables an increased distance of the contact points at the plate element 62a, compared to the configuration of FIG. 6a, which may lead to a decreased bending of the plate element 62a during the movement.

FIG. 6c shows a configuration, in which the spring elements 62a are arranged with an angle α of less than 90°. For example, this may lead to decreased restoring forces of the spring elements 68, when compared to the configuration as illustrated in FIG. 6a.

Figure 6E:
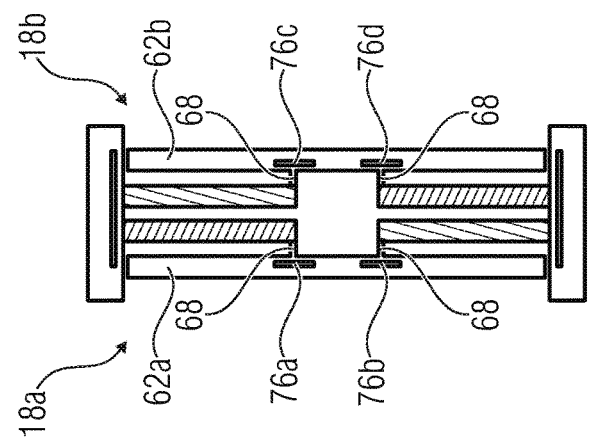
FIG. 6e shows a schematic top view of an electromechanical transducer, in which plate elements comprise recesses, according to an embodiment.
Figure 6D:
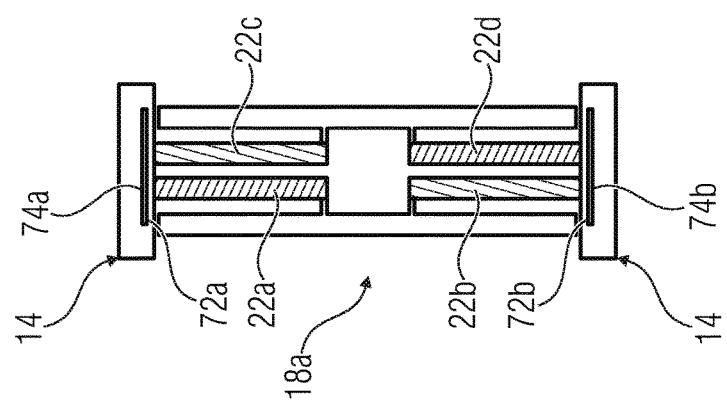
FIG. 6d shows a schematic top view of an electromechanical transducer, in which the substrate comprises a spring element adjacent to a deformable element, according to an embodiment.

FIG. 6d shows a configuration, in which the configuration of FIG. 6a is modified such that a spring element 72a or 72b is arranged in regions of the substrate 14 adjacently to which the electromechanical transducer 18a is arranged, or the respective deformable element is connected to the substrate 14.

For example, the spring element 72a and/or 72b may be at least partially determined by a recess (cavity) 74a and 74b, respectively, in the substrate 14. For example, this means that a rigidity of the substrate 14 is locally reducible due to the recesses 74a or 74b, so that the spring elements 72a and 72b, respectively, are formed. Although the recesses 74a and 74b are illustrated such that they extend beyond neighboring deformed elements 22a and 22c, and 22b and 22d, respectively, in the substrate 14, the recess 74a or 74b may merely be arranged adjacent to a deformable element or adjacent to several deformable elements. Alternatively, the substrate 14 may also comprise several recesses or spring elements.

In other words, FIG. 6d shows a configuration, in which a further structure in the form of a bending spring (spring elements 72a and 72b), at which the deformable elements (bars) are fixed, may lead to a further reduction of the tensile stress. For example, such bending spring elements may also be integrated into the rigid plate, as shown in the configuration of FIG. 6e and described in connection with the recesses 76a-d. In the case of the deflection of the bars, these elements may be deformed in a S-shaped manner and reduce the tensile stress on the rigid plate.

FIG. 6e shows a configuration of electromechanical transducers 18a and 18b, in which, compared to the configuration as described in connection with FIG. 6d, the plate elements 62a and 62b comprise recesses 76a-d adjacent to a region at which the plate elements 62a and 62b, respectively, are connected to the deformable elements via the spring elements 68. A distance between the recesses 76a-d and a side of the plate elements 62a and 62b, respectively, facing away from the deformable elements may affect a rigidity of the plate elements 62a and 62b, respectively, in this region. The recesses 76a-d enable decreased restoring forces acting on the deformable elements 22a-d.

In other words, FIGS. 6a-e show variations for a design of the moveable elements, or the electromechanical transducers. These differ from an embodiment, as described in combination with FIG. 5, for example or in particular, in that the elements 64a or 64b indicated in FIG. 5 have been merged with the stiffener 66 towards the spring elements 68. The configuration according to FIG. 6a may comprise a higher rigidity compared to parasitic inclinations of the plate elements 62a or 62b around an axis perpendicular to the drawing plane (x/y plane). This may similarly apply to the configurations according to FIGS. 6b and 6c. Furthermore, all three configurations enable larger deflections of the bending bars compared to the configuration of FIG. 5. In this case, the element 64a and/or 64b (bendable ridge) may be under tensile stress upon a deflection of the bars, which may result, upon a growing deflection, in an increasing mechanical resistance for the bar deflection of the deformable elements. In the variations according to FIGS. 6a-c, the mechanical connection of the two deformable elements may be embodied in a significantly smoother (less rigid) manner since the respectively connecting spring elements 68 may react with bending which may, with a corresponding design of these elements, represent a significantly lower mechanical resistance.

The connecting elements/springs 68 and/or the elements/springs 64a-b described in connection with FIG. 5 may comprise a curved or meander-shaped shape. This enables an increased flexibility in an advantageous direction. The configurations, as described in combination with FIGS. 6d and 6e, enable a decrease of the tensile stress which would lead to an effective stiffening of the deformable element. The configurations described in FIGS. 6a-e neglect input openings and output openings 26. If these openings are arranged, recesses and/or spring elements may be omitted in the substrate in regions in which the opening is arranged. Alternatively or additionally, one, several or each of the spring elements 72a, 72b and/or the plate elements 62a or 62b obtained by at least one recess may be realized based on two or several mutually separated and independent spring elements.

The subsequently described FIGS. 7a-c exemplarily describe possible arrangements of deformable elements and plate elements.

FIG. 7a shows the deformable element 40 connected to the plate element 62. For example, the plate element 62 may be arranged immediately at the deformable element 40.

FIG. 7b shows a configuration, in which the deformable element 40a is fixedly clamped between the substrate 14 and is configured to be deformed along the lateral direction 24. Two further deformable elements 40b and 40c, the ends of which may be connected, are arranged between the deformable element 40 and the plate element 62. Based on the connections, the deformable elements 40b and 40c may be aligned towards each other such that a bulge of the respective deformable element 40b or 40c points away from the other deformable element. For example, the deformable elements 40a-c may be driven together or react together to the volume flow of the fluid, wherein, e.g., a mutual drive of the deformable elements 40a-c lead to an increase in size of the actuator travel, i.e., to an increase in size of the path by which the plate element 62 is deflected. This means that at least one further deformable element may be arranged between the deformable element and the plate element, which is configured to increase an actuator travel of the deformable element upon a mutual drive together with the deformable element.

FIG. 7c shows a configuration of the electromechanical transducer 18, in which the deformable elements 40a-c comprise recesses 70a or 70b in a center region, which enable a fluidic coupling of a volume 82 between the deformable elements 40b and 40c with a further subcavity, e.g., the subcavity 38a. The deformable elements 40a, 40b and/or 40c may each be embodied in two parts in order to provide the recesses 78a and 78b. Alternatively or additionally, the recesses 78a and 78b may be embodied as recesses which are enclosed along a thickness direction (z direction) by further material of the deformable elements 40a, 40b and 40c, respectively.

In other words, FIG. 7a shows a configuration with an actuated S-shaped bending bar according to FIG. 4, in which a connection to the bending bar is arranged in the center of the rigid plate. In order to increase the deflection, bending actuators may be arranged successively multiple times (in series). FIGS. 7b and 7c schematically show an arrangement of three S-actuators connected in series. According to further embodiments, two S-actuators (deformable elements 40) or more than three actuators may be connected in series. The hatchings of the deformable elements in FIGS. 7a-c are illustrated, e.g., matching the hatchings as chosen in FIG. 4. Different hatchings may signify a different curvature direction of the respective portions. FIG. 7c shows a configuration comprising an opening (recesses 78a and 78b) in the center of the S-shaped actuators, which enables an improved ventilation of the gap (cavity 82).

Figure 7D:
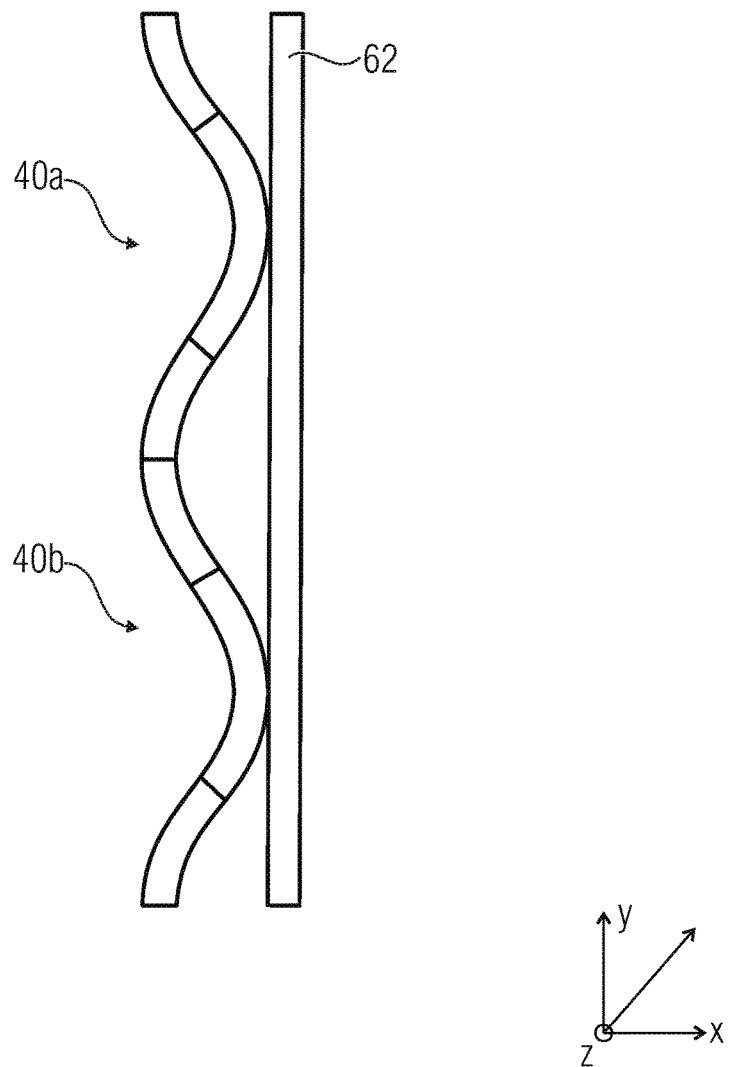
FIG. 7d shows a schematic top view of a configuration of the electromechanical transducer, in which a first deformable element and a second deformable element are arranged in parallel to each other.

FIG. 7d shows a configuration of the electromechanical transducer, in which a first deformable element 40a and a second deformable element 40b are arranged in parallel along the y direction. This enables an increase of the force effect with which the plate element 62 is deflected. Ends of the deformable elements may be connected to each other or may be arranged together at the substrate. Alternatively, two or several deformable elements 40a and 40b may be arranged in parallel along a different direction, e.g., along the z direction (thickness direction). Alternatively or additionally, a series connection and a parallel connection of deformable elements may be combined.

Upon a large deflection or too large of a deflection, moveable elements may hit another moveable element or a fixed element. This may lead to sticking. Advantageously, the moveable elements or the fixed elements may be provided with spacer elements (bollards), enabling to significantly decrease the contact area and, thus, to reduce sticking or to avoid the same. Instead of so-called bollards, small structures configured as spring elements may be arranged. Besides avoiding sticking, the impulse of two elements hitting may be reversed, whereby energy losses may be reduced or avoided, or the dynamic performance of the actuators may be improved.

Figure 8A:
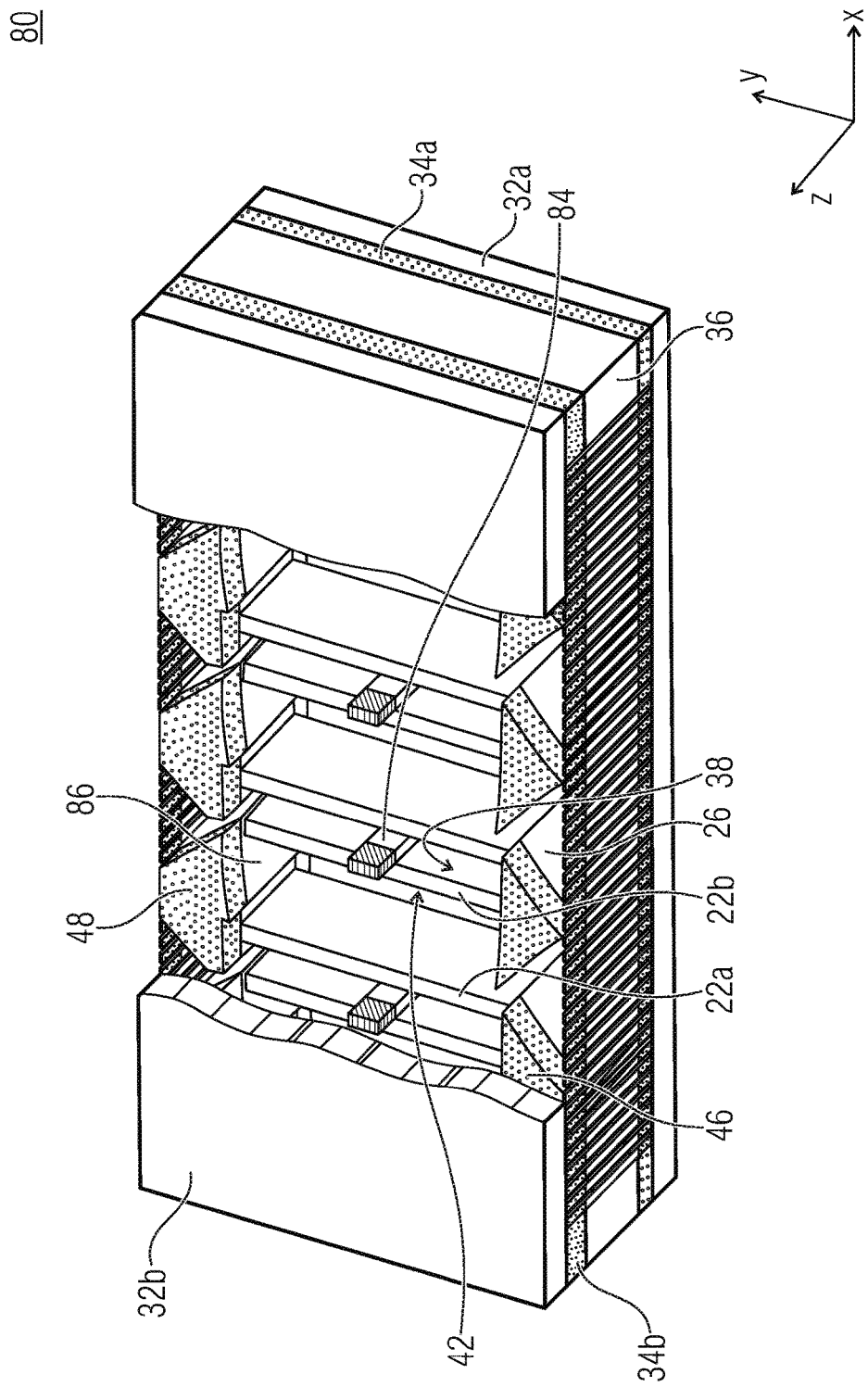
FIG. 8a shows a schematic perspective view of a MEMS transducer, in which the deformable elements are connected in an alternating manner to the substrate or to an anchor element, according to an embodiment.

FIG. 8a shows a schematic perspective view of a MEMS transducer 80, in which the deformable elements are connected in an alternating manner to the substrate and/or to the intermediate layer 36 and/or to an anchor element 84 connected to the substrate. For example, the deformable element 22a is fixedly connected to the substrate at ends in the regions 46 and 48 of the intermediate layer 36 and is configured to carry out an S-shaped movement, as exemplarily explained in connection with the deformable element 40. The deformable element 22b arranged adjacent is connected to the anchor element 84. The anchor element 84 is arranged in a center region of the deformable element 22b and may be connected at the spacer layer 34a or at the layer 32a with the same. This means that the substrate may comprise an anchor element.

Sidewalls of the intermediate layer 36 arranged adjacent to moveable ends of the deformable elements 22a or 22b may be shaped based on a movement shape of the deformable elements 22a and 22b, respectively.

Figure 8B:
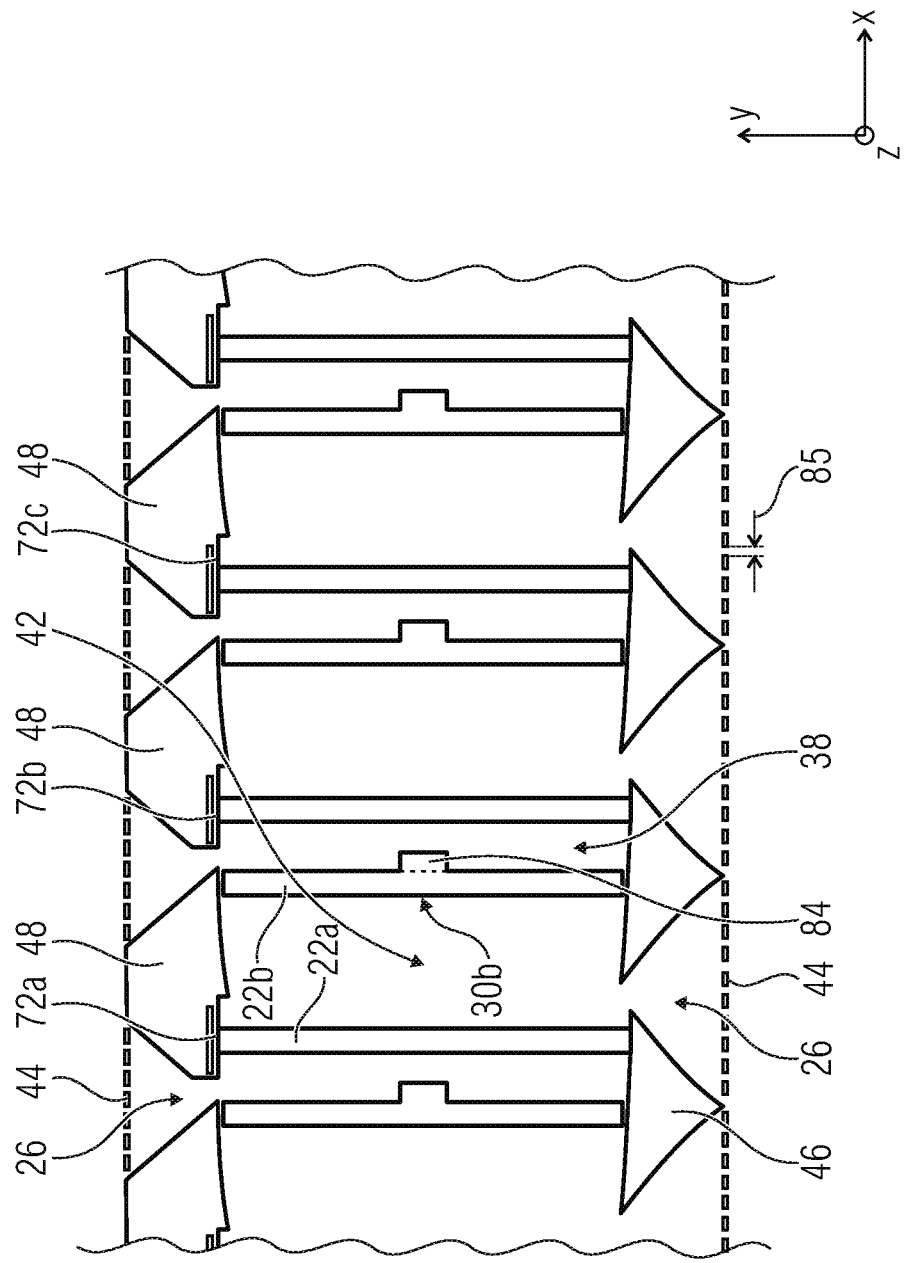
FIG. 8b shows a schematic top view of the MEMS transducer of FIG. 8a according to an embodiment.

FIG. 8b shows a schematic top view of the MEMS transducer 80, wherein the spacer layer 34b and the layer 32b are exemplarily not shown. The MEMS 80 includes the bar elements 44 in regions of the openings 26. The regions 48 may comprise the spring elements 72a-c. The regions 48 are exemplarily illustrated as a top view of the intermediate layer 36.

The anchor element 84 may be integrally shaped with the deformable element 22b and/or a layer of the substrate. However, as illustrated in FIG. 8, the anchor element 84 may extend along the z direction beyond the deformable element 22b in order to connect the layers 32a and 32b with each other. This enables a decreased oscillation susceptibility of the layers 32a and 32b. Alternatively, the anchor element 84 may also be formed of another piece and/or of another material as the mechanically deformable element 22b. For example, the deformable element 22a arranged adjacent to this is fixedly connected to the substrate on two sides in the regions 48 or 46, e.g., in a form-fitted or in a force-fitted manner.

For example, a distance 85 between the bar elements 44 may be less than 1 µm, less than 0.1 µm or less than 0.05 µm.

The anchor element 84 may be arranged in a center region of the deformable element 22b. For example, the center region may include a geometric center of the deformable element. For example, the center region may be the bar segment 30b of the deformable element 40.

Figure 8C:
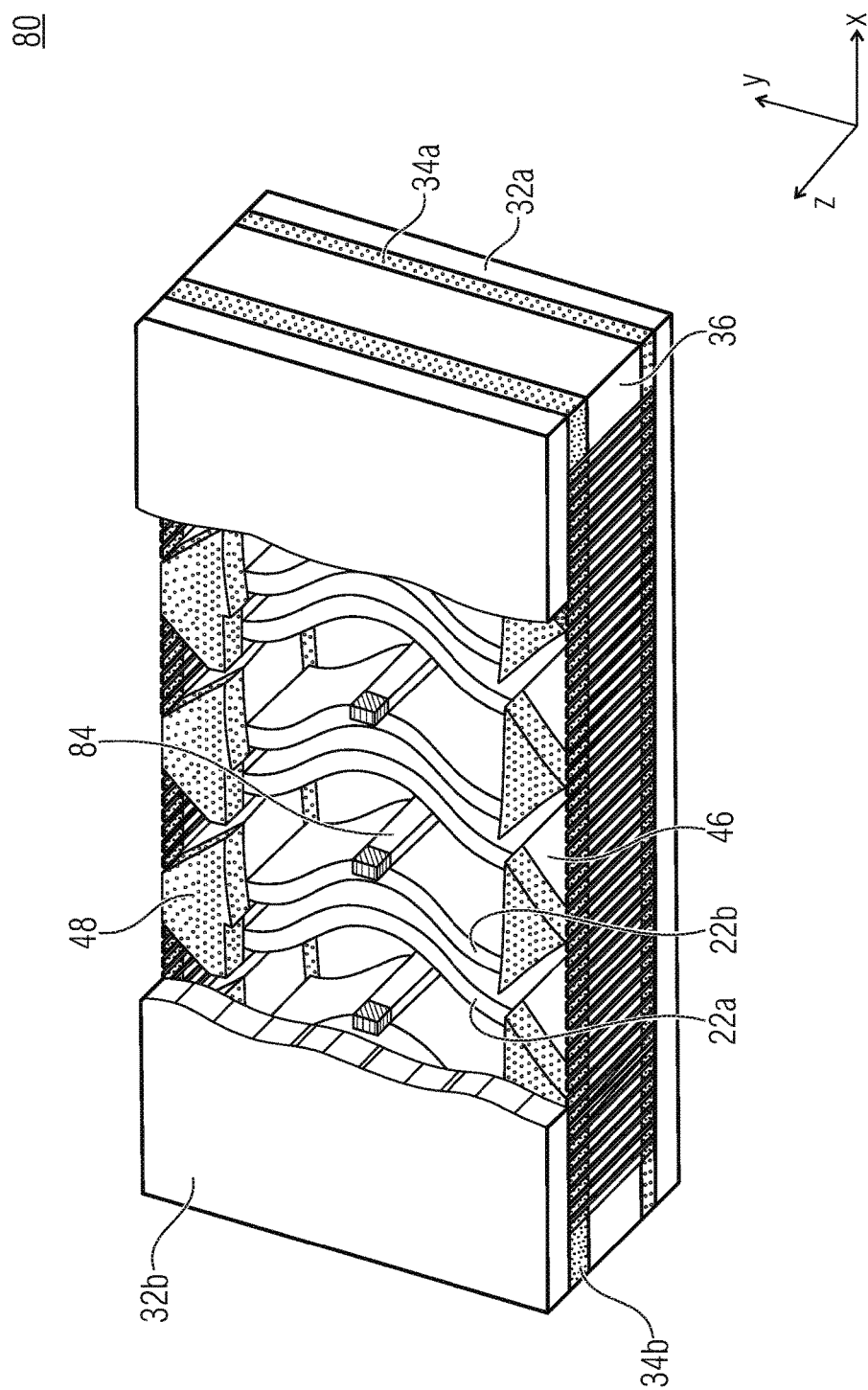
FIG. 8c shows a schematic perspective view of the MEMS transducer of FIG. 8a in a deflected state according to an embodiment.

FIG. 8c shows a schematic perspective view of the MEMS transducer 80 in a deflected state. Outer regions of the deformable element 22b may have moved in a direction towards the deformable element 22a, while locations of the outer ends of the deformable element 22a have essentially remained unchanged. A center region of the deformable element 22a may have moved in a direction of the deformable element 22b, while a location of the center region of the deformable element 22b has essentially remained unchanged based on the anchor element 84.

Figure 8D:
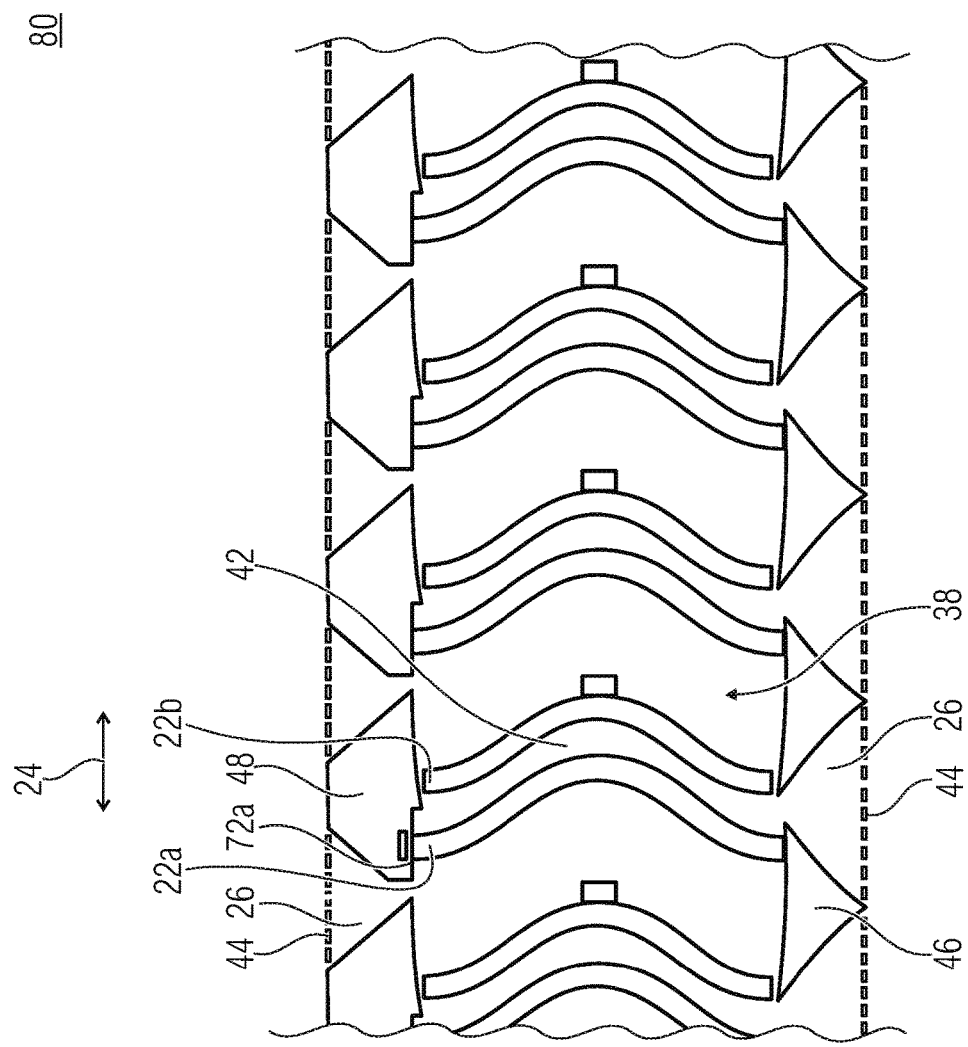
FIG. 8d shows a schematic top view of the MEMS transducer of FIG. 8b in the deflected state according to an embodiment.

FIG. 8d shows a schematic top view of the MEMS transducer 80 in the deflected state, as described in FIG. 8c. Compared to the view of FIG. 8b, the volume of the cavity 42 is decreased, while a volume of the subcavity 38 is increased. The spring element 72a may lead to a reduced force input into the deformable element 22a, however, it may not be arranged. A first subcavity 42 adjacent to an opening 26 of the substrate may be arranged between the bar structure of the first electromechanical transducer and of the second electromechanical transducer, or between the actuators 22a and 22b.

In other words, FIGS. 8a and 8b show a schematic 3D illustration, or a top view of a variation, in which a chip surface of the MEMS transducer is very efficiently usable. As in the base configuration, as described in connection with FIGS. 2a-c, bending actuators may exclusively or predominantly be used, i.e., the additional rigid plate element may be omitted. As illustrated in FIG. 8a, the chamber 42 is limited by two non-deflected S-actuators 22a and 22b. The S-actuator 22a limiting on the left (negative x direction) may be connected to the remaining device with both its ends on the upper side or the lower side (i.e., along the positive or negative y direction) in the drawing. The S-actuator 22b limiting on the right may be fixed at a post (anchor element) 84. Both ends of this S-actuator may be freely moveable. The post 84 may be fixedly connected to the upper and lower caps 32a and 32b, respectively. When a signal is applied, both actuators bend in an S-shaped manner. The spring element 72a illustrated in FIG. 8a, which is affected by a recess, may serve for releasing the tensile stress. The spring element is arranged along the lateral movement direction 24 in the element 48 in the drawing plane of FIG. 8b so that the spring element 72a is fixedly clamped along the lateral movement direction 24. As exemplarily illustrated in FIG. 8, the spring element 72a may comprise a fixed connection based on the spacer layers 34a and 34b to the same and may also be clamped. Alternatively, the layers 34a and 34b may be structured such that the spring element 72a has no contact to the spacer layer 34a and/or 34b and may therefore comprise a higher flexibility.

As illustrated in FIGS. 8c and 8d, the bulge-shaped curvatures of the S-actuator 22a may be moved towards the post 84 so that the center of the S-actuator 22a nearly touches the center of the S-actuator 22b. At the same time, the free ends of the S-actuator 22b have moved towards the fixed clamping of the S-actuator 22a so that the same also nearly touch. The actuated shape of the two S-actuators may be approximately the same or identical so that the chamber 42 may be practically or almost entirely closed upon sufficient deflection of the actuators. Thus, the original volume of the chamber 42 may be used entirely for the generation of the volume flow or for its detection. To the same extent as the chamber 42 loses volume, the chamber 38 may gain volume, whereby it may be avoided, when sufficiently dimensioning the elements affecting the flows, that too high a pressure difference between the chambers 38 and 42 occurring due to dynamic effects affects the movement of the actuators. The elements 46 and 48 may be embodied such that the distance to the free ends of the actuators 22b may remain small and/or approximately constant independently of the deflection of the ends. For relieving the strain of the actuators 22a, bending spring elements 72a may be arranged, as described above.

Above-described embodiments may include further actuators arranged in emerging flow channels. For example, the further actuators may not serve for directly generating sound, as may be possible, e.g., by the electromechanical transducers 18, but may be used for variably setting the flow characteristics. For example, with this, the attenuation and, as a consequence, the width of the resonance curve may be individually and flexibly adapted for each chamber according to the requirements during the operation of the device (MEMS transducer).

In the initially stated estimate, the volume change per active area ($\Delta V/A$) for a membrane loudspeaker according to the known technology was estimated to be 3.75 µm. As discussed in the following, this may be estimated again for a MEMS transducer illustrated in FIGS. 8a-c based on dimensions appropriate for the microtechnology, in order to obtain an estimate for an active area $\Delta V/A$. For this, a width of the actuators (in the x-direction in FIG. 8a) may be assumed to be a value of 5 µm. The width of the post 84 may also comprise a value of 5 µm.

For the distance of the actuators forming the sidewalls of the chamber 38 (e.g., in the non-deflected state in FIGS. 8a and 8b), 10 µm may be assumed. For a distance of the actuators forming the sidewalls of the chamber 42 (in the non-deflected state in FIGS. 8a and 8b), 100 µm may be assumed. A planar filing factor $F_p$, which may indicate which percentage of the active area may be used for the generation of a volume flow, may then result in $F_p=100/(5+100+5+10)=83\%$.

$$\Delta V/A \text{ may be expressed as: } \Delta V/A = A \times F_p h/A = F_p h$$

In the above expression, h may indicate the height of the chamber (e.g., the z-direction in FIG. 8a). Simply put, only the actuator height may be assumed for this. A thickness of the spacer layers 34a and 34b may be ignored. Compared to the above-mentioned 3.75 µm for the membrane loudspeakers, it becomes clear that an actuator height of merely 3.75 µm/$F_p$ (i.e., 4.5 µm) is already sufficient to provide the same volume flow per active area. With an actuator thickness h of approximately 50 µm, which is easily manufacturable with the micromechanical technology, the value may already be more than 10 times higher than that of the MEMS membrane loudspeaker.

In embodiments according to the MEMS transducers 80, which are embodied without rigid plates, parasitic oscillations may be handled, or reduced, in a substantially easier manner due to the significantly reduced number of mechanical elements and mechanical connections than in variations comprising the plate elements and, possibly, further deformable elements between the deformable element and the plate element. A connection of actuators in series such as indicated in FIGS. 7b and 7c may serve for achieving larger strokes, or larger forces.

Figure 9:
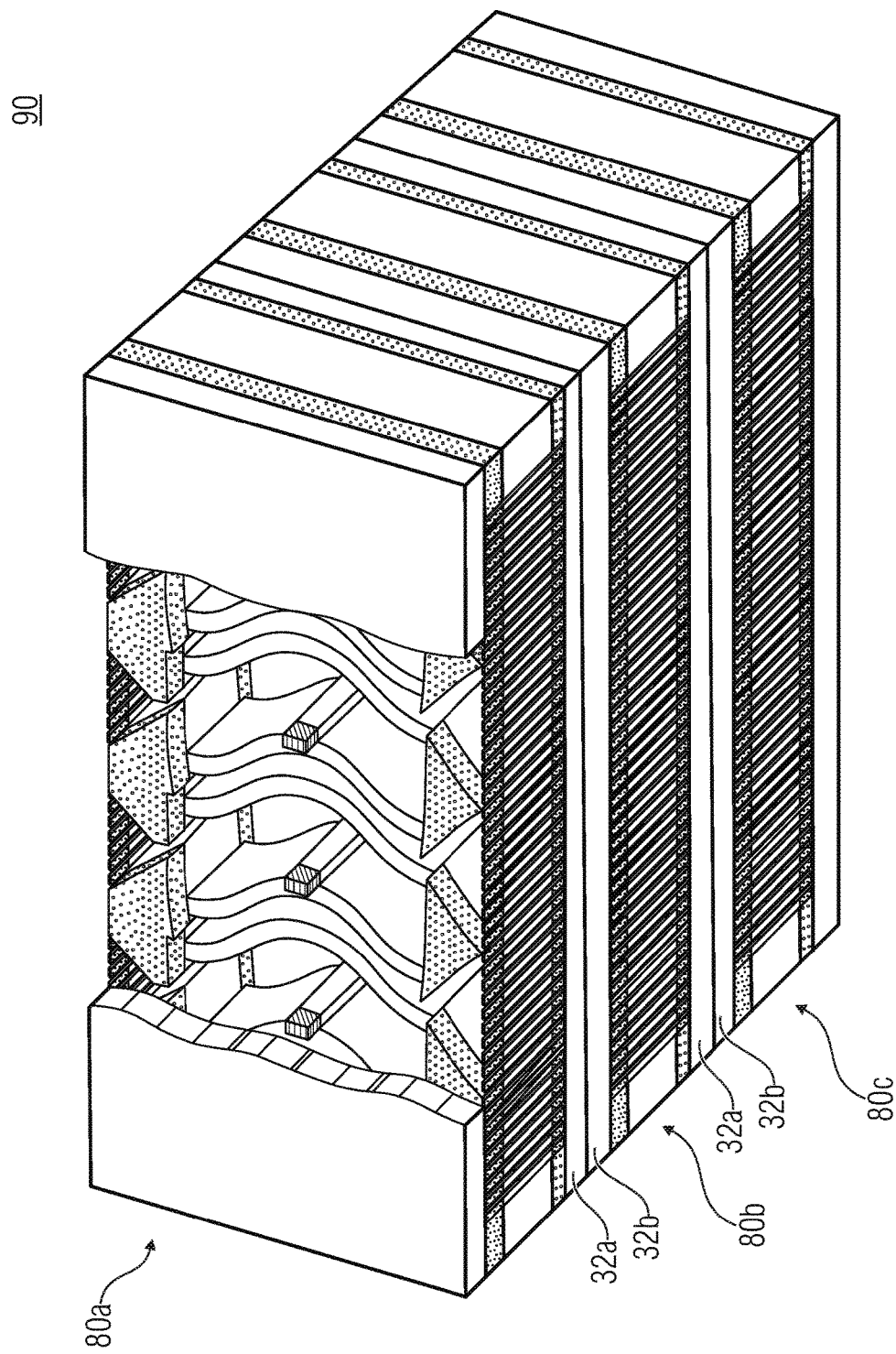
FIG. 9 shows a schematic perspective view of a stack comprising three MEMS transducers according to an embodiment.

FIG. 9 shows a schematic perspective view of a stack 90. The stack 90 includes a MEMS transducer 80a connected to further MEMS transducers 80b and 80c to the stack 90 and arranged in the stack 90. The electromechanical transducers of the MEMS transducer 80a and of a further MEMS transducer 80b and/or 80c may be driven together. This means that a volume flow, which may be generated or detected, is increased when the chip surface remains the same. Although the stack 90 is described such that the same includes the MEMS transducers 80a, 80b and 80c, alternatively or additionally, other MEMS transducers 10, 20 and/or 50 may be arranged. Although the stack 90 is described such that the same includes three MEMS transducers, the stack 90 may also include another number of MEMS transducers, such as two, four, five, six or more MEMS transducers. The cavities or subcavities of the MEMS transducers, or neighboring MEMS transducers, arranged in the stack 90, may be connected to each other. For example, the cavities or subcavities may be connected through openings in layers between individual MEMS transducers.

In other words, based on the silicon technology, discs, or chips, (MEMS transducers) may be stacked, e.g., by bonding methods so that in this case, in contrast to the classic membrane loudspeakers, a further increase of the volume flow may result. When using technologies for thinning the individual discs, or chips, before the stacking, the stack height may be kept low. For example, such a technology may include an etching process and/or a grinding process.

A reduction of a layer thickness of the layers 32a and/or 32b arranged adjacent to each other may be carried out to an extent that one or even both of these layers are removed. Alternatively or additionally, a manufacturing process may be carried out for decreasing the stack height such that certain lower or upper caps (layers 32a and 32b, respectively) are omitted. For example, the stack 90 could be formed such that the MEMS transducer 80b and/or 80c is embodied without a layer 32b.

Figure 10:
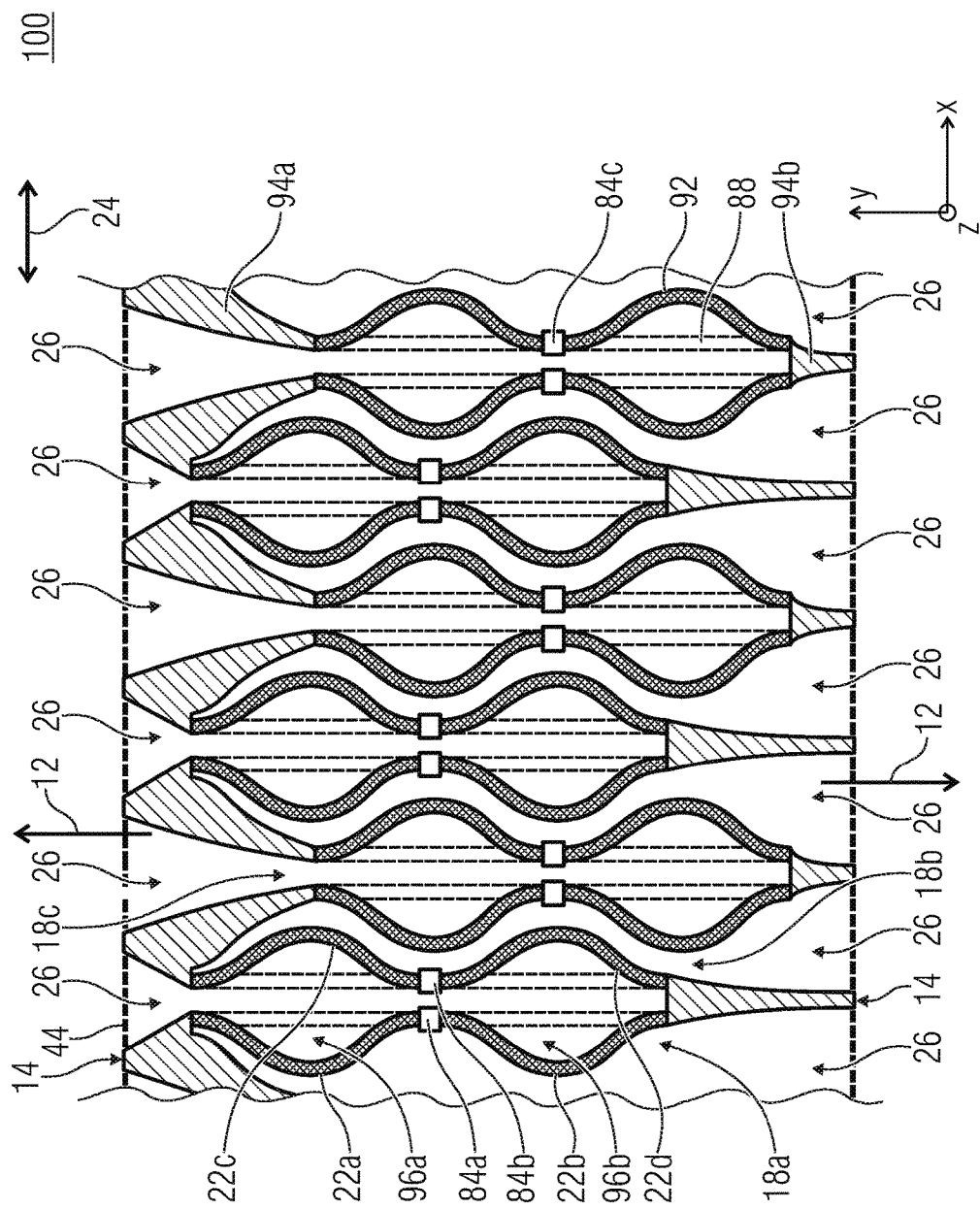
FIG. 10 shows a schematic perspective top view of a section of a MEMS transducer, in which deformable elements are arranged between sides of the substrate, according to an embodiment.

FIG. 10 shows a schematic perspective top view of a section of a MEMS transducer 100, in which deformable elements 22a-d are arranged between sides of the substrate 14. The deformable elements 22a and 22b are indirectly connected via the anchor element 84a. This means that ends of the deformable elements 22a and 22b max be fixedly connected to the substrate, possibly with the anchor element 84a, and therefore (fixedly) clamped. This means that the deformable elements 22a-d or other deformable elements according to further embodiments may comprise a bar structure. The bar structure may be fixedly clamped at a first and a second end. Clamping of ends of a deformable element 22a-d, or a bar structure, enables reducing or significantly reducing a pre-deflection of the deformable elements (e.g., due to layer tensions gradients). Thus, the slits between the caps and the actuators may be a lot smaller, which has significant advantages in efficiency for some applications.

For example, the deformable elements 22a-d are fixedly clamped on two sides, respectively. A fixed clamping may be obtained by means of an arrangement or generation of deformable elements 22a and/or 22b at the substrate 14 and/or at an anchor element 84a and 84b, respectively. Dotted lines 88 indicate a non-deflected state, while solid bars 92 indicate a deflected shape of the deformable elements 22a-d. Forms or elements 94a and 94b of the substrate 14 may enable a positioning of the deformable elements 22a-d along the y-direction. A position of electromechanical transducers 18a-c in pairs may be displaced based on the elements 94a and 94b. Electromechanical transducers 18a and 18b arranged adjacent and/or in pairs may be deformable opposite to each other.

The deformable element 22a and, possibly, an opposite deformable element 22c may be configured to affect, i.e. to increase or decrease in size, a subcavity portion 96a based on the deformation, or to execute a deformation in the subcavity portion 96a based on the volume flow. The deformable element 22b and, possibly, the oppositely arranged deformable element 22d may be configured to affect a subcavity portion 96b. The subcavity portions 96a and 96b may be connected to each other, e.g., in a region of the anchor elements 84a and 84b. The deformation of the deformable elements 22a-d may be obtained such that the deformable elements 22a and 22c, and 22b and 22d, respectively, are deformed with a frequency different from each other, i.e., a volume change in the subcavity portion 96a may occur with a frequency which is different from a frequency with which a volume of the subcavity portion 96b is changed. For example, if the MEMS transducer is used as a loudspeaker, different frequencies may be obtained in the subcavity portions based on the volume change different in frequency. If the MEMS transducer 100 is used as a microphone, the subcavity portions 96a and 96b may, e.g., comprise resonance frequencies different from each other. Alternatively, further subcavity portions and further deformable elements may be arranged along the y-direction so that the MEMS transducer 100 may, e.g., generate further frequencies or further resonance frequencies.

Alternatively, the deformable elements 22a and 22b or the deformable elements 22c and 22d may also be directly connected to each other. For example, anchor elements may be arranged in a center region of one or several deformable elements 22a-d in order to affect the deformation of the deformable elements 22a-d. This means that the deformable elements 22a and 22b may be directly connected to each other. Alternatively, a spring element or another element may also be arranged between the deformable elements 22a and 22b.

The MEMS transducer 100 may be embodied such that, in a first time interval, the volume flow 12 is obtained in a positive y-direction from openings 26, and subsequently, in a second time interval, the volume flow 12 is obtained in a negative y-direction from openings 26.

In other words, FIG. 10 shows a configuration, in which, possibly exclusively, S-shaped actuators are arranged. In order to highlight the principle, the S-shaped actuators may be illustrated in the illustration to be actuated (solid lines 92) and non-actuated (dotted lines 88). The actuated and non-actuated states may also be exchangeable by designing the same accordingly. The S-shaped actuators (deformable elements 22a-d) may each be clamped at one (upper) end and another (lower) end. For this, the anchor elements 84a-b may be used. The anchor elements 84a-b may be formed of the layers 34a, 36 and 34b and may be connected with a layer 32a and/or 32b. Distances between the free ends of the S-shaped actuators and elements 94a or 94b may be omitted based on this configuration. This may enable lower circumflow losses. A base substrate may be processed such that the actuators may be manufactured from the same, wherein the base substrate may comprise layer tension gradients, or layer tension gradients may be introduced during manufacturing the actuators. A deflection of the deformable elements induced by this may be reduced or prevented based on the arrangement of the anchor elements 84a and/or 84b. In particular, the suspension of the deformable elements on two sides may lead to a decrease or prevention of a deflection of the same in the direction of one of the layers 32a or 32b. Accordingly, the spacer layers 34a and/or 34b may be thinner, which may also cause a reduction of the flow losses. Each chamber (subcavity portion 96a or 96b) may be limited by two S-shaped actuators. In the example of FIG. 10, two chambers may be connected in series. The number of chambers connected in series may be selected based on an area provided on the chip under consideration of their acoustic characteristics, in particular of the resonance frequency of the S-shaped actuators or the actuator-chamber system, and may vary between 1 and a large number, e.g. more than 3, more than 5 or more than 10.

The elements 94a and 94b may be optionally arranged, i.e., the MEMS transducer 100 may also be embodied without these elements. If, e.g., due to a special design or drive of the electromechanical transducers and/or the deformable elements, a corresponding part of the actuator is not deflected, a spacing from the substrate 14 by means of the elements 94a or 94b may be omitted. A multi-S-actuator (wave-shaped actuator) may be embodied. In particular, this enables obtaining low resonance frequencies based on this arrangement since a resonance frequency of the bar (deformable element) may decrease with an increasing length.

Figure 11A:
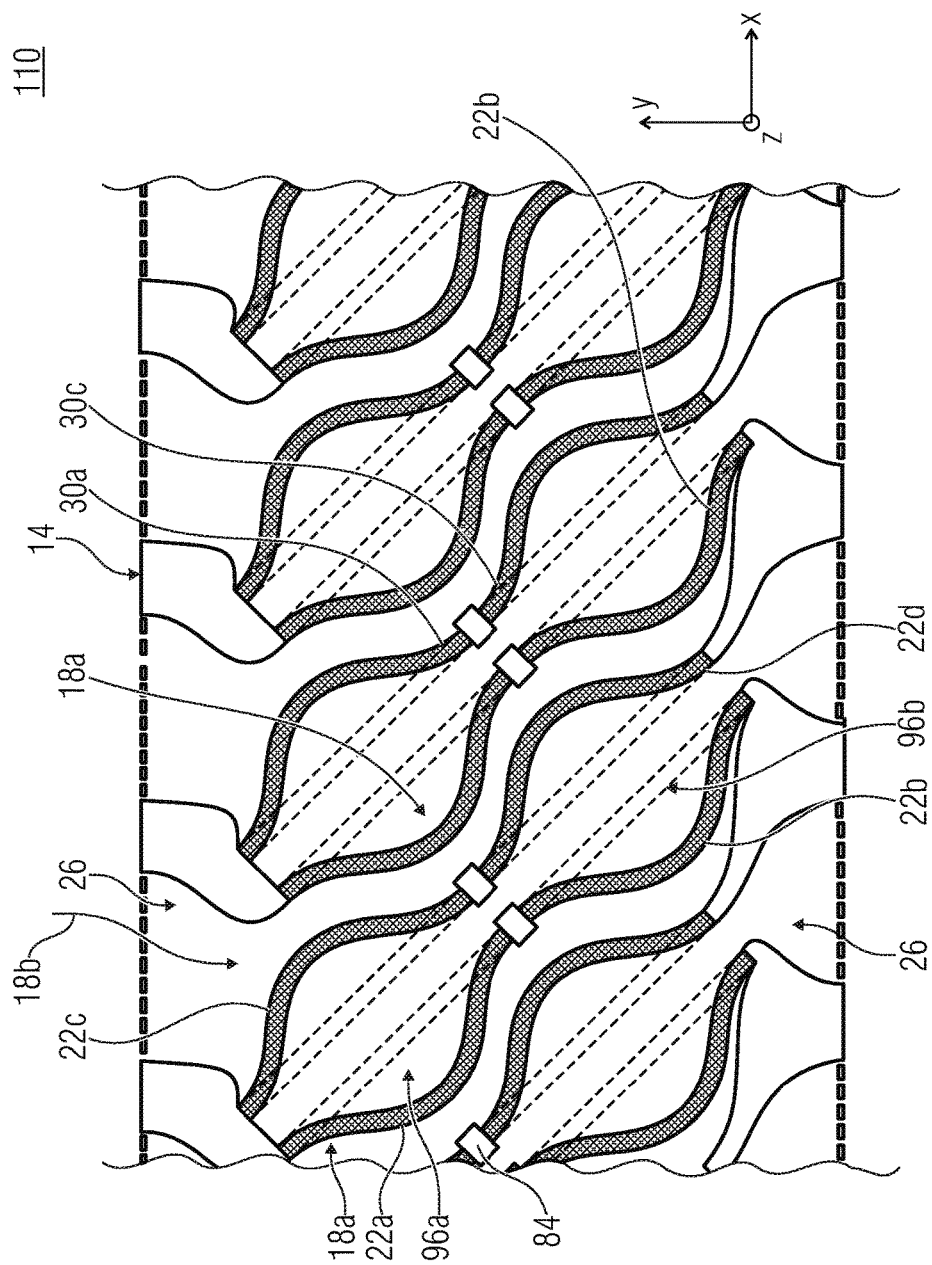
FIG. 11a shows a schematic top view of a section of a MEMS transducer, in which the electromechanical transducers are obliquely arranged with respect to a lateral direction of the substrate, according to an embodiment.

FIG. 11a shows a schematic top view of a section of a MEMS converter 110, in which the electromechanical transducers 18a-b, compared to the configuration of FIG. 10, are arranged obliquely with respect to a lateral direction of the substrate 14, e.g., the x-direction. With an extension along the y-direction which is the same compared to the MEMS transducer 100, the electromechanical transducers 18a-b comprise a longer axial extension. This may enable larger subcavity portions 96a and/or 96b and/or a higher number of subcavity portions, or deformable elements, connected in series.

An outer bar segment 30a of a deformable element may be indirectly connected to an outer bar segment 30c of a further deformable element via the anchor element 84. Alternatively, the bar segments 30a and 30c may also be directly connected to each other.

In other words, FIG. 11a shows a further embodiment, in which the active area, compared to the discussions of FIG. 10, is rotated by 45°, wherein the available chip surface is possibly usable to a higher extent. Funnel-shaped openings 26 may be designed such that the sound may be advantageously emitted perpendicular to the chip edge surface, i.e., along the y-direction in a positive or negative direction to this.

Each of the above-described deformable elements may also be formed as a multitude of interconnected deformable elements.

Figure 11B:
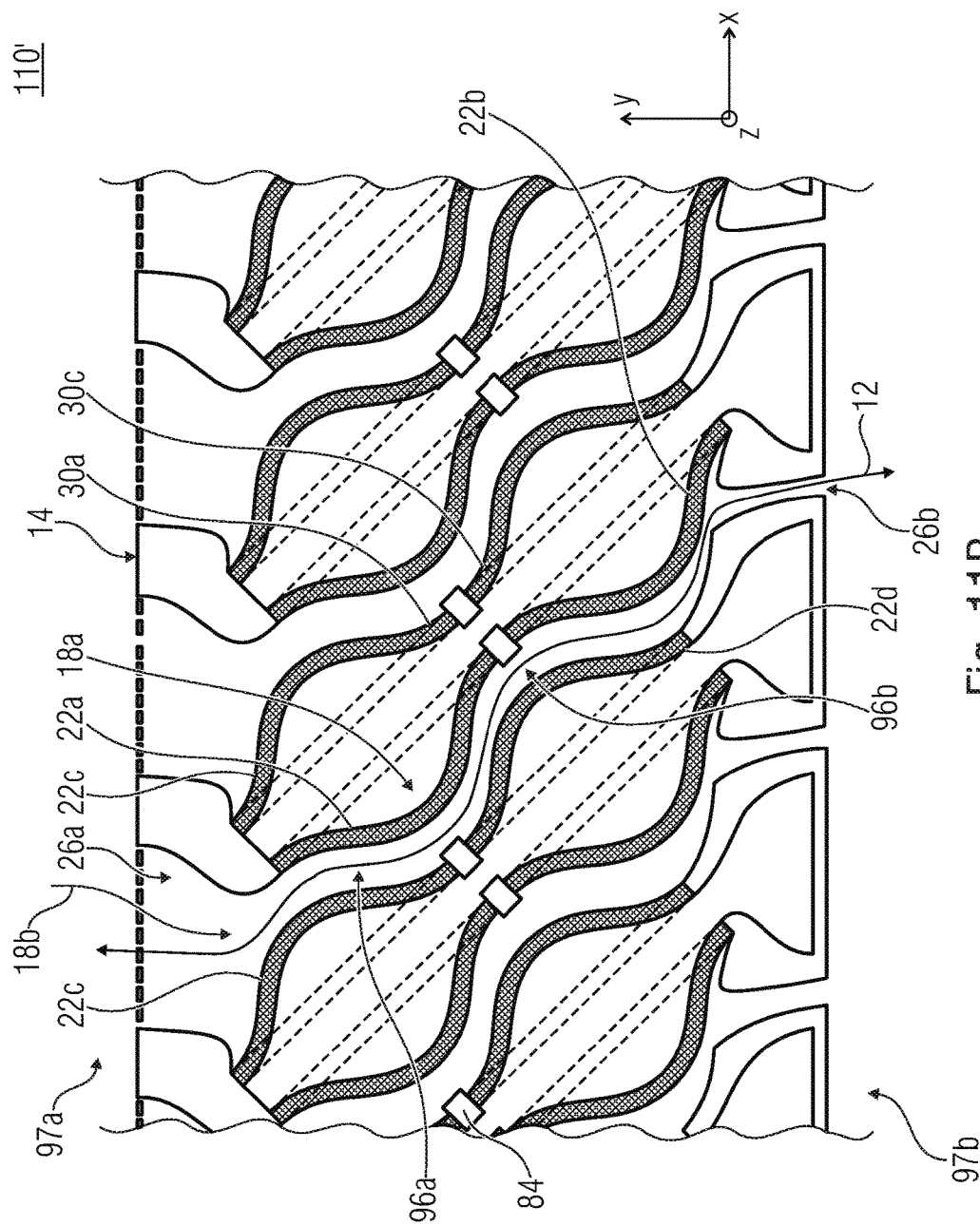
FIG. 11b shows a schematic top view of a section of a MEMS transducer which may be used as a pump according to an embodiment.

FIG. 11b shows a schematic top view of a section of a MEMS transducer 110' usable, e.g., as a pump. Compared to the MEMS transducer 110 of FIG. 11a, the subcavity portions 96a and 96b may be connected to a surrounding area of the MEMS transducer 110' via two openings 26a and 26b. The subcavity portions 96a and 96b may be connected to a first side 97a of the MEMS transducer 110' via the opening 26a and with a second side 97b of the MEMS transducer 110' via the opening 26b. For example, the first side 97a and the second side 97b may be arranged opposite to each other. Alternatively, the sides 97a and 97b may also comprise an angle towards each other. For example, one of the sides 97a or 97b may comprise a side surface of the MEMS transducer 110' and the other side 97b or 97a may include a main side (e.g., an upper or lower side) of the MEMS transducer 110'.

The fluid flow may be generated from the first side 97a to the second side 97b or vice versa through the MEMS transducer 110' based on a deformation of the deformable elements 22a-d. For example, the deformable elements 22a and 22c may be deformed in a first time interval and the volume of the subcavity portion 96a may be decreased. In a second time interval, the volume of the subcavity portion 96b may be decreased. Based on an order of the decrease or the increase in size of the volumes, a direction of the volume flow 12 may be affected. Alternatively, several subcavity portions may be arranged successively or solely one subcavity portion may be arranged.

Simply put, the function of a pump may be obtained by generating the volume flow 12, instead of in a reciprocating manner analogously to a loudspeaker, according to a flow principle through the MEMS transducer. An entry side and an exit side of the MEMS transducer may be arranged opposite to each other, but may alternatively also comprise an angle to each other or be locally or fluidically spaced from each other at the same location. The cavity including the subcavity portions 96a and 96b may comprise the openings 26a and 26b in the substrate. At least one of the electromechanical transducers 18a or 18b may be configured to provide the volume flow 12 based on the fluid. For example, at least one of the electromechanical transducers 18a or 18b may be configured to convey the fluid through the first opening 26a towards the cavity based on an actuation of the electromechanical transducer, or to convey the fluid through the second opening 26b in a direction away from the cavity based on the actuation or vice versa.

Although a pump function is described in connection with the MEMS transducer 110', other embodiments described herein may be used as a pump or micro-pump, e.g., by adapting an arrangement of openings of the cavity, subcavity or at least subcavity portion.

When simultaneously deflecting the deformable elements 22a and 22e, a negative pressure (alternatively a positive pressure) counteracting the deformation or deflection may result in a volume positioned therebetween. The volume may comprise an opening, e.g., in the layer 32a and/or 32b so that a pressure compensation is enabled in this volume. This enables an efficient operation of the MEMS transducer 110'.

Figures 12A, 12B:
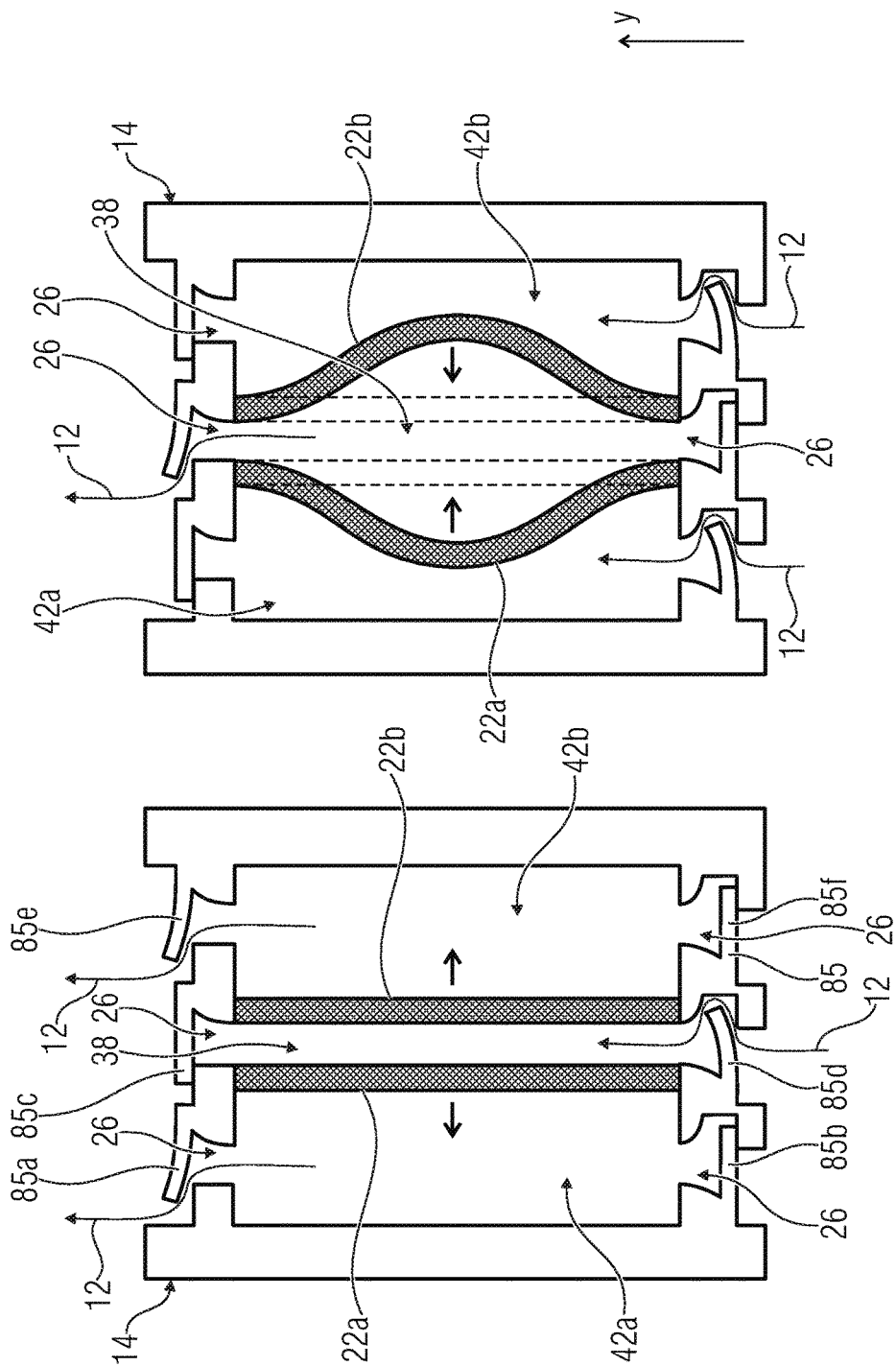
FIG. 12a shows a schematic top view of a section of a MEMS transducer in a first state, which may, e.g., be used as a MEMS pump.
FIG. 12b shows the MEMS transducer of FIG. 12a in a second state.

FIG. 12a shows a schematic view of a MEMS transducer 120 in a first state, e.g., usable as a MEMS pump. For example, the MEMS transducer 120 comprises two deformable elements 22a and 22b comprising a bar structure and being clamped at the substrate 14 or fixedly clamped. Alternatively, the MEMS transducer 120 may also be embodied with a deformable element or with more than two deformable elements.

FIG. 12b shows the MEMS transducer 120 in a second state. Starting from the first state, as illustrated in FIG. 12a, the second state may be obtained based on a deformation of at least one deformable element 22a and/or 22b. Starting from the second state, the first state may be obtained based on a restoration of the one or several deformable elements. For example, compared to the first state, the subcavity 38 is enlarged between the deformable elements 22a and 22b in the second state. During a transition from the first to the second state, a negative pressure may arise in the subcavity 38. During a transition from the second state to the first state, a negative pressure may arise in the subcavity 38.

Subcavities 42a and 42b, whose volumes may be decreased and increased, respectively, complementary to the volume of the subcavity 38, are arranged between a deformable element 22a and 22b, respectively, and the substrate 14, wherein a positive pressure and a negative pressure, respectively, may also be obtained complementary to the subcavity 38 based on the deformation of the deformable elements.

A valve structure 85a-f may be arranged in a region of a respective opening 26. For example, one or several valve structures 85a-f may be formed of a material of the substrate 14. The valve structures may be integrally formed with one or several layers of the substrate 14 and may be generated, e.g., by means of an etching process.

The valve structures may be configured to inhibit, i.e., to reduce or to hinder, a passage of the volume flow 12 through the opening 26 at least along one direction. For example, the valve structures 85b, 85d and 85f may be configured to reduce or to hinder an exit of the fluid from the respective subcavity. Alternatively or additionally, the valve structures 85a, 85c and 85e may be configured to reduce or to hinder an entry of the fluid into the respective subcavity. One or several valve structures 85a-f may be configured to be passive, e.g., as a bending bar structure clamped on one side or as a tongue structure. Alternatively or additionally, one or several valve structures 85a-f may be configured to be active, e.g., as an electromechanical transducer or deformable element. Simply put, the valve structures 85a-f may be actuated like the other actuators (electromechanical transducer) of the MEMS transducer.

For example, the valve structure 85d may be configured to allow the volume flow 12 to flow into the subcavity 38 based on a negative pressure in the subcavity 38, while the valve structure 85c simultaneously reduces or hinders an entry of the volume flow 12 into the subcavity 38. If a positive pressure occurs in the subcavity 38, as shown in FIG. 12b, the valve structure 85c may be configured to allow the volume flow 12 to flow out of the subcavity 38 based on the positive pressure, while the valve structure 85d simultaneously reduces or hinders an exit of the volume flow 12 from the subcavity 38.

A function of the valve structures 85a, 85b, and 85e and 85f, respectively, may be the same or comparable with respect to the subcavities 42a and 42b, respectively. The valve structures 85a-f may also be referred to as check valves and allow, e.g., an adaptation of an advantageous direction of the volume flow 12.

Although the MEMS transducer is described such that, e.g., the volume flow flows out of the subcavities 38, 42a and 42b along the same direction (position y-direction) and during different time intervals during which a transition between the first and the second state occurs, the valve structures may also be arranged such that the volume flow flows out of at least one subcavity 38, 42a or 42b along another direction, e.g., the negative y-direction.

Although the MEMS transducer is described such that the valve structures 85a-f are arranged at each opening 26, alternatively, valve structures may be arranged at no or solely at some openings 26.

Although the valve structures may be configured to be passive for a function as a check valve, the valve structures may also be formed to be active, which means that they may be driven and may provide an open or closed state of the valve in the sense of actuators based on the drive. In particular, two valve structures 85a and 85b, 85c and 85d, or 85e and 85f, each associated to a subcavity, may be driven such that pressure pulses occur in the fluid flow 12, e.g., by a control means connected to the MEMS transducer. For example, an actuation of the electromechanical transducers 18 may occur such that a positive or negative pressure arises in the fluid inside of the subcavities 42a, 42b, and only then, an opening of the valve structures 85a-f is driven.

In other words, with such pressure pulses, an approximate reproduction of a low-frequency sound wave may also be achieved by short pressure pulses. This may take place in a nearly continuous manner by several chambers successively arranged in series. Similarly, this is also possible with chambers arranged in parallel next to each other. FIG. 12a shows an example in the non-actuated state in which each chamber is provided with a respective valve on the upper side and lower side, which may be formed to be active. Each valve may be individually opened or closed. Also, a partial opening/closing is conceivable. The valve bars may be designed, or operated, in the same way as the movable sidewalls, i.e., the deformable elements. Thus, they may be based on the same or a similar actuator principle. In this case, the valve bending bars may also be configured such that they are movable in both directions, or that they close the opening (by a corresponding counter-force to be applied by the bending-actuator valve) upon a fluid flow (besides a very small slit for the movement). With this structure, full flexibility is given for controlling the fluid flow with respect to the direction, or positive/negative pressure, individually for each chamber. If the direction for the fluid flow is clear, stops for the valve bars may also be used ("check valve").

In even other words, the central chamber (subcavity 38) may be expanded in the first state by the two actuators (deformable elements 22a and 22b) indicated in a dark color, while the two outer chambers (subcavities 42a and 42b) are compressed. The first chamber is filled with the fluid of the lower region via the check valve 85d. The latter pushes fluid into the upper region through the check valve 85a or 85e. In the second state, the central chamber is compressed. Fluid is pushed into the upper region. The outer chambers are filled with fluid from the lower region.

Figure 13:
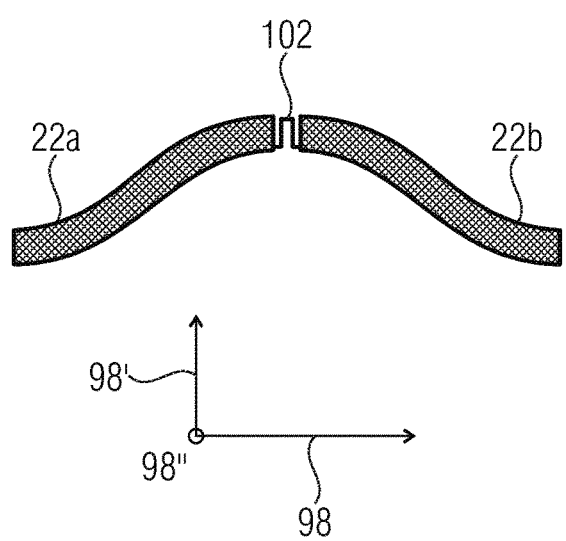
FIG. 13 is a schematic view of two deformable elements connected along a lateral extension direction according to an embodiment.

FIG. 13 shows a schematic view of a first deformable element 22a and a second deformable element 22b connected along a lateral extension direction 98 of the deformable elements 22a and/or 22b. A spring element 102 is arranged between the deformable element 22a and the deformable element 22b. The spring element 102 may cause reduced mechanically induced restoring forces in the deformable elements 22a and 22b. For example, the spring element 102 may comprise a low rigidity in a direction 98' arranged perpendicular to the direction 98, and may comprise a high rigidity along a direction 98'' which may be arranged perpendicular to the directions 98 and 98' in the space. For example, the deformable elements 22a and 22b and the spring element 102 may be arranged as the deformable element 22a in the MEMS transducer 110.

In other words, suitable spring elements 102 may be arranged for tensile relief of the S-shaped actuators 22a-d clamped at two sides at clamping locations or, e.g., also in a region between clamping locations, e.g., centrally, of the actuators. For example, the spring element 102 is inserted in the center of the actuators and is especially flexible in the desired direction (98') and is rigid in the two directions (98 and 98''), i.e., it comprises a high or higher rigidity. The spring element 102 may be arranged between deflectable ends of the deformable elements 22a and 22b. The spring element 102 may comprise a lower rigidity along the lateral movement direction 24 than in a direction perpendicular to the lateral movement direction 24.

Figure 14:
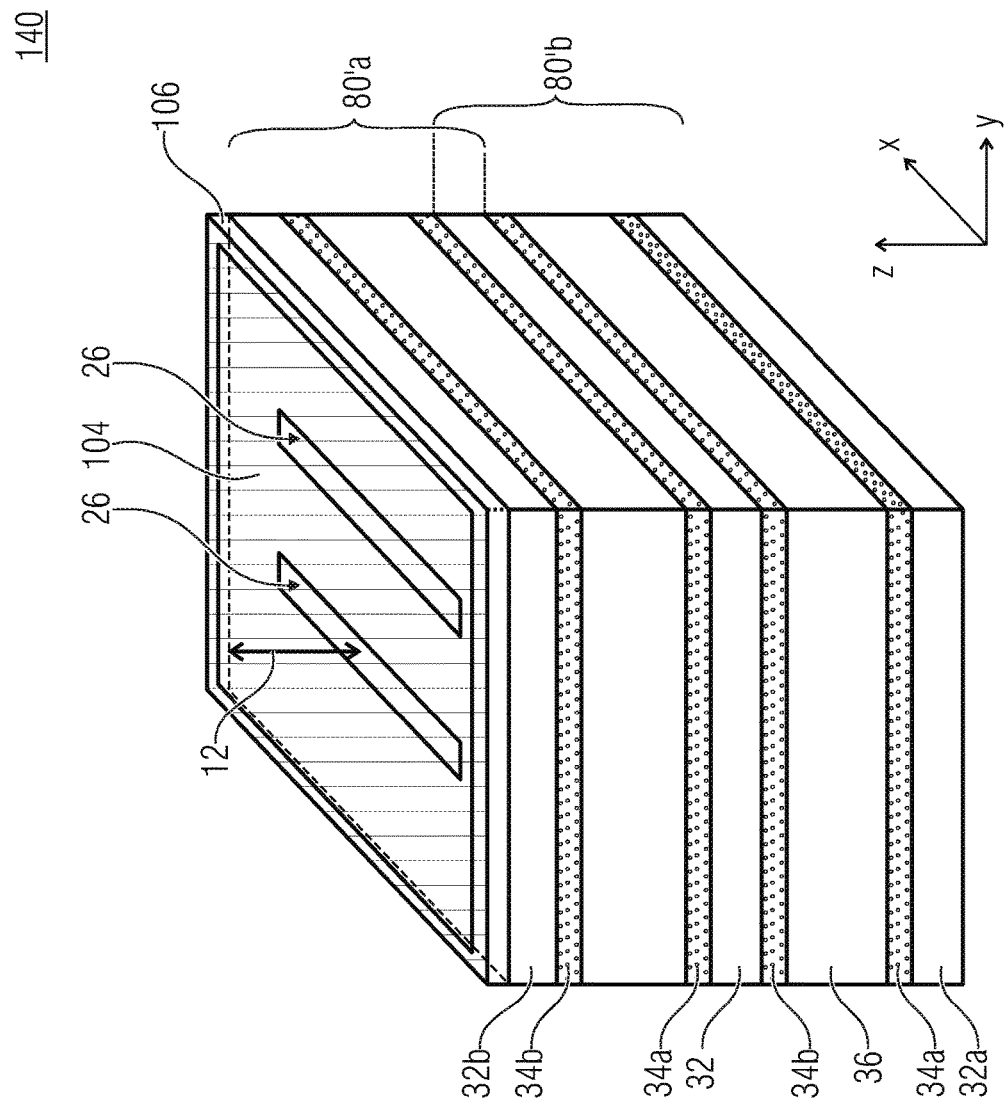
FIG. 14 is a schematic view of a stack including two MEMS transducers connected to each other and comprising a mutual layer according to an embodiment.

FIG. 14 shows a schematic view of a stack 140 including a MEMS transducer 80'a and a MEMS transducer 80'b connected to each other and, compared to the MEMS transducer 80, comprising a mutual layer 32, which means that a layer 32a or 32b of the MEMS transducer 80 is removed.

Furthermore, the MEMS transducer 80'a comprises the openings 26 in the layer 32b, which means, compared to the MEMS transducer 80, an emitting direction of the volume flow 12, or a penetration direction of the volume flow 12, is perpendicularly inclined. This means that a cap surface of the MEMS transducer may form an outside of the stack, wherein the MEMS transducer may comprise an opening in the cap surface which is arranged facing away from a side facing the second MEMS transducer, wherein the volume flow 12 of the MEMS transducer 80'a enters into or exits from the cavity perpendicular or opposite to the volume flow of the MEMS transducer 80'b.

A membrane element 104 may be arranged at the MEMS transducer 80'a. The membrane element 104 may be arranged such that an exit of the volume flow 12 from the cavity and through the membrane element 104 or an entry of the volume flow 12 into the cavity 16 is at least partially prevented. The cavity may extend to regions which are arranged outside of the MEMS transducer 80'a and which are arranged between the MEMS transducer 80'a and the membrane element 104. A deflection of the membrane element 104 may be caused based on the volume flow 12. For example, the membrane element 104 may be arranged by means of a frame structure 106 at the MEMS transducer 80'a. The frame structure 106 may be arranged at a side of the MEMS transducer 80'a, e.g., at a main side of the layer 32b.

Alternatively, an inclination by an angle different from 90° may be embodied. The MEMS transducer 80'b may comprise openings at or in the layer 32b so that the volume flow 12 may enter into or exit from cavities at two sides of the stack 140, wherein the sides are arranged opposite to each other.

Alternatively or additionally, the stack 140 may comprise a further or a different MEMS transducer, e.g., the MEMS transducer 20 or 80. For example, the MEMS transducer 20 may be arranged between the MEMS transducers 80'a and 80'b. This enables an entry or exit of the volume flow 12 into or out of cavities along a direction perpendicular to a corresponding direction of the MEMS transducer 80'a.

In other words, sound exit openings 26 may also be attached in the lower cap 32a and/or in the upper cap 32b instead of at the chip side surfaces. FIG. 14 shows a corresponding simplified illustration. The openings 26 in the upper cap 32b may be recognized. Similar openings may be located in the lower cap 32a, however, the same may not be recognized based on the perspective view. The layer 32 may also comprise openings, which means that cavities, subcavities and/or subcavity portions of the MEMS transducers 80'a and 80'b may be connected to each other. Chambers lying vertically on top of each other (along the z-direction) may be connected to each other via the openings in the layer 32.

A grid including one or several bar elements (grid ridges) 44 which may be configured for adapting the attenuation and, in particular, as a protection from particles may also be easily realized in the variation described in FIG. 14. For example, the openings 26 in the upper cap 32b and the lower cap 32a may be configured by a wet chemical or dry chemical etching process. Before the etching, the desired grid may be structured in an additionally applied thin layer comprising a suitably high selectivity compared to the etching of the openings. For etching the openings 26, an etching method having a suitably high isotropy, or lateral under-etching, may now be selected so that the under-etching of the grid ridges 44 may occur. For example, the grid may be manufactured in a silicon oxide layer or nitride layer and the caps may be manufactured from silicon, which may then be structured by means of deep reactive ion etching (DRIE). This process may be adapted such that under-etchings in the range of micrometers are achievable. Alternatively, for example, wet chemical etching with tetramethylammonium hydroxide (TMAH) and/or potassium hydroxide (KOH) or nitric acid (HNA) may be carried out.

When accordingly designing the openings in the lower cap 32a and in the upper cap 32b in a funnel-shaped manner, the sound exit area may include a larger percentage of the chip area and, possibly, compared to MEMS transducers comprising an exit at a side surface such as the MEMS transducer 80, be designed to be larger. With respect to the acoustic characteristics and with respect to attenuation, this option offers a wider scope of design. A combination of sound exit openings in the caps 32a and 32b and at the side surfaces between the cap surfaces 32a and 32b is a feature of further embodiments. A advantageous variation for highly-integrated systems may include attaching openings in the cap 32b in order to emit the sound upwards, and attaching pressure compensation openings at the side in order to be able to apply the device in a simple manner, e.g., on a printed circuit board.

In general, the sound entry openings and/or sound exit openings 26 may be designed such that the acoustic characteristics and/or the attenuation characteristics may be selectively adapted. In principle, the lower and/or upper layers 32a and 32b may also be able to oscillate. The oscillation of these elements may be suppressed, or reduced, by suitable additional connection elements in the intervening layers 34a and 34b, and 36, respectively, e.g., by the anchor elements 84. The suppression or reduction may include displacing the oscillation in a frequency region which is out of the auditory sound. Alternatively or additionally, the oscillation of the layers 32a and/or 32b may be selectively implemented for optimizing the acoustic emission, wherein selective connections in the layers may also be used and, additionally, the rigidity, or the acoustic characteristics, of the layers 32a and 32b may be adapted by a corresponding structuring (continuous openings or blind holes).

Furthermore, it is possible to apply a membrane onto the upper cap 32b, which is then excited to a oscillation by the volume flow 12 of the chambers. This is schematically indicated by the dotted line 104. In a simple case, a spacer 106 may be arranged in the form of a frame on the upper cap 32b, at which the membrane 104 is arranged or stretched. Manufacturing such a membrane 104 may be carried out with known micromechanical processes. Alternatively, the membrane 104 may also be arranged in the interior of the cavity or subcavity and/or only cover one or a portion of the openings 26.

For some of the above-described embodiments of the MEMS transducers (e.g., MEMS loudspeaker devices), it may apply that there are chambers which may generate a sub-volume flow independently from some, several or other chambers, e.g., in subcavities or subcavity portions. Chambers may be realized consisting of sub-chambers connected in a lateral and/or vertical direction (lateral, cf., e.g., FIGS. 10 and 11) (vertical, cf., e.g., FIG. 14), while embodiments also show a combination thereof. Such connected sub-chambers (e.g., the subcavity portions 94a and 94b) may be used to generate a sub-volume flow which is independent of or dependent on other chambers. A case in which a chamber (subcavity) may generate a volume flow independently from each other may be referred to as monochamber. A chamber which may generate a volume flow based on several sub-chambers (subcavity portions) may be referred to as composite chamber.

Above-described embodiments may be modified such that both types of chambers may be combined in any way. Thus, embodiments are possible in which solely monochambers or solely composite chambers are arranged. Alternatively, embodiments may be realized in which both chamber types are arranged.

In other words, when using monochambers only, the resonance frequencies of all actuator-chamber systems may be identical or may be designed to be different. In this way, e.g., certain frequency regions may be highlighted in the sound emission by an increased number of corresponding monochambers. In particular, by a corresponding distribution of the resonance frequencies and the width of the resonance curves via the attenuation, e.g., by dimensioning the grid openings or, in general the sound exit openings and/or the flow channels, a design of the frequency course (sound pressure level as a function of the frequency) may be achieved. Above all, smoothing the frequency course plays an essential role in this.

Based on extensions of the volumes in the space, a geometry of the electromechanical transducers and/or a frequency with which the electromechanical transducers are operated, subcavities and/or subcavity portions may emit the volume flow with a different frequency and/or be optimized to the detection of certain frequencies of the volume flow.

In a further embodiment, only monochambers are used. The sound exit openings may only be arranged at the side. Three chips/discs (MEMS transducers) may be stacked on top of each other. The upper chip may be optimized for a sound emission in a first (e.g., high) frequency range. A second, e.g., central, MEMS transducer may be adapted to a second frequency region (e.g., middle frequencies). A third MEMS transducer may be adapted for a third frequency region, e.g., for low frequencies. With this, a three-way loudspeaker may be obtained. The arrangement of the three channels (three MEMS transducers) may also occur in a chip by laterally using a first number $N_1$ of chambers for the high frequencies, a second number $N_2$ of chambers for middle frequencies and a third number $N_3$ for low frequencies. This principle is easily extendable for an N-way system in a lateral direction and, with stacking, also in a vertical direction. In a further embodiment, an N-way system is designed such that the sound is generated by Fourier synthesis of the corresponding harmonics with the frequencies $N*f_1$ wherein $f_1$ represents the lowest frequency.

This means that a MEMS transducer may be arranged with at least one further MEMS transducer to a stack, wherein a stack may be obtained, e.g., by arranging at least two MEMS transducers along a lateral direction (such as the x direction) and/or a thickness direction (such as the z direction). Alternatively, the MEMS transducers may also be arranged spaced apart from each other. The cavity of the MEMS transducer and the cavity of the at least one further (second) MEMS transducer may comprise resonance frequencies different from each other.

In an actuation operation, i.e., the deformable elements are actively deformed, an N-way loudspeaker may be obtained, wherein N refers to a number of MEMS transducers with resonance frequencies different from each other. In a sensor operation, e.g., frequency ranges of the volume flow which are different from each other may be detected with different MEMS transducers. For example, this enables a Fourier synthesis of the volume flow. For example, the control device 128 may be configured to detect the formation of the deformable elements of one or several of the electromechanical transducers of the MEMS transducer and the further MEMS transducer. The control device may be configured to compute a Fourier synthesis (Fourier analysis) based on the electric signals, and to output a result.

The above-illustrated examples using monochambers may also be realized using composite chambers, wherein the individual subchambers of a composite chamber comprise identical resonance frequencies.

When using composite chambers, the connected subchambers may also support different frequencies due to the corresponding location of the resonance maximums. Thus, e.g., three subchambers may represent a three-way system. For example, the air flow modulated in a low-frequency manner in the rear subchamber (first portion along an axial extension) would additionally undergo a mid-frequency modulation in the mid-subchamber (second portion along an axial extension) and a high-frequency modulation in the front part of the chamber (third portion along an axial extension).

A stroke, i.e., a deflection of the electromechanical transducers, may be lower at high frequencies than at low frequencies to generate the same sound pressure. Thus, the chambers or subchambers used for high frequencies may be designed with lower chamber volumes, or a lower distance of the actuator sidewalls limiting the chambers.

During operation, a phase shift may be inserted between chambers of the same frequency by the drive, so that the wave front is inclined and does not exit perpendicular to the surface (phased array).

In all variations presented above and in the following, each chamber is surrounded by at least one second chamber in which air flows in for the pressure compensation when air flows into the first chamber or vice versa. In particular, this is obvious when there are no separating walls between these chambers since an actuator increases the volume of the one chamber upon its movement and simultaneously decreases the volume of the other chamber, or vice versa.

For example, for the use as a loudspeaker in hearing aids or in-ear headphones, the outside air (i.e., outside of the ear) is often not moved by the loudspeaker. Rather, the volume in the ear channel is periodically varied solely by the oscillation, e.g., of a membrane. This may occur in all variations illustrated and presented in the following by keeping the corresponding openings closed, which are located on a upper side of the chip, a lower side of the chip or a side surface of the chip in the illustrated variations. For this, structuring the bar grids has to be omitted at these locations.

In general and for all loudspeaker application fields, bar grids may be replaced at certain locations or entirely by a closed membrane. With this, the particle sensitivity is reduced in a maximum manner, and the operation is enabled, in particular in contaminated or corrosive gasses and liquids.

In the following, measures with respect to design and operation of the bending actuators are presented, which have the object to be able to illustrate the desired frequency response as well as possible.

By incorporating several additional spring elements, which divide the bending actuator in individual elements, the effective rigidity of the actuators and, thus, the resonance frequency may be decreased. For example, reference is made to FIG. 15, in which an individual spring element has been used to divide the bending actuator in two elements. The division into two or more elements is important for achieving a resonance frequency in the low-frequency range of the auditory sound since the bending actuators comprise natural frequencies in the kHz range without such a measure at usual dimensions of the bending actuators (e.g., width: 5 µm, length: 2 mm, material silicon). Alternatively or additionally, an additional mass element may be selectively provided at the bending actuator or also at the, possibly present, rigid plate, in order to reduce resonance frequency. Such an element may be simply provided when structuring the layer 36. The mode of operation of an additional mass Δm may be explained using a model of the harmonic oscillator.

The oscillation amplitude $A(\omega)$ of an element of the mass m, which is suspended via a spring of the rigidity k at a sinus-shaped excitation with a force of the amplitude $F_0$ is given as:

$$A(\omega) = \frac{F_0}{m} \frac{1}{\sqrt{(\omega - \omega_0^2)^2 + \left(\frac{c}{m}\omega\right)^2}} \quad \text{(Eq. 3)}$$

In this case, $\omega$ is the angular frequency of the excitation and c is the attenuation constant. If the resonator is operated in the quasi-static range, the amplitude is independent from the mass. For $\omega 140 \omega_0$, the following applies:

$$A(\omega) \approx F_0/k \quad \text{(Eq. 4)}$$

Thus, an additional mass Δm changes the natural frequency $\omega_0$ to the lowest value $\omega_{0-}$, however, the amplitude of the oscillation remains unchanged. The situation looks different when the bending actuator is operated in the range of its natural frequency. For $\omega \approx \omega_0$, the first term in the root of equation 3 may be neglected with respect to the second term, and the following applies:

$$A(\omega) \approx F_0/(c\omega_{0-}) \quad \text{(Eq. 5)}$$

Since $\omega_{0-}$ is inversely proportional to the root of the mass of the oscillator, an increase of the mass causes a corresponding reduction of $\omega_{0-}$ and, thus, an increase of the amplitude. The additional gain of amplitude results under the condition $c \; \omega_{0-} < k$. Above, the possibility has already been described that the bending bars are structured such that they may bend according to the addressing, or the signal, in one or the other direction. Thus, the restoring force is not necessarily to be raised by the mechanical spring effect upon bending of the bar. The lower the rigidity of such a bending bar selected, the higher the deflection at a fixed energy which may be coupled in.

While all considerations have referred to the auditory sound range, it is conceivable to also implement the device for the generation of ultrasound. In principle, it is also conceivable to provide bars with position-sensoric elements (e.g., piezoresistive, piezoelectric, capacitive etc.) instead of actuators to provide a device as a microphone.

For the core of the manufacturing of the MEMS loudspeaker in the silicon technology, known wafer bonding methods and deep reactive ion etching may be used. Manufacturing the actuators depends on the selected mode of action and is initially hidden. This part may be incorporated modularly into the following exemplary progression. The following discussion refers to a device having only openings for the air flow on the side.

As a base material, BSOI (Bonded Silicon on Insulator) discs are used. The handle wafer forms the lower cap 32a of the MEMS loudspeaker device. The buried oxide layer of the BSOI disc may later function as a spacer layer 34a. The active layer of the BSOI disc may correspond to the layer 36. The handle wafer may comprise a thickness of 500 to 700 µm and may, possibly at the end of the process, be further thinned out. The buried oxide layer may comprise a thickness of 50 nm to 1 µm. The active layer of the BSOI disc may comprise a thickness of 1 to 300 µm. For example, the layer 36 is advantageously structured using deep reactive ion etching (DRIE). After this structuring, the buried oxide layer (34a) may be removed at least locally in the movement region of the actuators or at least be thinned out. This may occur wet-chemically, e.g., using BOE (Buffered Oxide Etch) or dry-chemically, e.g., by means of gaseous hydrofluoric acid (HF). After at least partially removing the spacer layer 34a in the movement region of the actuators, a low-friction layer may be deposited, e.g., by a chemical vapor deposition (CVD) or atomic layer deposition (ALD), which closes, or heavily reduces, the slit between the layer 34a and the actuators (deformable elements). Alternatively, regions in which no bonding occurs, as described, e.g., in U.S. Pat. No. 7,803,281 B2, may be defined during bonding the discs for manufacturing the BSOI discs by deposition and structuring of suitable layers. Such a method may be used for the upper and lower caps. For example, the layer 34b is advantageously structured by means of reactive ion etching (RIE). As illustrated in the corresponding figures, all elements in the layer 36 and 34b are manufactured with these two structurings. This also encompasses the bar-shaped grid structure.

The above-described deposition of a low-friction layer may also be used for the upper cap (layer 32b). For example, the same may be applied onto the cap before the bonding. The spacer layer 34b may be omitted. For example, a low-friction layer may be obtained by depositing a material. For example, a friction value may be 10%, 20% or 50% lower than with a material of the layers 32a, 34a, 34b or 32b.

With a corresponding doping, the layer 36 may also be used as an electric conductor. Above all in the case when actuators are excited with different frequencies, a vertical electric insulation in layer 36 is advantageous. This may be obtained, e.g., by so-called filled trenches, as described in [8]. Using open trenches for electric insulation also represents a possibility.

A layer is applied and structured onto a second disc which may be formed as a silicon disc having a typical or possible thickness of 500 to 700 μm and which, e.g., may form the upper cap 32b. This layer corresponds to the spacer layer 34b. Advantageously, the thickness of this layer corresponds to the buried oxide layer. As a material for the spacer layer, all materials are available which enable the bonding of the second disc onto the BSOI disc to be carried out later. Silicon oxide is cited as an example, advantageously thermal oxide for the direct bonding of silicon oxide onto silicon. Alternatively, polysilicon may be used for the direct bonding. A further alternative is to etch suitable depressions into the second disc so that the function of the upper cap 32b and also the function of the spacer layer 34b is formed from the disc. These depressions may be avoided at least in the region of the actuator movement when the disc is covered at these locations with a suitable low-friction layer so that the distance between the actuator (movable element) and the cap (layers 32a and/or 32b) may be omitted. A further layer on the second disc, besides auxiliary layers (masking) for the structuring, may then be omitted. With this, the direct bonding of silicon onto silicon is also possible.

In addition to direct bonding, it is also possible to use adhesive bonding methods so that the spacer layer 34b consists of a polymeric material (e.g., BCB). Furthermore, Au—Si eutectic bonding methods or anodic bonding methods (layers containing Na-ions) are conceivable, however, for reasons of the non-existent CMOS compatibility these are not advantageous.

After the two discs have been bonded, the core of the manufacturing is completed in the disc compound. Manufacturing the electric wiring and contacts and electric insulation structures that may possibly be needed has not been explained. These elements may be provided by well-known standard methods of the known technology: manufacturing conductor paths, e.g., by means of sputtering and structuring of AlSiCu, vertical insulation by depositing and structuring of oxides, lateral insulation by open or filled insulation trenches which completely penetrate the layer 36.

Separating the devices with side-attached openings involves in particular the protection of the bar grids. This is made possible, e.g., by connecting the device inside of a frame with the same, e.g., by four thin ridges. For this purpose, the lower cap 32a and the upper cap 32b as well as the layers 34a, 36 and 36b are to be structured accordingly. Anisotropic etching methods such as TMAH, KOH and DRIE are particularly suitable for this structuring. The DRIE structuring of the layer 36 is the advantageous variation in particular for the structuring along the bar grid. The ridges are destroyed in order to release the devices from the disc compound. For example, this may be done mechanically or by means of laser processing.

It is also conceivable not to structure the lower cap 32a for the separation, but only the layers 34a, 36, 34b and 32b. In particular, the layer 36 may be structured by means of DRIE in order to realize the perpendicular course of the bar grids. From the chip surface, a trench then results which ends on the lower cap 32a. This trench may now be filled with a polymeric material (e.g., photoresist). The polymer serves for protection against soiling during the subsequent sawing and separation process. After sawing, the devices are rinsed and cleaned to remove the saw sludge. The polymer is then removed by suitable solvents or in an oxygen plasma.

Figure 16:
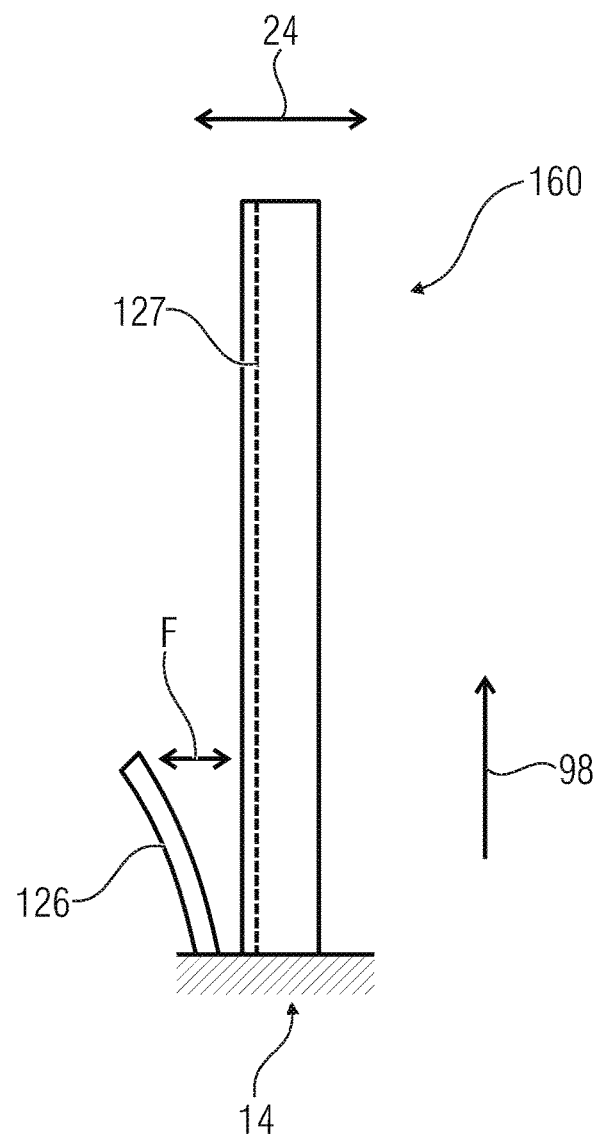
FIG. 16 shows a schematic top view of a deformable element arranged adjacent to an electrode according to an embodiment.

If, instead of the side openings, openings in the upper and lower caps are used, the manufacturing has to be expended, as already described in the context of FIG. 16. For the separation, lower and upper openings may be protected, e.g., by a foil, so that sawing processes or laser cutting are possible. Alternatively, the openings may also be closed by a polymeric material, e.g., photoresist, for the separation process and, subsequently, be again removed by a solvent or in an oxygen plasma.

The stacking of devices is advantageously carried out in the disc compound by bonding methods. The electric contacting may either be done by electric contacts (bond pads) in the respective layer 36 or, when using TSVs (through-silicon-vias), also via so-called bumps on the bottom side of the chip. TSVs may also be used for electrically connecting the stacked individual chips. TSVs and bumps may also be used for unstacked chips.

In order to achieve a higher stability of the bar grids 54, the spacer layers 34a and 34b may remain unstructured in the region of the bar ridges.

In the following, advantageous implementation variations are described for manufacturing the lateral bending actuators.

In principle, well-known electrostatic, piezoelectric, thermomechanical or electrodynamic operating principles may be used for the actuation of the bending bars.

A simple electrostatic operating principle may also be realized for some of the above-mentioned device variations without active bending bars. The MEMS transducer 50 may be embodied in such a way that rigid plate elements 62a and 62b are embodied as capacitor plates or comprise capacitor plates which, due to an electrical potential difference, move towards each other until the elements 64 acting as bending spring comprise a corresponding mechanical counterforce.

Alternatively, the bending bars may be deflected directly via an additionally arranged fixed counter-electrode. The use of comb electrodes to increase the forces, or the deflection, is also conceivable.

Another electrostatic principle is based on the use of a bar clamped on one side, which has a very small distance to an electrode at its clamping point, and this electrode distance increases with an increasing distance from the clamping point. In this case, the distance at the clamping point may be zero. If an electric voltage is applied between the bending bar and the electrode, a part of the bending bar that is determined by the strength of the electric voltage and the rigidity of the bar nestles against the electrode. With respect to the herein-described principle, the space between the bar and the electrode forms the chamber 42 which may be changed in its volume as described.

A basic principle of such actuators is, e.g., described in the literature. In [9], e.g., vertically deflecting actuators are presented. The variation of the electrode distance is realized by selectively inserting layer tensions during the manufacturing of the bending bars. For the device described in the context of this application, actuators according to this principle could be easily realized by accordingly structuring the layer 36. Additionally to the involved structuring of the layer 36, an insulation layer is to be applied between the electrode and the bending bar, which is easily realized by known methods of the microsystem technology. The insertion of a layer tension is not necessary, as the bending bars already obtain the desired shape due to the structuring. In the manner described herein, the actuators may be deflected laterally and may therefore be used for the device principle described above.

With respect to integration and scalability for high quantities, the electrostatic operating principle offers a large numbers of advantages. No external components such as magnets or coils are required and no contamination-critical materials for clean rooms and especially CMOS-compatible clean rooms are required. However, the previously pursued membrane approach comprises some disadvantages. These include the fact that the entire auditory sound range may not be sufficiently covered with a single oscillating membrane or plate. However, the approach of quasi-statically operating the membrane or the membranes solves this problem due to the lack of resonance boosting at the expense of deflection and, thus, at the expense of the achievable volume flow or the achievable sound level. The latter are related for a fixed volume, e.g., for in-ear headphones, as follows [11]:

$$SPL = 20\log_{10}\left(-1.4\frac{P_0 \Delta V}{P_{ref} V_0}\right) \quad \text{(Eq. 6)}$$

SPL stands for "sound pressure level", $P_0$ is the normal pressure, $\Delta V$ is the achievable volume change by the loudspeaker, $P_{ref}$ is the reference pressure indicating a measurement for the hearing threshold, it is 20 μPa, $V_0$ is, in the case of in-ear headphones or hearing aids, the volume of the auditory passage and approximately correspond to 2 cm³.

Thus, with respect to MEMS loudspeakers, it is desirable to achieve the highest possible volume flow per chip surface or per volume of the entire loudspeaker. Electrodynamic transducers may, e.g., achieve very high membrane deflections and, thus, a very high volume flow. However, the volume of the overall construction is very large due to the permanent magnets. For loudspeakers in mobile phones, which offer less and less space in one dimension, this approach seems to be generally restrictive.

Piezoelectric bending actuators involve the deposition of a piezoelectric layer onto a substrate. For example, the piezoelectric layer could correspond to the layer 58 of FIG. 3 which is then arranged sideways to, e.g., the layer 56 including silicon or consisting of the same. Manufacturing such actuators is possible with surface micromechanical processes.

Lateral thermomechanical actuators in the form of a cold and a warm arm, e.g., as described in [10], may be easily integrated by considering the corresponding geometries in the DRIE structuring of the layer 36 described above.

Another variation for thermomechanical actuators is the use of bimorphs which are heated by an electric current. For manufacturing such a bimorph, e.g., an oxide layer may be deposited in conformity after structuring the layer 36 so that all sidewalls may also be coated. The oxide layer may then be removed by masking and etching anywhere except at the one sidewall of the bending element.

The use of an electrodynamic operating principle is easy to implement for bending bars clamped on both sides. When a current flows through the bars or through a separately applied conductor structure, the bars are subjected in a magnetic field to a force which leads to deflection. The direction of the current flow may be selected for the individual bars according to the desired deflection direction. An optional manufacturing of the conductor paths is carried out with standard surface micromechanical processes. In this case, the additional topography has to be taken into account when selecting the thickness of the spacer layer 34b.

The advantageous implementation for the bending actuator is a lateral electrostatic actuator, which is based on the use of very small electrode distances and may therefore function and be operated at low voltages. Such lateral actuators are described in, e.g., EP 2 264058 A1. This technology allows the manufacturing of all of the above-described bending actuator and device variations and may be easily modularly integrated in the above-described core part of the manufacturing process of the devices.

In the following, reference is made to the circumflow losses during the movement of the sidewalls, i.e., the deformable elements. Assuming a laminar flow, it may be shown in a simple model that the circumflow losses, e.g., volume flows from the chamber 42a to the chamber 38a in FIG. 2a, may be kept suitably low compared to the useful volume flows, i.e., the volume flow which penetrates outwards or from the outside to the inside, if the spacer layers 34a and 34b are small compared to the thickness of the layer 36. The same applies for the distance at the possibly free end of a bending bar to the laterally limiting structure. The latter may be omitted for bending actuators clamped on both sides. If the circumflow losses are calculated for this configuration in the model of a laminar flow through rectangular pipes, a loss due to circumflows of about 3% may result in relation to the useful volume flow, if the following is assumed for the dimensions:

Bending actuator: length: 1 mm, height: 30 μm, width: 10 μm

Chamber: For the calculation of the flow resistance towards the outside, an average width of 50 μm was assumed. This underestimates the flow resistance at a large deflection of the bending actuators.

Layer thicknesses of the spacers 34a and 34b: 0.5 μm each

The assumed dimensions are only understood as examples and may be realized easily with micromechanical technologies. The assumption of a laminar flow could be incorrect due to the small width of the actuators (above: 10 μm), which corresponds to the tube length. However, this assumption is a worst case assumption since the flow resistance increases when turbulences occur. In order to motivate such turbulences, the bending actuators in the layer 36 may be provided with suitable laterally configured elements. Arrangements which form vortexes upon circumflows are to be regarded as suitable. Alternatively or additionally, a conscious roughening of the surface of the caps 32a and 32b facing the chamber may promote the formation of a turbulent flow.

Figure 15:
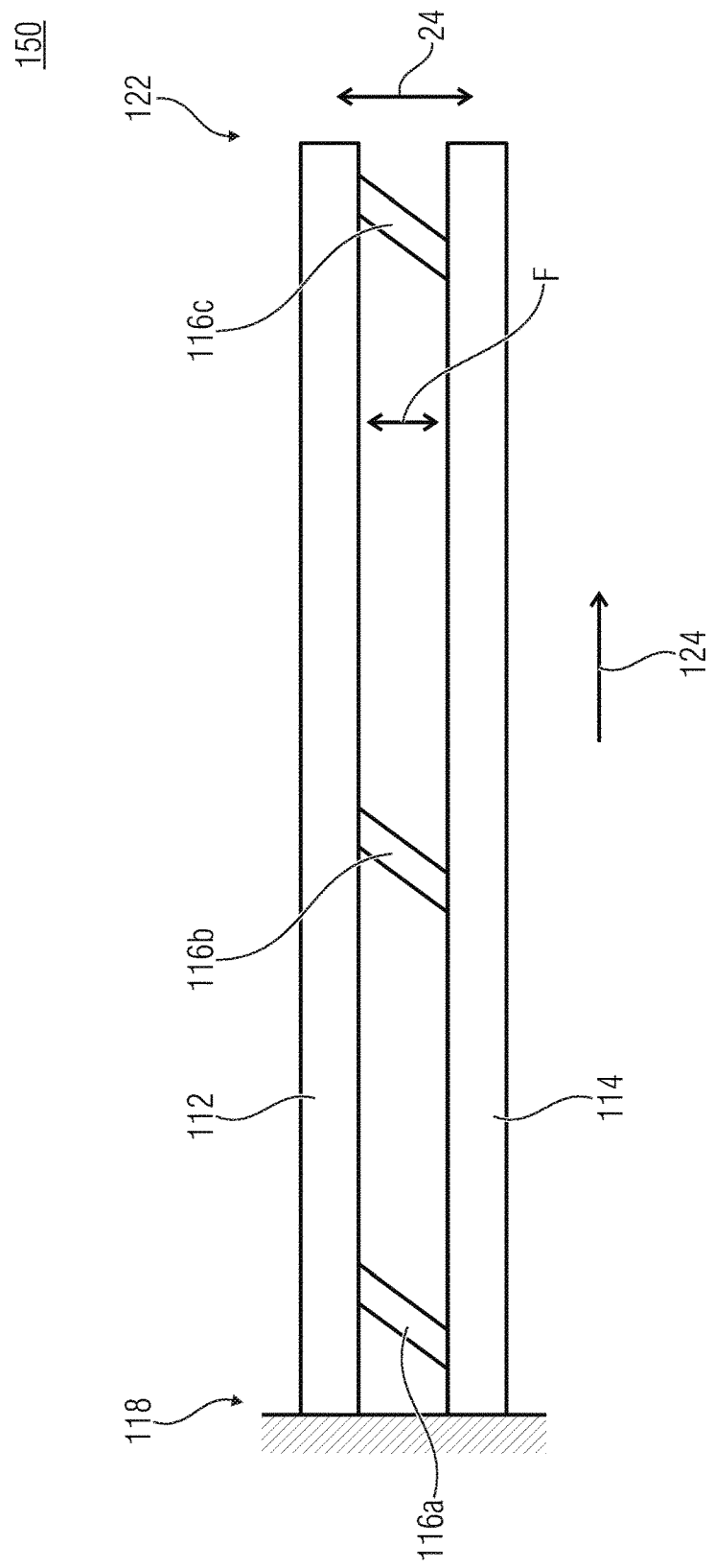
FIG. 15 is a schematic side sectional view of a deformable element comprising two layers spaced apart from and connected to each other via connecting elements according to an embodiment.

FIG. 15 shows a schematic side sectional view of a deformable element 150 comprising a first layer 112 and a second layer 114 spaced apart and connected to each other via connecting elements 116, wherein the connecting elements 116a-c are arranged with an angle of ≠90° to the layer 114 and the layer 112. For example, the layers 112 and 114 may comprise an electrode. Alternatively, an electrode each may be arranged at the layers 112 and/or 114. Based on the application of an electric potential, a repulsive or an attracting force may be generated between the layers 112 and 114. The attracting or repulsive force may lead to a deformation of the elements 116a-c so that a deflectable end 122 of the deformable element 144 facing away from a clamped-in end 118 is deflectable along the lateral movement direction 24.

This means that the deformable element 150 may comprise a first layer 114 and a second layer 116, wherein spacers 116a-c may be arranged between the first layer 114 and the second layer 116. The spacers 116a-c may be arranged in an inclination direction 124 obliquely to a course of the layers 112 and 114. An attracting force between the layers 112 and 114 may cause the deformable element 150 to bend.

The deformable element 150 may be configured to be flat or curved in a simple manner along the inclination direction. Alternatively, the deformable element, or the layers 112 and/or 114, may comprise at least two portions discontinuously arranged at each other, e.g., following a saw tooth pattern.

FIG. 16 shows a schematic top view of a deformable element 160 arranged adjacent to an electrode 126. The deformable element 160 may comprise a further electrode 127 or may be the further electrode 127. Based on an electrical potential applied between the electrode 126 and the further electrode 127 of the deformable element 160, an electrostatic or electrodynamic force F may be generated. Based on the electrostatic or electrodynamic force F, a deformation of the deformable element 160 may be caused.

In a state of the deformable element 160 which is unaffected by the flow rate or the electrical potential, i.e., the force F, a distance between the deformable element 160 and the electrode 126 may be variable along the axial extension direction 98 of the deformable element. In a region where the mechanical transducer, or the deformable element 160, comprises a connection to the substrate 14, the distance may be minimal. This enables a high controllability of the deformation of the deformable element 160. Alternatively, the distance between the electrode 126 and the deformable element 160 may be arbitrarily variable or constant along the extension direction 98.

According to embodiments, electromechanical transducers may be configured as electrostatic transducers, piezoelectric transducers, electromagnetic transducers, electrodynamic transducers, thermomechanical transducers or magnetostrictive transducers.

Based on a force that may be generated, a deformation of the deformable element may be caused or a deformation of the deformable element may be detected or adjusted.

Figure 17:
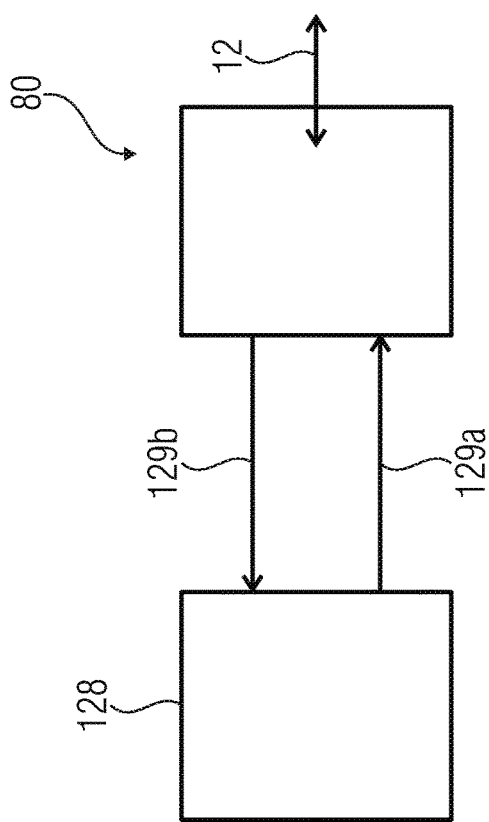
FIG. 17 shows a schematic block circuit diagram of a MEMS system according to an embodiment.

FIG. 17 shows a schematic block circuit diagram of a MEMS system 170 comprising the MEMS transducer 80 connected to a control device 128 configured to control the electrodynamic transducers of the MEMS device 80 and/or to receive electric signals from the electrodynamic transducers of the MEMS device 80.

For example, if the MEMS transducer 80 comprises a multitude of electromechanical transducers 18, the control device 128 may be configured to drive the multitude of electromechanical transducers such that a first and a neighbouring second electromechanical transducer move towards each other at least locally during a first time interval. The control device 128 may be configured to drive the multitude of electromechanical transducers such that the first electromechanical transducer and a third electromechanical transducer arranged adjacent to the first electromechanical transducer move towards each other during a second interval, the first electromechanical transducer may be arranged between the second and the third electromechanical transducer. For example, this may be the electromechanical transducer 18a-c, wherein the electromechanical transducer 18b may be the first electromechanical transducer.

Alternatively or additionally, the control device 128 may be configured to receive an electrical signal based on a deformation of the deformable element and to evaluate the same. For example, the control device 128 may be configured to determine a frequency or an amplitude of the deformation. This means that the system 170 may be operated as a sensor and/or an actuator.

For example, the system 170 may be operated as a MEMS loudspeaker, wherein the volume flow 12 may be an acoustic soundwave or an ultrasonic wave.

Alternatively, the system 170 may be embodied as a MEMS pump. A cavity of the substrate may comprise a first opening 26 and a second opening 26 in the substrate 14. The electromechanical transducer 18 may be configured to provide the volume flow 12 based on the fluid. The electromechanical transducer may be configured to transport the fluid based on an actuation of the electromechanical transducer 18 through the first opening 26 towards the cavity, or to transport the fluid based on the actuation through the second opening in a direction away from the cavity.

Alternatively, the system 170 may be operated as a MEMS microphone, wherein, based on the deformation of the deformable element, an electrical signal may be obtained at a terminal of the electromechanical transducer 80 or of another electromechanical transducer connected. The deformation of the deformable element may be caused based on the volume flow 12.

Although the system 170 is described such that the control device 128 is connected to the MEMS transducer 80, a further MEMS transducer may be arranged, e.g., the MEMS transducer 10, 20, 50, 100 or 110. Alternatively or additionally, several MEMS transducers may also be arranged according to previously-described embodiments. Alternatively or additionally, a stack of MEMS transducers may be arranged, e.g., the stack 90 or 140. Alternatively or additionally, at least two MEMS transducers may be arranged. At least a first MEMS transducer and a second MEMS transducer may comprise cavities or subcavities and/or electromechanical transducers with resonance frequencies different from each other, e.g., a chamber with 500 Hz actuators, a further chamber or a further (sub)cavity with 2 kHz actuators, etc.).

Figure 18:
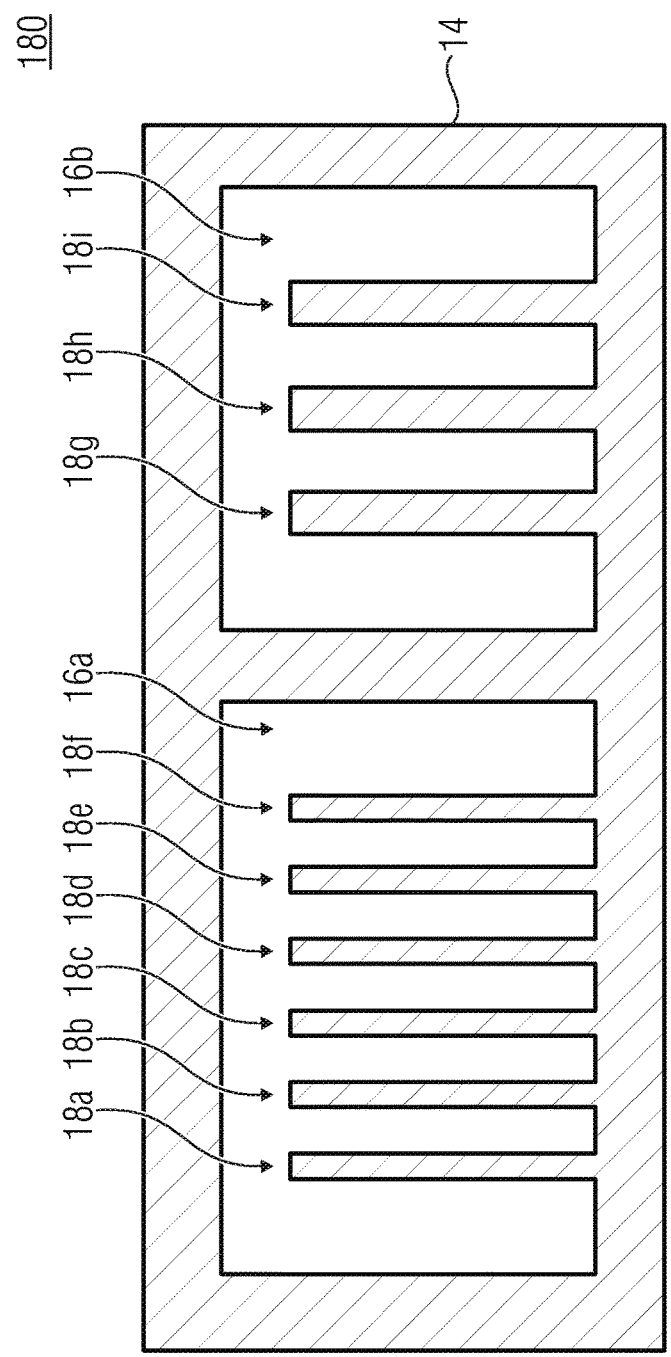
FIG. 18 shows a schematic top view of a MEMS transducer according to an embodiment, comprising a multitude of electromechanical transducers with bar elements clamped on one side.

FIG. 18 shows a schematic top view of a MEMS transducer 180 comprising a multitude of electromechanical transducers 18a to 18i, wherein the electromechanical transducers 18a to 18f are arranged laterally next to each other in an offset manner in a first cavity 16a and the electromechanical transducers 18g to 18i are arranged laterally next to each other in an offset manner in a second cavity 16b. The cavities 16a and 16b may comprise an opening in a non-illustrated bottom and/or cap surface of the substrate 14. The MEMS transducer 180 may be used as a loudspeaker and/or microphone, which applies both for individual electromechanical transducers 18a to 18i and also for the electromechanical transducers 18a to 18f, or 18g to 18i in a respective cavity 16a and 16b. The loudspeakers and/or microphones may also be designed such that they are optimized for releasing or capturing soundwaves via oscillations. E.g., the same may be placed with the human body, ideally near a bone, in order to transmit or capture information by means of body sound. In this case, an advantageous variation is the one in which all actuators move in the same direction, which means independent from an approach in which one chamber comprises two movable walls. The electromechanical transducers 18a to 18i include bar elements clamped on one side.

In other words, the left chamber, cavity 16a, contains laterally or vertically movable bending actuators that advantageously oscillate in phase, causing the chip to oscillate in order to transmit sound. The right chamber, cavity 16b, contains three lateral or vertical bending actuators which also advantageously oscillate in phase, however, reproducing a different frequency region than the left chamber due to their dimensioning (thickness, length or width).

Figure 19:
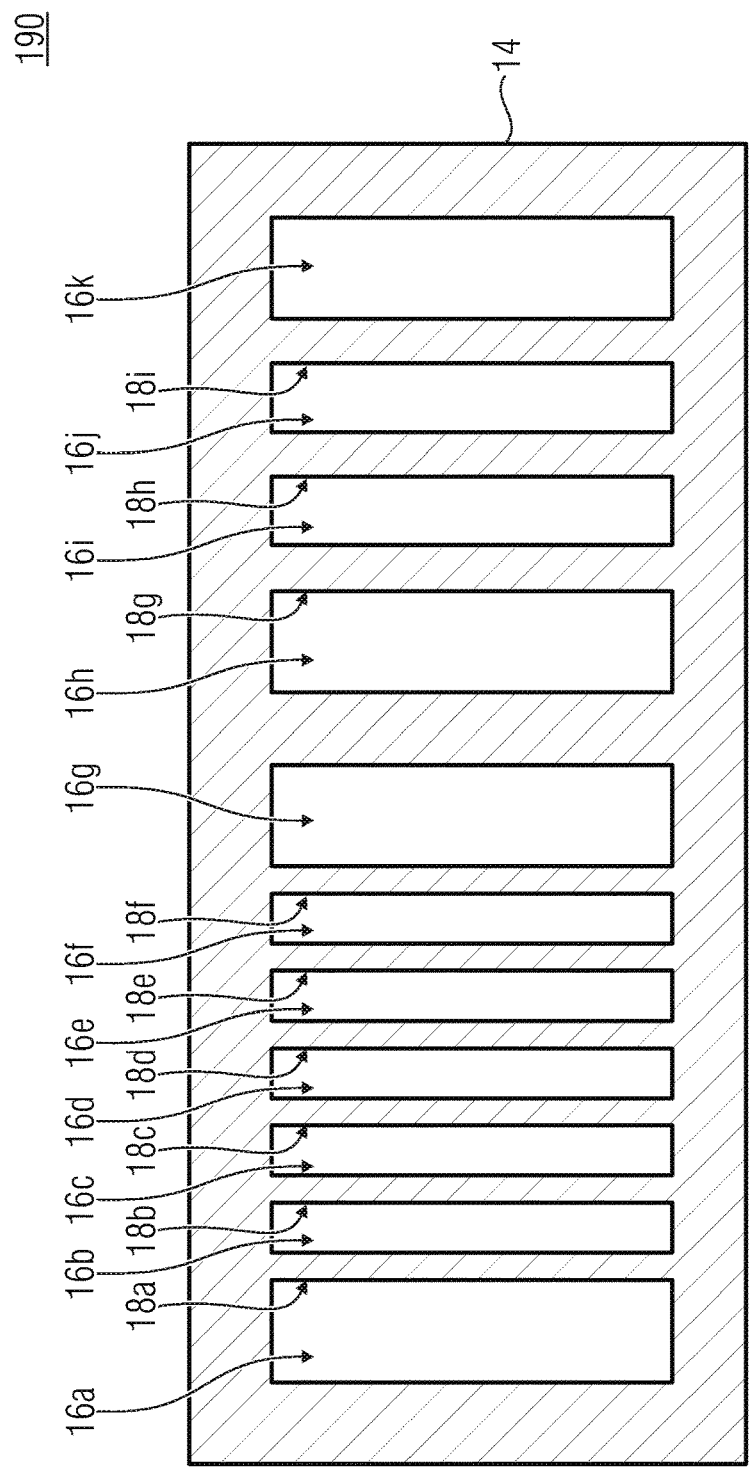
FIG. 19 shows a schematic top view of a MEMS transducer according to an embodiment, comprising a multitude of electromechanical transducers with bar elements clamped on two sides.

FIG. 19 shows a schematic top view of a MEMS transducer 190 comprising a multitude of electromechanical transducers 18a to 18i, wherein the electromechanical transducers 18a to 18f are arranged laterally next to each other in an offset manner and each of them spaces apart neighboring cavities 16a to 16k or subcavities from each other. The electromechanical transducers 18a to 18i include bar elements clamped on two sides.

Although the embodiments of FIGS. 18 and 19 are illustrated such that the MEMS transducer 180 exclusively comprises bar elements clamped on one side and the MEMS transducer 190 exclusively comprises bar elements clamped on two sides, the embodiments may be arbitrarily combined with each other so that, per each cavity 16a and 16b, similar electromechanical transducers may be arranged independently from each other or different electromechanical transducers may be arranged inside of a cavity.

In other words, FIG. 19 shows a same principle as FIG. 18, however, this time bending actuators are used which are clamped on two sides.

Further embodiments refer to a method for manufacturing a MEMS transducer. The method includes providing a substrate comprising a cavity. Furthermore, the method includes manufacturing, together with the substrate, an electromechanical transducer comprising an element deformable along a lateral movement direction. The step of manufacturing is carried out such that a deformation of the deformable element along the lateral movement direction and a volume flow interacting from the MEMS transducer are causally related. For example, manufacturing the electromechanical transducer may be done by forming the same from the substrate, e.g., by an etching process and/or by a deposition process for depositing additional layers.

Although the above-described embodiments relate to the fact that the volume flow may be generated by two electromechanical transducers moving towards each other, the volume flow may also be obtained based on or in a causal interaction with a movement of an electromechanical transducer with respect to a rigid structure, e.g., the substrate. This means that a volume of a subcavity or a subcavity portion may be affected by an individual electromechanical transducer.

Above-described embodiments comprising a deformable element configured to carry out a multiple curvature and/or connected to a plate element may, compared to the configuration as described in connection with FIG. 1, be used to generate a significantly higher volume flow or to react significantly more sensitive to a volume flow.

Embodiments enable to make the frequency-dependent course of the sound pressure to be flexibly adjustable in order to enable, in particular, also the most often sought case of a frequency response which is as flat as possible.

In order to design a frequency-dependent sound pressure curve with as few chambers of the MEMS transducer as possible, it is advantageous if the quality of the oscillatable bending bars is low, i.e., the bending bars comprise a broad resonance curve. For this purpose, the clamping of the bars may be embodied such that the bar oscillation is additionally attenuated by means of a attenuation material. The clamping of the bars is advantageously manufactured from a non-crystalline material. This includes silicon oxide, polymers such as SU8 or other resists. Attenuation the bar oscillation may also be obtained in an electrical manner. For example, during the free bar oscillation of an electrostatic or piezoelectric actuator with an applied voltage, a periodic alternating current flows due to the change in capacitance. A power loss leading to a attenuation of the oscillation is generated by appropriately provided electrical resistors. A complete electrical oscillating circuit (i.e., an integrated or external coil is additionally provided) is also possible. Attenuation may also be obtained by realizing additional structures at the bending bars, which represent a significant flow resistance for the fluid when flowing into or out of the chamber.

Especially for the representation of low-resonance frequencies—for generating or detecting low frequencies—it may be advantageous to increase the mass of the bending bars. In order to not significantly increase the rigidity, additional structures are advantageously attached in the region of the largest oscillation amplitudes. In case of a bar which is clamped on one side, the best location, or the region of the largest oscillation amplitudes, is the end of the bending bars. In case of a bar clamped on two sides, it is the center of the bar.

In other words, a finding of the present invention is based on the fact that the volume flow is generated or may be detected by compression or expansion of chambers, i.e., subcavities or subcavity portions, which may be formed in a silicon chip. Each chamber may be provided with an inlet or outlet through which a fluid, e.g., air, may flow in or out. The chambers may be closed along a direction perpendicular to the lateral movement direction (e.g., on the top and on the bottom) by a fixed cap. At least one of the sidewalls of each chamber is configured to be movable or deformable and may be displaced by an actuator such that the volume decreases or increases in this chamber.

Above-described embodiments of MEMS transducers may comprise electrical connections, bond pads or the like, that are not shown in the figures for the sake of clarity.

Above-described embodiments relate to multi-way loudspeakers or N-way loudspeakers which may be obtained based on different resonance frequencies of at least two cavities or subcavities. The electromechanical transducers and the cavities or subcavities may be matched to each other such that a sound pressure level (SPL) is at least in portions a function of the resonance frequency, i.e., several actuator chambers may comprise different frequency courses (SPL=f (frequency)). This means that values of sound pressure levels which may be obtained based on the deformation of the deformable elements and based on the subcavities comprise a connection to a frequency of the volume flow flowing out of or into the respective subcavity. The connection may be represented as a function, wherein the function may, e.g., be linear, e.g., SPL=x*frequency+b, wherein x and b are variables. Alternatively, the function may also be non-linear, e.g., quadratic, exponential or based on a root function. The functional connection may be easily transferred to different subcavities or cavities arranged in different MEMS transducers. Thus, the frequency of the volume flow may describe a frequency-dependent course of a pressure in the fluid.

The silicon chips of the MEMS transducers may be designed, and may be released from the disk bond which is obtained during manufacturing on the wafer level, such that they comprise a shape adapted for the respective application. E.g., for the application as a loudspeakers and hearing aids or in in-ear headphones, the chip may be designed to be round or, which is more suitable for the use of silicon area on the disk, to be hexagonal.

Even though some aspects have been described within the context of a device, it is understood that said aspects also represent a description of the corresponding method, so that a block or a structural component of a device are to be understood as a corresponding method step or as a feature of a method step. By analogy therewith, aspects that have been described within the context of or as a method step also represent a description of a corresponding block or detail or feature of a corresponding device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

BIBLIOGRAPHY

[1] Albach, Thorsten Sven: Magnetostriktive Mikroaktoren and deren Anwendung als Mikrolautsprecher, Dissertation, Universität Erlangen-Nürnberg (2013) (*Magnetostrictive micro-actuators and their application as microloudspeakers, dissertation*, University of Erlangen-Nuremberg (2013))
[2] Roberts, Robert E. et al.: Electrostatically Driven Touch-Mode Poly-SiC Microspeaker, Sensors, IEEE 2007 (2007), p. 284-287.
[3] Kim, H. et al.: Bi-directional Electrostatic Microspeaker with Two Large-Deflection Flexible Membranes Actuated by Single/Dual Electrodes, Sensors, IEEE 2005 (2005), p. 89-92.
[4] Rehder, J.; Rombach, P.; Hansen, O.: Magnetic flux generator for balanced membrane loudspeaker. In: Sensors and Actuators A: Physical 97 (2002), Nr. 8, p. 61-67.
[5] Neri, F.; Di Fazio, F.; Crescenzi, R.; Balucani, M.: A novel micromachined loudspeaker topology. In: 61 st Conf. on Electronic Components and Technology, ECTC, IEEE 2011 (2011), p. 1221-1227.
[6] Neumann, J. J., Gabriel, K. J.: CMOS-MEMS Acoustic Devices, in: Advanced Micro and Nanosystems, Vol. 2. CMOS-MEMS. Edited by H. Baltes et al., Wiley-VCH Verlag, Weinheim (2005).
[7] Lerch R.; Sessler, G.; Wolf, D.: Technische Akustik, Springer Verlag (2009).
[8] Schenk, H. et al.: A resonantly excited 2D-micro-scanning-mirror with large deflection, Sensors and Actuators A 89 (2001), p. 104-111.
[9] Rosa, M. A. et al.: A novel external electrode configuration for the electrostatic actuation of MEMS based devices, J. Micromech. Microeng. (2004), p. 446-451.
[10] Kumar, V.; Sharma, N. N.: Design and Validation of Silicon-on-Insulator Based U Shaped thermal Microactuator, Int. J. Materials, Mechanics and Manufacturing, Vol. 2, No. 1 (2014), p. 86-91.

The invention claimed is:

1. A MEMS transducer for interacting with a volume flow of a fluid, comprising:
    a substrate comprising a cavity;
    an electromechanical transducer connected to the substrate in the cavity and comprising an element deformable along a lateral movement direction, wherein a deformation of the deformable element along the lateral movement direction and the volume flow of the fluid are causally related;
    wherein the deformation of the deformable element is a curvature of the deformable element in-plane with respect to the substrate.

2. The MEMS transducer according to claim 1, wherein the electromechanical transducer is connected to the substrate in a force-fitted or in a form-fitted manner.

3. The MEMS transducer according to claim 1, wherein the deformable element comprises an active bending bar and is configured to contact the volume flow of the fluid.

4. The MEMS transducer according to claim 1, wherein the electromechanical transducer is configured to, in response to an electrical drive, causally cause a movement of the fluid in the cavity and/or, in response to the movement of the fluid in the cavity, to causally provide an electrical signal.

5. The MEMS transducer according to claim 1, comprising a first and a second electromechanical transducer connected to the substrate and each comprising an element deformable along the lateral movement direction, which is configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable between the first and second time intervals.

6. The MEMS transducer according to claim 1, comprising a multitude of electromechanical transducers connected to the substrate and each comprising an element deformable along the lateral movement direction;
    wherein a first subcavity is arranged between a first electromechanical transducer and a second electromechanical transducer and a second subcavity is arranged between the second electromechanical transducer and a third electromechanical transducer.

7. The MEMS transducer according to claim 6, wherein the first, second and third electromechanical transducers are configured to causally cause a movement of the fluid in the cavity in response to an electrical drive; and wherein the first and the second electromechanical transducer are configured to change a volume of the first subcavity with a first frequency, wherein the first and the third electromechanical transducer are configured to change a volume of the second subcavity with a second frequency.

8. The MEMS transducer according to claim 6, wherein the first subcavity and the second subcavity comprise resonance frequencies different from each other.

9. The MEMS transducer according to claim 8, and wherein the first and the second electromechanical transducer are configured to change a volume of the first subcavity with a first frequency, wherein the first and the third electromechanical transducer are configured to change a volume of the second subcavity with a second frequency.

10. The MEMS transducer according to claim 6, wherein the volume flow and the deformation of the deformable element are causally related with the change of the volumes of the first subcavity and the second subcavity.

11. The MEMS transducer according to claim 6, comprising a wall structure arranged between the first subcavity and the second subcavity and being configured to at least partially reduce a fluidic coupling between the first subcavity and the second subcavity.

12. The MEMS transducer according to claim 6, wherein the deformable elements of the first electromechanical transducer, the second electromechanical transducer and the third electromechanical transducer comprise a bar actuator, comprising a first and a second end, respectively, wherein the bar actuator of the first electromechanical transducer is connected to the substrate at the first end and the second end, wherein the bar actuator of the second electromechanical transducer or of the third electromechanical transducer is connected to the substrate in a center region of the bar actuator.

13. The MEMS transducer according to claim 6, wherein the substrate comprises a multitude of openings connected to a multitude of subcavities of the cavity, wherein a volume of each subcavity is affected by a deflection state of at least one element deformable along the lateral movement direction, wherein two neighboring subvolumes of subcavities may be complimentary increased or decreased in size during the first or the second time interval.

14. The MEMS transducer according to claim 6, wherein the substrate comprises a multitude of openings connected to a multitude of subcavities of the cavity, wherein a volume of each subcavity is affected by a deflection state of at least one element deformable along the lateral movement direction, wherein values of sound pressure levels acquired based on the deformation of the deformable elements and based on the subcavities comprise a connection with a frequency of the volume flow flowing out of or into the respective subcavity, which may be represented as a function.

15. The MEMS transducer according to claim 14, wherein the frequency of the volume flow describes a frequency-dependent course of a pressure in the fluid.

16. The MEMS transducer according to claim 1, wherein a first subcavity adjacent to an opening of the substrate is arranged between bar structures of a first electromechanical transducer and of a second electromechanical transducer.

17. The MEMS transducer according to claim 6, wherein the deformable elements of the first electromechanical transducer, of the second electromechanical transducer and of the third electromechanical transducer comprise a bar actuator, comprising a first and a second end each, wherein the bar actuator of the first electromechanical transducer is connected to the substrate at the first end and at the second end, wherein the bar actuator of the second electromechanical transducer or of the third electromechanical transducer is connected to the substrate in a center region of the bar actuator; and
wherein a first subcavity adjacent to an opening of the substrate is arranged between the bar structures of the first electromechanical transducer and of the second electromechanical transducer.

18. The MEMS transducer according to claim 1, wherein a first deformable element of a first electromechanical transducer and a second deformable element of a second electromechanical transducer comprise a bar structure configured to be curved in-plane with respect to the substrate.

19. The MEMS transducer according to claim 1, wherein the deformable element is formed to be active and is configured to interact with the volume flow, or wherein a plate element connected to the first deformable element and configured to be rigid is configured to interact with the volume flow.

20. The MEMS transducer according to claim 1, wherein the electromechanical transducer comprises a plurality of deformable elements at least indirectly connected in an axial direction of the electromechanical transducer, which are configured to each affect a volume of a first and of a second subcavity portion.

21. The MEMS transducer according to claim 20, wherein the electromechanical transducer is configured to, in response to an electrical drive, causally cause a movement of the fluid in the first and the second subcavity portion, wherein the deformable elements are configured to change the volumes of the first and the second subcavity portion with a frequency different from each other.

22. The MEMS transducer according to claim 1, wherein a volume of the cavity is affected by a first layer, a second layer and a first and a second side region, wherein the first and the second side region are arranged between the first and the second layer, wherein the deformable element is configured to carry out a movement parallel to the first or the second layer at least in one portion.

23. The MEMS transducer according to claim 22, wherein the deformable element is arranged contactless to the first and the second layer, or wherein a low-friction layer is arranged between the deformable element and the first layer or the second layer.

24. The MEMS transducer according to claim 22, comprising a layer stack, wherein the layer stack comprises the first layer, an intermediate layer, a first spacer layer arranged between the first layer and the intermediate layer, the second layer and a second spacer layer arranged between the intermediate layer and the second layer, wherein the deformable element is connected to the intermediate layer.

25. The MEMS transducer according to claim 24, wherein the first or the second spacer layer comprises a dimension along a direction, along which the first and second spacer layers are arranged at the intermediate layer, comprising a value in a range of at least 1 nm and at most 1 mm, advantageously in a range of at least 20 nm and at most 100 μm and particularly advantageously in a range of at least 50 nm and at most 1 μm.

26. The MEMS transducer according to claim 1, wherein an extent of a fluid flow circumflowing the electromechanical transducer from a first side to a second side of the electromechanical transducer, while the deformable element is deformed, is smaller than an extent of the volume flow in the cavity.

27. The MEMS transducer according to claim 26, wherein the extent of the fluid flow circumflowing the electromechanical transducer is smaller than or equal to the extent of the volume flow divided by the value 10.

28. The MEMS transducer according to claim 1, wherein the deformable element is configured to be deformed along the lateral movement direction and along an opposite direction.

29. The MEMS transducer according to claim 1, wherein the deformable element comprises a bar structure and is configured to be curved in-plane with respect to the substrate.

30. The MEMS transducer according to claim 1, wherein the deformable element is configured as a bimorph comprising an actuation direction along which the deformable element is deflectable by applying an electrical voltage.

31. The MEMS transducer according to claim 30, wherein the deformable element comprises a first, a second and a third bar segment arranged in this order along the axial direction and each comprising oppositely directed actuation directions.

32. The MEMS transducer according to claim 31, wherein the electromechanical transducer comprises a first and a second deformable element, wherein an outer bar segment of the first deformable element and an outer bar segment of the second deformable element are at least indirectly connected to each other.

33. The MEMS transducer according to claim 1, wherein the deformable element comprises at least three bar segments connected in series to each other, wherein at least a first, a second and a third bar element comprise oppositely directed actuation directions and comprise a different bar length.

34. The MEMS transducer according to claim 33, wherein the deformable element is clamped on two sides.

35. The MMES transducer according to claim 1, wherein the substrate comprises an anchor element;
  wherein the deformable element is connected to the anchor element in a center region of an axial extension direction of the deformable element; or
  wherein the deformable element is connected to a further deformable element at an outer bar segment via the anchor element.

36. The MEMS transducer according to claim 1, wherein the deformable element comprises a first layer and a second layer, wherein spacers are arranged between the first layer and the second layer, wherein the first layer and the second layer are connected via the spacers, wherein the spacers are arranged in an inclination direction obliquely to a course of the first and the second layer, wherein an attraction force between the first layer and the second layer causes bending of the deformable element.

37. The MEMS transducer according to claim 1, wherein the deformable element comprises a bar structure, wherein the bar structure is fixedly clamped at a first and a second end.

38. The MEMS transducer according to claim 1, wherein the electromechanical transducer is formed as electrostatic transducer, piezoelectric transducer, electromagnetic transducer, electrodynamic transducer, thermomechanical transducer or magnetostrictive transducer.

39. The MEMS transducer according to claim 38, wherein the electromechanical transducer is formed as an electrostatic transducer, wherein the MEMS transducer further comprises a first electrode extending along an axial direction of the deformable element, wherein the deformable element comprises a second electrode, wherein an electrical potential may be applied between the first electrode and the second electrode to generate an electrostatic force between the first electrode and the second electrode, wherein the deformable element is configured to carry out the deformation along the lateral movement direction based on the electrostatic force.

40. The MEMS transducer according to claim 39, wherein, in a state of the deformable element not affected by the volume flow or the electrical potential, a distance between the deformable element and the first electrode varies along the axial direction of the deformable element, wherein the distance comprises a minimum distance in a region at which the electromechanical transducer comprises a connection to the substrate.

41. The MEMS transducer according to claim 1, wherein the electromechanical transducer comprises a first deformable element, a second deformable element and a plate element, wherein the deformable elements are configured to be deformed along the lateral movement direction, wherein the first deformable element and the second deformable element are arranged opposite to each other so that deflectable ends of the first and second deformable elements are arranged facing each other, wherein the plate element is connected to the deflectable ends, wherein the deformation of the deformable elements and a movement of the plate element along the movement direction are causally related.

42. The MEMS transducer according to claim 41, wherein a further plate element is arranged along the movement direction, wherein a volume arranged between the plate element and the further plate element is changed based on the volume flow or based on an actuation of the electromechanical transducer.

43. The MEMS transducer according to claim 1, wherein the electromechanical transducer comprises a first and a second deformable element connected along an axial extension direction of the first or the second deformable element, wherein a spring element is arranged between the first and the second deformable element.

44. The MEMS transducer according to claim 43, wherein the spring element comprises a lower rigidity along the lateral movement direction than in a direction perpendicular to the lateral movement direction.

45. The MEMS transducer according to claim 1, wherein the electromechanical transducer is obliquely arranged with respect to a lateral main extension direction of the substrate.

46. The MEMS transducer according to claim 1, wherein the substrate comprises a substrate spring element adjacent to a region at which the electromechanical transducer is connected to the substrate.

47. The MEMS transducer according to claim 1, wherein the electromechanical transducer comprises a plate element configured to be moved along the lateral movement direction such that a plate surface of the plate element is moved along the movement direction.

48. The MEMS transducer according to claim 47, wherein the plate element comprises an electrode which may be connected to an electrical potential, wherein the plate element is configured
  to generate an electrostatic force opposite to a further electrode, wherein the electrostatic force causes the deformation of the deformable element along the lateral movement direction; or
  to cause the deformation of the deformable element along the lateral movement direction based on the volume flow, wherein the electrical potential may be affected based on the deformation.

49. The MEMS transducer according to claim 47, wherein a spring element is arranged between the deformable element and the plate element.

50. The MEMS transducer according to claim 47, wherein at least one further deformable element is arranged between the deformable element and the plate element, which is configured to increase an actuator travel of the deformable element.

51. The MEMS transducer according to claim 41, wherein the deformable element comprises an opening so that a subvolume of the cavity, which is arranged on a side of the deformable element facing away from the plate element, extends through the deformable element in a direction of the plate element.

52. The MEMS transducer according to claim 1, wherein the cavity comprises an opening in the substrate, which is arranged perpendicular to the lateral movement direction, so that the volume flow flows perpendicular to the lateral movement direction out of the cavity or into the cavity based on the deformation of the deformable element.

53. The MEMS transducer according to claim 52, wherein the opening comprises a cross-section variable along an axial direction, decreasing from an outside of the MEMS transducer towards the cavity.

54. The MEMS transducer according to claim 52, wherein the opening comprises a variable cross-section along a thickness direction perpendicular to an axial direction, decreasing from an outside of the MEMS transducer towards the cavity.

55. The MEMS transducer according to claim 51, wherein the first and second deformable elements are arranged adjacent to the opening.

56. The MEMS transducer according to claim 1, wherein the cavity comprises an opening in the substrate, wherein at least one bar element is formed in a region of the opening so that the volume flow circumflows the bar element.

57. The MEMS transducer according to claim 56, comprising a multitude of bar elements, wherein neighboring bar elements comprise a distance to each other, which is less than 5 μm.

58. The MEMS transducer according to claim 1, wherein the cavity comprises an opening in the substrate, wherein a cover is arranged in a region of the opening.

59. The MEMS transducer according to claim 1, wherein the cavity comprises an opening in the substrate, wherein a valve structure is arranged in a region of the opening, configured to reduce a passage of the volume flow through the opening along at least one direction out of the cavity and/or into the cavity.

60. The MEMS transducer according to claim 59, wherein the valve structure is formed to be active.

61. The MEMS transducer according to claim 60, wherein the deformable element is formed to be active and wherein the valve structure is based on the same actuator principle as the deformable element.

62. The MEMS transducer according to claim 60, comprising a control device configured to drive the valve structure such that a pressure pulse is generated in the fluid flow.

63. The MEMS transducer according to claim 1, further comprising a membrane element arranged to at least partially prevent exit of the volume flow out of the cavity or entry of the volume flow into the cavity, wherein a deflection of the membrane element may be caused based on the volume flow.

64. The MEMS transducer according to claim 63, wherein the cavity comprises an opening in the substrate, wherein the membrane element is arranged in a region of the opening.

65. The MEMS transducer according to claim 1, which is arranged in a MEMS stack with at least one second MEMS transducer according to claim 1.

66. The MEMS transducer according to claim 65, wherein the electromechanical transducers of the MEMS transducer and of the second MEMS transducer may be driven together.

67. The MEMS transducer according to claim 65, wherein a cap surface of the MEMS transducer forms an outside of the stack, wherein the MEMS transducer comprises an opening in the cap surface arranged facing away from a side facing the second MEMS transducer, wherein the volume flow of the MEMS transducer exits from or enters into the cavity in a perpendicular or opposite manner to the volume flow of the second MEMS transducer.

68. The MEMS transducer according to claim 65, wherein the cavity of the MEMS transducer and the cavity of the second MEMS transducer are connected to each other.

69. The MEMS transducer according to claim 65, wherein the cavity of the MEMS transducer and the cavity of the second MEMS transducer comprise a resonance frequency different from each other.

70. The MEMS transducer according to claim 1, wherein the deformable element comprises an axial extension comprising a value in a range of at least 1 μm and at most 100 mm, advantageously of at least 100 μm and at most 10 mm and particularly advantageously a value in a range of at least 500 μm and at most 5 mm.

71. The MEMS transducer according to claim 1, wherein the deformable element comprises an extension along the lateral movement direction comprising a value in a range of at least 0.1 μm and at most 1000 μm, advantageously of at least 1 μm and at most 100 μm and particularly advantageously a value in a range of at least 5 μm and at most 30 μm.

72. The MEMS transducer according to claim 1, wherein the deformable element comprises an extension along a direction arranged perpendicular to the lateral movement direction, wherein the extension comprises a value in a range of at least 0.1 μm and at most 1000 μm, advantageously of at least 1 μm and at most 300 μm and particularly advantageously a value in a range of at least 10 μm and at most 100 μm.

73. The MEMS transducer according to claim 1, comprising at least one deformable sensor element and at least one deformable actuator element.

74. A MEMS transducer for interacting with a volume flow of a fluid, comprising:
   a substrate comprising a cavity;
   an electromechanical transducer connected to the substrate in the cavity and comprising an element deformable along a lateral movement direction, wherein a deformation of the deformable element along the lateral movement direction and the volume flow of the fluid are causally related;
   wherein the lateral movement direction extends in-plane with respect to the substrate;
   a first and a second electromechanical transducer connected to the substrate and each comprising an element deformable along the lateral movement direction, configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable during the first and second time intervals;
   wherein a first deformable element of the first electromechanical transducer and a second deformable element of the second electromechanical transducer comprise a bar structure configured to be curved along an axial direction of the bar structure;
   wherein the first deformable element is formed to be active and is configured to interact with the volume flow, or a plate element connected to the first deformable element is configured to be rigid is configured to interact with the volume flow.

75. A MEMS loudspeaker comprising a MEMS transducer, wherein the MEMS transducer is the MEMS transducer according to claim 1 or comprises:
   a substrate comprising a cavity;
   an electromechanical transducer connected to the substrate in the cavity and comprising an element deformable along a lateral movement direction, wherein a deformation of the deformable element along the lateral movement direction and the volume flow of the fluid are causally related;
   wherein the lateral movement direction extends in-plane with respect to the substrate;
   a first and a second electromechanical transducer connected to the substrate and each comprising an element deformable along the lateral movement direction, configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable during the first and second time intervals;
   wherein a first deformable element of the first electromechanical transducer and a second deformable element of the second electromechanical transducer comprise a bar structure configured to be curved along an axial direction of the bar structure;
   wherein the first deformable element is formed to be active and is configured to interact with the volume flow, or a plate element connected to the first deformable element is configured to be rigid is configured to interact with the volume flow,
   wherein the volume flow is an acoustic soundwave or an ultrasonic wave.

76. A MEMS pump comprising a MEMS transducer, wherein the MEMS transducer is the MEMS transducer according to claim 1 or comprises:
   a substrate comprising a cavity;
   an electromechanical transducer connected to the substrate in the cavity and comprising an element deformable along a lateral movement direction, wherein a deformation of the deformable element along the lateral movement direction and the volume flow of the fluid are causally related;
   wherein the lateral movement direction extends in-plane with respect to the substrate;
   a first and a second electromechanical transducer connected to the substrate and each comprising an element deformable along the lateral movement direction, configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable during the first and second time intervals;
   wherein a first deformable element of the first electromechanical transducer and a second deformable element of the second electromechanical transducer comprise a bar structure configured to be curved along an axial direction of the bar structure;
   wherein the first deformable element is formed to be active and is configured to interact with the volume flow, or a plate element connected to the first deformable element is configured to be rigid is configured to interact with the volume flow,
   wherein the cavity comprises a first opening and a second opening in the substrate, wherein the electromechanical transducer is configured to provide the volume flow based on the fluid and to transport the fluid through the first opening in a direction of the cavity based on an actuation of the electromechanical transducer or to transport the fluid through the second opening in a direction away from the cavity based on the actuation.

77. A MEMS microphone comprising a MEMS transducer, wherein the MEMS transducer is the MEMS transducer according to claim 1 or comprises:
   a substrate comprising a cavity;
   an electromechanical transducer connected to the substrate in the cavity and comprising an element deformable along a lateral movement direction, wherein a deformation of the deformable element along the lateral movement direction and the volume flow of the fluid are causally related;
   wherein the lateral movement direction extends in-plane with respect to the substrate;
   a first and a second electromechanical transducer connected to the substrate and each comprising an element deformable along the lateral movement direction, configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable during the first and second time intervals;
   wherein a first deformable element of the first electromechanical transducer and a second deformable element of the second electromechanical transducer comprise a bar structure configured to be curved along an axial direction of the bar structure;
   wherein the first deformable element is formed to be active and is configured to interact with the volume flow, or a plate element connected to the first deformable element is configured to be rigid is configured to interact with the volume flow,
   wherein an electrical signal may be acquired at a terminal of the electromechanical transducer based on the deformation of the deformable element, wherein the deformation may be caused based on the volume flow.

78. A MEMS system, comprising:
   a MEMS transducer, wherein the MEMS transducer is the MEMS transducer according to claim 1 or comprises:
      a substrate comprising a cavity;
      an electromechanical transducer connected to the substrate in the cavity and comprising an element deformable along a lateral movement direction, wherein a deformation of the deformable element along the lateral movement direction and the volume flow of the fluid are causally related;
      wherein the lateral movement direction extends in-plane with respect to the substrate;
      a first and a second electromechanical transducer connected to the substrate and each comprising an element deformable along the lateral movement direction, configured to be deformed along the lateral movement direction, wherein the first electromechanical transducer and the second electromechanical transducer are configured to move towards each other during a first time interval and to move away from each other during a second time interval, wherein a volume of a subcavity between the first electromechanical transducer and the second electromechanical transducer is variable during the first and second time intervals;

wherein a first deformable element of the first electromechanical transducer and a second deformable element of the second electromechanical transducer comprise a bar structure configured to be curved along an axial direction of the bar structure;

wherein the first deformable element is formed to be active and is configured to interact with the volume flow, or a plate element connected to the first deformable element is configured to be rigid is configured to interact with the volume flow; and a control device configured to drive the deformation of the deformable element or to detect the deformation of the deformable element.

79. The MEMS system according to claim 78, wherein the MEMS transducer comprises a multitude of electromechanical transducers, wherein the control device is configured to drive the multitude of electromechanical transducers such that a first and a neighbouring second electromechanical transducer at least locally move towards each other during a first time interval, and wherein the control device is configured to drive the multitude of electromechanical transducers such that the first electromechanical transducer and a third electromechanical transducer arranged adjacent to the first electromechanical transducer, wherein the first electromechanical transducer is arranged between the second and the third electromechanical transducer, move towards each other during a second time interval.

80. The MEMS system according to claim 78, comprising at least one further MEMS transducer, wherein the cavity of the further MEMS transducer comprises a resonance frequency different from a resonance frequency of the cavity of the MEMS transducer, wherein the control device is configured to detect the deformation of the deformable element of the MEMS transducer and of the further MEMS transducer and to compute a Fourier synthesis based on the electrical signals.

81. The MEMS system according to claim 78, comprising at least one further MEMS transducer, wherein the cavity of the further MEMS transducer comprises a resonance frequency different from a resonance frequency of the cavity of the MEMS transducer, wherein the control device is configured to drive the deformation of the deformable element of the MEMS transducer and of the further MEMS transducer with frequencies different from each other.

82. A method for manufacturing a MEMS transducer, comprising:
providing a substrate comprising a cavity;
manufacturing, at the substrate in the cavity, an electromechanical transducer comprising an element deformable along a lateral movement direction, so that a deformation of the deformable element is a curvature of the deformable element in-plane with respect to the substrate,
so that the deformation of the deformable element along the lateral movement direction and a volume flow of a fluid are causally related.

83. The method according to claim 82, further comprising arranging a low-friction layer, wherein the low-friction layer is arranged in a region between the deformable element and a neighboring layer.

* * * * *